United States Patent
Wei et al.

(10) Patent No.: US 12,464,900 B2
(45) Date of Patent: Nov. 4, 2025

(54) DISPLAY PANEL AND DISPLAY DEVICE

(71) Applicants: CHENGDU BOE OPTOELECTRONICS TECHNOLOGY CO., LTD., Chengdu (CN); BOE TECHNOLOGY GROUP CO., LTD., Beijing (CN)

(72) Inventors: Feng Wei, Beijing (CN); Ming Hu, Beijing (CN); Hongjun Zhou, Beijing (CN); Lili Du, Beijing (CN); Cong Liu, Beijing (CN)

(73) Assignees: Chengdu BOE Optoelectronics Technology Co., Ltd., Sichuan (CN); Beijing BOE Technology Development Co., Ltd., Beijing (CN)

(*) Notice: Subject to any disclaimer, the term of this patent is extended or adjusted under 35 U.S.C. 154(b) by 7 days.

(21) Appl. No.: 17/755,430

(22) PCT Filed: May 31, 2021

(86) PCT No.: PCT/CN2021/097197
§ 371 (c)(1),
(2) Date: Apr. 28, 2022

(87) PCT Pub. No.: WO2022/252005
PCT Pub. Date: Dec. 8, 2022

(65) Prior Publication Data
US 2024/0196655 A1  Jun. 13, 2024

(51) Int. Cl.
*H10K 59/122* (2023.01)
*G09G 3/3233* (2016.01)
*H10K 59/80* (2023.01)

(52) U.S. Cl.
CPC ......... *H10K 59/122* (2023.02); *G09G 3/3233* (2013.01); *H10K 59/8723* (2023.02);
(Continued)

(58) Field of Classification Search
CPC .. G09G 3/3233; H10K 59/122; H10K 59/873; H10K 59/121; H10K 59/352; H10K 59/353; H10K 59/8723
See application file for complete search history.

(56) References Cited

U.S. PATENT DOCUMENTS

2010/0207107 A1   8/2010   Kim
2015/0144917 A1   5/2015   Koo et al.
(Continued)

FOREIGN PATENT DOCUMENTS

CN   108400156 A   8/2018
CN   110137238 A   8/2019
(Continued)

OTHER PUBLICATIONS

International Search Report and Written Opinion dated Mar. 3, 2022, for corresponding PCT Application No. PCT/CN2021/097197.

*Primary Examiner* — Telly D Green
(74) *Attorney, Agent, or Firm* — Kinney & Lange, P.A.

(57) ABSTRACT

A display panel and a display device are provided. The display panel includes: a base substrate including a display region and a peripheral region; a pixel defining layer having a first part located in the display region and a second part located in the peripheral region, the second part and the first part being formed as an integral structure; and a spacer layer arranged on a side of the pixel defining layer away from the base substrate. The spacer layer includes a first spacer repetitive unit located in the display region and a second spacer repetitive unit located in the peripheral region. An orthographic projection of the second spacer repetitive unit on the base substrate falls within that of the second part on the base substrate and is located on a side, facing the display region, of a boundary, which is away from the display region, of the second part.

19 Claims, 33 Drawing Sheets

(52) U.S. Cl.
CPC ... *H10K 59/873* (2023.02); *G09G 2300/0819* (2013.01); *G09G 2300/0842* (2013.01)

(56) References Cited

U.S. PATENT DOCUMENTS

| | | |
|---|---|---|
| 2020/0027933 A1 | 1/2020 | Heo et al. |
| 2021/0028256 A1 | 1/2021 | Sonoda et al. |
| 2021/0028410 A1 | 1/2021 | Matsui et al. |
| 2022/0336542 A1 | 10/2022 | Chen et al. |

FOREIGN PATENT DOCUMENTS

| | | | |
|---|---|---|---|
| CN | 110729325 A | 1/2020 | |
| CN | 111463255 A | 7/2020 | |
| CN | 211150599 U | 7/2020 | |
| CN | 111799315 A | 10/2020 | |
| CN | 111937494 A | 11/2020 | |
| WO | WO-2019206079 A1 * | 10/2019 | ........... G09G 3/3258 |

* cited by examiner

23

21&22&23&24&PLN

21&22&23&24&PLN&25

DISPLAY PANEL AND DISPLAY DEVICE

CROSS REFERENCE TO RELATED APPLICATION(S)

This application is a Section 371 National Stage Application of International Application No. PCT/CN2021/097197, filed on May 31, 2021, entitled "DISPLAY PANEL AND DISPLAY DEVICE", the content of which is incorporated herein by reference in its entirety.

TECHNICAL FIELD

The present disclosure relates to a field of a display technology, and in particular to a display panel and a display device.

BACKGROUND

With a continuous development of the display technology, Organic Light Emitting Diode (OLED) display panels have been increasingly used in various electronic devices due to their advantages of self-luminescence, wide viewing angle, high contrast, low power consumption, and high response speed. At present, a small or medium-sized organic light emitting diode display panel includes a spacer for maintaining a space between the display panel and a cover plate.

The above content described in this section is only for the understanding of the background of the inventive concept of the present disclosure. Therefore, the above content may include information that does not constitute the related art.

SUMMARY

In an aspect, a display panel is provided, including: a base substrate including a display region and a peripheral region; a plurality of sub-pixels arranged in the display region, wherein the sub-pixels include a first electrode, a second electrode, and a functional layer located between the first electrode and the second electrode; a first electrode layer arranged on the base substrate, wherein the first electrode of the plurality of sub-pixels is located in the first electrode layer; a pixel defining layer arranged on a side of the first electrode layer away from the base substrate, wherein the pixel defining layer includes a pixel defining layer body having a first part and a second part, the first part is located in the display region and includes an opening corresponding to the plurality of sub-pixels, and an orthographic projection of the opening on the base substrate falls within an orthographic projection of the first electrode of the plurality of sub-pixels on the base substrate; the second part is located in the peripheral region, and the second part and the first part are formed as an integral structure; and a spacer layer arranged on a side of the pixel defining layer away from the base substrate, wherein the spacer layer includes a first spacer repetitive unit located in the display region and a second spacer repetitive unit located in the peripheral region; wherein an orthographic projection of the second spacer repetitive unit on the base substrate falls within an orthographic projection of the second part of the pixel defining layer on the base substrate and is located on a side, facing the display region, of a boundary, which is away from the display region, of the second part, and the orthographic projection of the second spacer repetitive unit on the base substrate does not overlap the orthographic projection of the first electrode of the plurality of sub-pixels on the base substrate.

According to some exemplary embodiments, the plurality of sub-pixels include at least one column of edge sub-pixels closest to the peripheral region, and at least part of the orthographic projection of the second spacer repetitive unit on the base substrate is located on a side, away from the display region, of an orthographic projection of a first electrode of the at least one column of edge sub-pixels on the base substrate.

According to some exemplary embodiments, the spacer layer includes a plurality of first spacer repetitive units and a plurality of second spacer repetitive units, and the plurality of first spacer repetitive units and the plurality of second spacer repetitive units are arranged in an array in a first direction and a second direction.

According to some exemplary embodiments, the orthographic projection of the second spacer repetitive unit on the base substrate does not overlap an orthographic projection of the first electrode layer on the base substrate.

According to some exemplary embodiments, the plurality of sub-pixels are arranged in an array in a first direction and a second direction; the first spacer repetitive unit includes a first spacer and a third spacer located in different columns, a column of first spacers corresponds to a column of sub-pixels, and a column of third spacers corresponds to another column of sub-pixels; the second spacer repetitive unit includes a second spacer and a fourth spacer; and for a plurality of first spacer repetitive units and a plurality of second spacer repetitive units located in a same row in the first direction, the first spacer and the third spacer of the first spacer repetitive units are located in the same row as the second spacer and the fourth spacer of the second spacer repetitive units.

According to some exemplary embodiments, the first spacer repetitive unit further includes a fifth spacer, and the third spacer and the fifth spacer are alternately arranged in a column; the second spacer repetitive unit further includes a sixth spacer, and the fourth spacer and the sixth spacer are alternately arranged in a column; and for a plurality of first spacer repetitive units and a plurality of second spacer repetitive units located in a same column in the second direction, the third spacer and the fifth spacer of the first spacer repetitive units are located in the same column as the fourth spacer and the sixth spacer of the second spacer repetitive units.

According to some exemplary embodiments, for the plurality of first spacer repetitive units and the plurality of second spacer repetitive units located in the same row in the first direction, the fifth spacer of the first spacer repetitive units is located in the same row as the sixth spacer of the second spacer repetitive units.

According to some exemplary embodiments, for the plurality of first spacer repetitive units and the plurality of second spacer repetitive units located in the same column in the second direction, the first spacer of the first spacer repetitive units is located in the same column as the second spacer of the second spacer repetitive units.

According to some exemplary embodiments, the display panel further includes a driving voltage lead wire arranged on the base substrate and located in the peripheral region, and configured to provide a driving voltage; the base substrate includes at least one corner portion, and the driving voltage lead wire includes a plurality of steps located in the at least one corner portion; and an orthographic projection of at least some second spacer repetitive units of a plurality of second spacer repetitive units on the base substrate overlaps an orthographic projection of the plurality of steps of the driving voltage lead wire on the base substrate, and the at least some second spacer repetitive units are distributed in steps.

According to some exemplary embodiments, for the at least some second spacer repetitive units overlapping the plurality of steps of the driving voltage lead wire, a plurality of steps formed by the at least some second spacer repetitive units are respectively located at the plurality of steps of the driving voltage lead wire.

According to some exemplary embodiments, the plurality of steps include a first step and a second step; and the first step and the second step extend in a first direction, a size of the first step in the first direction is greater than a size of the second step in the first direction, a number of second spacer repetitive units overlapping one first step and located in a same row is greater than a number of second spacer repetitive units overlapping one second step and located in a same row; and/or the first step and the second step extend in a second direction, a size of the first step in the second direction is greater than a size of the second step in the second direction, a number of second spacer repetitive units overlapping one first step and located in a same column is greater than a number of second spacer repetitive units overlapping one second step and located in a same column.

According to some exemplary embodiments, for a plurality of second spacer repetitive units located at a non-corner of the base substrate, the plurality of second spacer repetitive units include a column of second spacer repetitive units farthest from the display region in a first direction and located on a side of the display region, and the column of second spacer repetitive units are arranged along a straight line parallel to a second direction; and/or for a plurality of second spacer repetitive units located at a non-corner of the base substrate, the plurality of second spacer repetitive units include a row of second spacer repetitive units farthest from the display region in a second direction and located on a side of the display region, and the row of second spacer repetitive units are arranged along a straight line parallel to a first direction.

According to some exemplary embodiments, the display panel further includes a first data lead wire and a second data lead wire, wherein the first data lead wire is arranged on the base substrate and located in the peripheral region, and configured to provide a data signal to a column of first sub-pixels, and the second data lead wire is arranged on the base substrate and located in the peripheral region, and configured to provide a data signal to a column of second sub-pixels; wherein at least one column of second spacer repetitive units arranged adjacent to the first data lead wire and the second data lead wire include a column of spacers having a second spacer and a fourth spacer alternately arranged, and 50% or more of an orthographic projection of the column of spacers on the base substrate is located between an extension line of the first data lead wire and an extension line of the second data lead wire in the first direction.

According to some exemplary embodiments, the display panel further includes a third data lead wire arranged on the base substrate and located in the peripheral region, and configured to provide a data signal to a column of third sub-pixels; wherein at least one column of second spacer repetitive units arranged adjacent to the third data lead wire include a column of sixth spacers, and an orthographic projection of the third data lead wire on the base substrate extends through an orthographic projection of at least one six spacer of the column of sixth spacers on the base substrate.

According to some exemplary embodiments, the orthographic projection of the at least one six spacer of the column of sixth spacers on the base substrate is symmetrical with respect to the orthographic projection of the third data lead wire on the base substrate.

According to some exemplary embodiments, the display panel further includes: a scan driving circuit arranged on the base substrate and located in the peripheral region, and configured to output a scan signal; and a plurality of load compensation units arranged on the base substrate and located in the peripheral region, wherein the plurality of load compensation units are located between the scan driving circuit and the plurality of pixel units, wherein an orthographic projection of at least some second spacer repetitive units on the base substrate falls within an orthographic projection of the plurality of load compensation units on the base substrate.

According to some exemplary embodiments, the orthographic projection of the second spacer repetitive unit on the base substrate is spaced apart from an orthographic projection of a boundary of the pixel defining layer body on the base substrate by a specified distance.

According to some exemplary embodiments, the specified distance is in a range of 20 microns to 300 microns.

According to some exemplary embodiments, for at least two second spacer repetitive units adjacent in the second direction, second spacers adjacent in the second direction are spaced apart from each other by a first spacing distance, and fourth spacers adjacent in the second direction are spaced apart from each other by a second spacing distance, and the second spacing distance is greater than the first spacing distance.

According to some exemplary embodiments, a width of the second spacer in the second direction is greater than a width of the fourth spacer in the second direction; and/or a width of the second spacer in the first direction is not less than a width of the fourth spacer in the first direction.

According to some exemplary embodiments, an area of an orthographic projection of the sixth spacer on the base substrate is different from an area of an orthographic projection of the first spacer on the base substrate.

According to some exemplary embodiments, a column where the second spacer is located and a column where the fourth spacer is located are alternately arranged in the first direction; and/or the second spacer and the fourth spacer are alternately arranged on a straight line in the first direction; and/or the fourth spacer and the sixth spacer are alternately arranged in a column.

According to some exemplary embodiments, a ratio of an area of an orthographic projection of the first spacer on the base substrate to an area of an orthographic projection of the second spacer on the base substrate is in a range of 0.8 to 1.2; and/or a ratio of an area of an orthographic projection of the third spacer on the base substrate to an area of an orthographic projection of the fourth spacer on the base substrate is in a range of 0.8 to 1.2; and/or a ratio of an area of an orthographic projection of the fifth spacer on the base substrate to an area of an orthographic projection of the sixth spacer on the base substrate is in a range of 0.8 to 1.2.

According to some exemplary embodiments, for the first spacer repetitive unit and the second spacer repetitive unit adjacent in the first direction, the first spacer and the second spacer adjacent in the first direction are spaced apart from each other by a third spacing distance, the third spacer and the fourth spacer adjacent in the first direction are spaced apart from each other by a fourth spacing distance, and the fifth spacer and the sixth spacer adjacent in the first direction are spaced apart from each other by a fifth spacing distance; and a ratio of a spacing distance between two second spacers adjacent in the first direction to the third spacing distance is in a range of 0.8 to 1.2; and/or a ratio of a spacing distance between two fourth spacers adjacent in the first direction to the fourth spacing distance is in a range of 0.8 to 1.2; and/or a ratio of a spacing distance between two sixth spacers adjacent in the first direction to the fifth spacing distance is in a range of 0.8 to 1.2.

According to some exemplary embodiments, at least one second spacer repetitive unit is provided on each of opposite sides of a row of first spacer repetitive units in the first direction; and/or at least two second spacer repetitive units are provided on each of opposite sides of a column of first spacer repetitive units in the second direction.

According to some exemplary embodiments, at a corner of the base substrate, an orthographic projection of a part of a boundary of the pixel defining layer body on the base substrate is located between an orthographic projection of the scan driving circuit on the base substrate and the orthographic projection of the load compensation units on the base substrate, and an orthographic projection of another part of the boundary of the pixel defining layer body on the base substrate falls within the orthographic projection of the scan driving circuit on the base substrate.

According to some exemplary embodiments, the display panel further includes: a support portion arranged on the base substrate and located in the peripheral region; and an encapsulation structure arranged on a side of the support portion away from the base substrate and located in the peripheral region, wherein an orthographic projection of the support portion on the base substrate is located on a side, away from the display region, of an orthographic projection of a boundary of the pixel defining layer body on the base substrate.

According to some exemplary embodiments, the support portion includes a support body portion, a plurality of apertures or grooves located in the support body portion, and a plurality of conductive portions located on a side, facing the display region, of the support body portion.

According to some exemplary embodiments, the display panel further includes a first voltage lead wire configured to provide a first voltage and an auxiliary conductive portion located in the same layer as the first electrode; and a part of the auxiliary conductive portion is in direct contact with the first voltage lead wire.

According to some exemplary embodiments, the pixel defining layer further includes a first covering portion and a second covering portion; the display panel further includes a planarization layer located on a side of the first electrode layer close to the base substrate, and the auxiliary conductive portion includes a plurality of apertures exposing a part of the planarization layer; and the first covering portion covers the plurality of apertures, and the second covering portion covers an edge, away from the display region, of the auxiliary conductive portion.

In another aspect, a display device is provided, including the display panel described above.

BRIEF DESCRIPTION OF THE DRAWINGS

With the following description of the present disclosure with reference to the accompanying drawings, other objectives and advantages of the present disclosure would be obvious and the present disclosure would be understood comprehensively, in the drawings.

Figure 1:
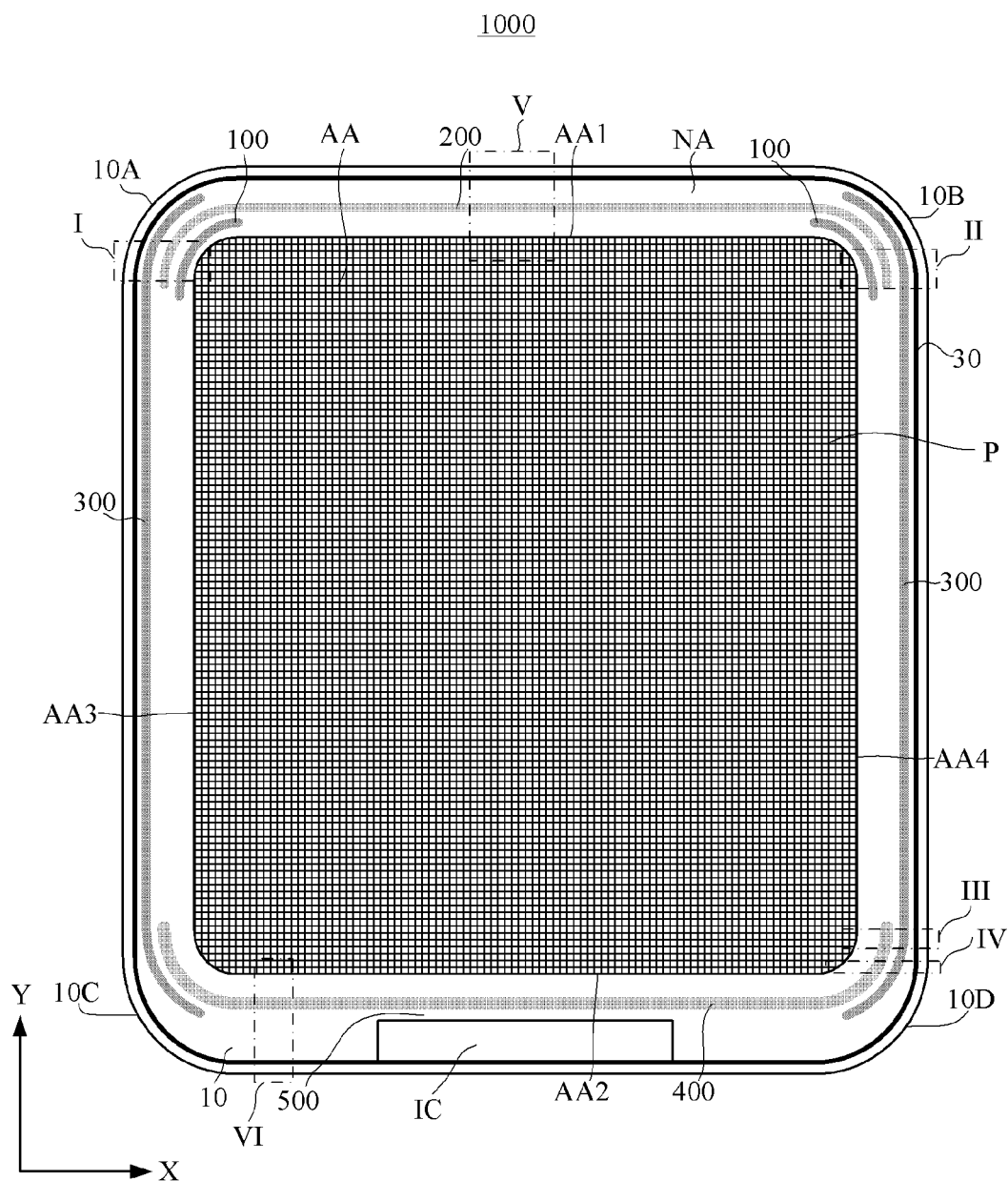
FIG. 1 shows a schematic plan view of a display device according to some exemplary embodiments of the present disclosure.

It should be noted that for the sake of clarity, in the accompanying drawings used to describe the embodiments of the present disclosure, sizes of layers, structures or regions may be enlarged or reduced, that is, these drawings are not drawn according to actual scale.

DETAILED DESCRIPTION OF EMBODIMENTS

In the following description, for the purpose of explanation, many specific details are set forth to provide a comprehensive understanding of various exemplary embodiments. However, it is obvious that the various exemplary embodiments may be implemented without these specific details or with one or more equivalent arrangements. In other cases, well-known structures and devices are shown in block diagrams in order to avoid unnecessarily obscuring the various exemplary embodiments. In addition, the various exemplary embodiments may be different, but need not to be exclusive. For example, without departing from the inventive concept, specific shape, configuration and characteristics of an exemplary embodiment may be used or implemented in another exemplary embodiment.

In the accompanying drawings, for clarity and/or description purposes, size and relative size of elements may be enlarged. Accordingly, the size and relative size of each element need not to be limited to those shown in the drawings. When the exemplary embodiments may be implemented differently, the specific process sequence may be different from the sequence described. For example, two consecutively described processes may be performed substantially simultaneously or in a reverse order. In addition, same reference numerals represent same elements.

When an element is described as being "on", "connected to" or "coupled to" another element, the element may be directly on the another element, directly connected to the another element, or directly coupled to the another element, or an intermediate element may be present. However, when an element is described as being "directly on", "directly connected to" or "directly coupled to" another element, no intermediate element is provided. Other terms and/or expressions used to describe the relationship between elements, for example, "between" and "directly between", "adjacent" and "directly adjacent", "on" and "directly on", and so on, should be interpreted in a similar manner. In addition, the term "connected" may refer to a physical connection, an electrical connection, a communication connection, and/or a fluid connection. In addition, X-axis, Y-axis and Z-axis are not limited to three axes of a rectangular coordinate system, and may be interpreted in a broader meaning. For example, the X-axis, the Y-axis and the Z-axis may be perpendicular to each other, or may represent different directions that are not perpendicular to each other. For the objective of the present disclosure, "at least one of X, Y or Z" and "at least one selected from a group consisting of X, Y and Z" may be interpreted as only X, only Y, only Z, or any combination of two or more of X, Y and Z, such as XYZ, XY, YZ and XZ. As used herein, the term "and/or" includes any and all combinations of one or more of the listed related items.

It should be noted that although the terms "first", "second", and so on may be used herein to describe various components, members, elements, regions, layers and/or parts, these components, members, elements, regions, layers and/or parts should not be limited by these terms. Rather, these terms are used to distinguish a component, member, element, region, layer and/or part from another. Thus, for example, a first component, a first member, a first element, a first region, a first layer and/or a first part discussed below may be referred to as a second component, a second member, a second element, a second region, a second layer and/or a second part without departing from the teachings of the present disclosure.

For ease of description, spatial relationship terms, such as "upper", "lower", "left", "right", may be used herein to describe the relationship between one element or feature and another element or feature as shown in the figure. It should be understood that the spatial relationship terms are intended to cover other different orientations of the device in use or operation in addition to the orientation described in the figure. For example, if the device in the figure is turned upside down, an element or feature described as "below" or "under" another element or feature will be oriented "above" or "on" the another element or feature.

In the present disclosure, unless otherwise specified, the terms "substantially", "basically", "about", "approximately" and other similar terms are used as terms of approximation rather than as terms of degree, and they are intended to explain the inherent deviation of the measured or calculated value that will be recognized by those of ordinary skilled in the art. Taking into account process fluctuation, measurement problems, and errors related to measurement of specific quantities (that is, limitations of a measurement system), the terms "substantially", "roughly", "about" or "approximately" used in the present disclosure includes the stated value and means that the specific value determined by those of ordinary skilled in the art is within an acceptable range of deviation. For example, "substantially", "basically", "about" or "approximately" may mean within one or more standard deviations, or within ±30%, ±20%, ±10% or ±5% of the stated value.

It should be noted that the expression "same layer" refers to a layer structure formed by first using the same film forming process to form a film layer for forming a specific pattern, and then using the same mask to pattern the film layer by using one-time patterning process. Depending on the specific patterns, the one-time patterning process may include multiple exposure, development or etching processes, and the specific pattern in the layer structure formed may be continuous or discontinuous. That is to say, a plurality of elements, components, structures and/or parts located in the "same layer" are made of the same material and formed by the same patterning process. Generally, the plurality of elements, components, structures and/or parts located in the "same layer" have roughly the same thickness.

The embodiments of the present disclosure provide a display panel and a display device. The display panel includes: a base substrate including a display region and a peripheral region; a plurality of sub-pixels arranged in the display region, the sub-pixels include a first electrode, a second electrode and a functional layer located between the first electrode and the second electrode; a first electrode layer arranged on the base substrate, the first electrode of the plurality of sub-pixels is located in the first electrode layer; a pixel defining layer arranged on a side of the first electrode layer away from the base substrate, wherein the pixel defining layer includes a pixel defining layer body including a first part and a second part, the first part is located in the display region and includes an opening corresponding to the plurality of sub-pixels, and an orthographic projection of the opening on the base substrate falls within an orthographic projection of the first electrode of the plurality of sub-pixels on the base substrate, the second part is located in the peripheral region, and the second part and the first part are formed as an integral structure; and a spacer layer arranged on a side of the pixel defining layer away from the base substrate, wherein the spacer layer includes a first spacer repetitive unit located in the display region and a second spacer repetitive unit located in the peripheral region, an orthographic projection of the second spacer repetitive unit on the base substrate falls within an orthographic projection of the second part of the pixel defining layer on the base substrate and is located on a side, facing the display region, of a boundary of the second part, in which the boundary is a boundary of the second part away from the display region, and the orthographic projection of the second spacer repetitive unit on the base substrate does not overlap the orthographic projection of the first electrode of the plurality of sub-pixels on the base substrate. In the embodiments of the present disclosure, the spacer is provided not only in the display region, but also in the peripheral region. In this way, in a process of an evaporation of an organic material using a mask such as an FMM, the mask may be supported more in the peripheral region, which prevents the mask from being depressed due to a force in the peripheral region, so that a deviation of an evaporation position of the organic material may be avoided. Accordingly, an occurrence of a color mixing may be avoided. In addition, by providing the spacer in the peripheral region, the spacer may be closer to a peripheral encapsulation region, so that a generation of Newton ring may be avoided.

Figure 2:
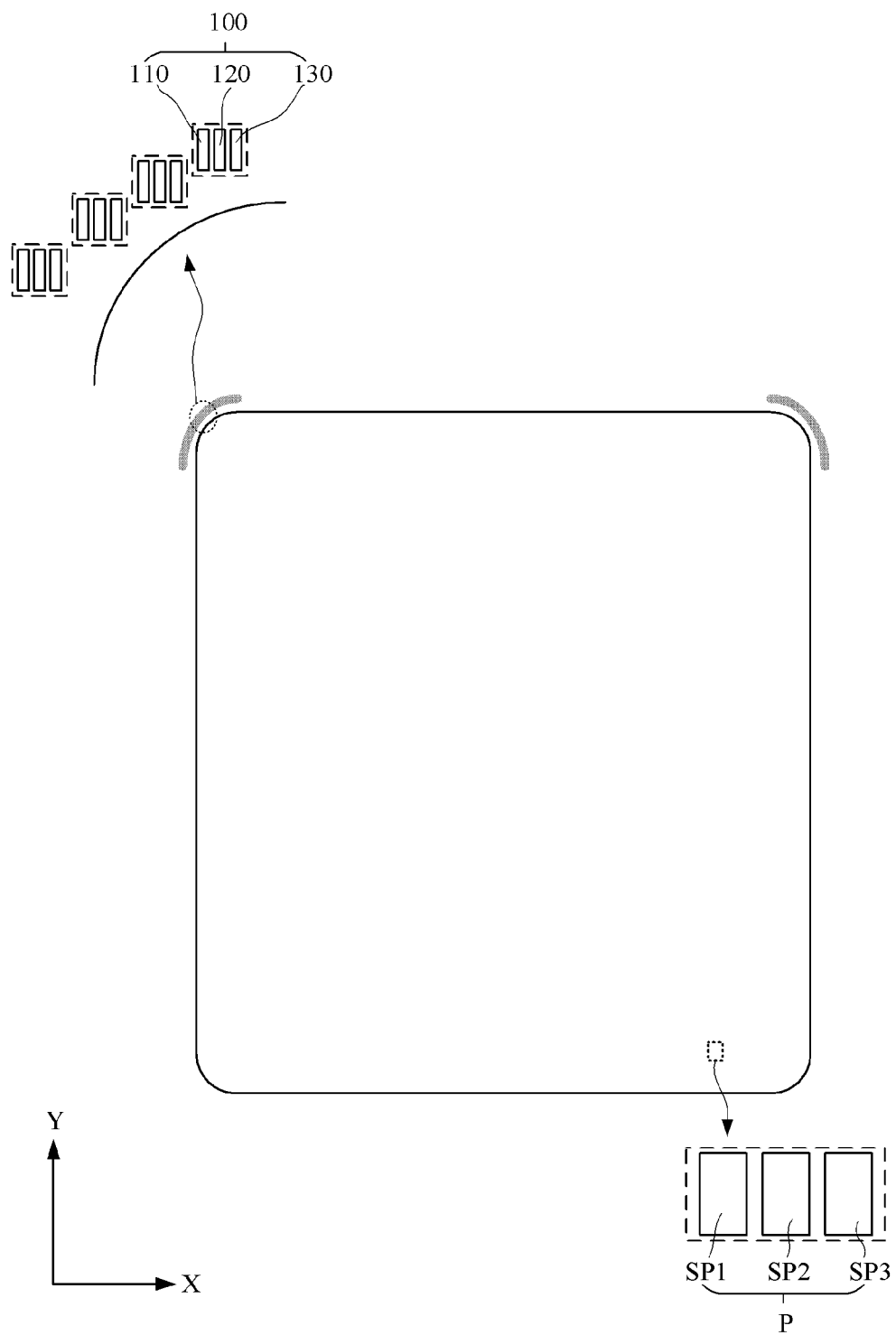
FIG. 2 shows a schematic plan view of a display panel according to some exemplary embodiments of the present disclosure, in which a pixel unit and a load compensation unit included in the display panel are schematically illustrated.

FIG. 1 shows a schematic plan view of a display device according to some exemplary embodiments of the present disclosure. FIG. 2 shows a schematic plan view of a display device according to some exemplary embodiments of the present disclosure, in which a pixel unit and a load compensation unit included in the display device are schematically illustrated.

Referring to FIG. 1 and FIG. 2 in combination, a display device 1000 may include a display panel. The display panel may include a base substrate 10, and the base substrate 10 may include a display region AA and a peripheral region NA located on at least one side of the display region. It should be noted that in the embodiments shown in FIG. 1, the peripheral region NA surrounds the display region AA, but the embodiments of the present disclosure are not limited to this. In other embodiments, the peripheral region NA may be located on at least one side of the display region AA without surrounding the display region AA.

The display panel may include a plurality of pixel units P located in the display region AA. It should be noted that the pixel unit P is a minimum unit for displaying an image. For example, the pixel unit P may include a light emitting device that emits a white light and/or a color light.

The plurality of pixel units P may be arranged in an array along a row extending in a first direction (e.g., a row direction) X and a column extending in a second direction (e.g., a column direction) Y. However, the embodiments of the present disclosure do not specifically limit an arrangement form of the pixel units P, and the pixel units P may be arranged in various forms. For example, the pixel units P may be arranged such that a direction inclined with respect to the first direction X and the second direction Y is the column direction, and a direction intersecting the column direction is the row direction.

The pixel unit P may include a plurality of sub-pixels. For example, the pixel unit P may include three sub-pixels, including a first sub-pixel SP1, a second sub-pixel SP2 and a third sub-pixel SP3. For another example, the pixel unit P may include four sub-pixels, including a first sub-pixel, a second sub-pixel, a third sub-pixel, and a fourth sub-pixel. For example, the first sub-pixel SP1 may be a red sub-pixel, the second sub-pixel SP2 may be a green sub-pixel, the third sub-pixel SP3 may be a blue sub-pixel, and the fourth sub-pixel may be a white sub-pixel.

Each sub-pixel may include a light emitting element and a pixel driving circuit for driving the light emitting element. For example, the first sub-pixel SP1 may include a first light emitting element and a first pixel driving circuit for driving the first light emitting element, and the first light emitting element may emit a red light; the second sub-pixel SP2 may include a second light emitting element and a second pixel driving circuit for driving the second light emitting element, and the second light emitting element may emit a green light; the third sub-pixel SP3 may include a third light emitting element and a third pixel driving circuit for driving the third light emitting element, and the third light emitting element may emit a blue light.

For example, in an OLED display panel, the light emitting element of the sub-pixel may include an anode, a luminescent material layer, and a cathode arranged in a stack. For example, a light emitting region of the sub-pixel may be a region corresponding to a part of the luminescent material layer sandwiched between and in contact with the anode and the cathode. For example, a pixel defining layer is formed on the anode. The pixel defining layer has an opening exposing at least part of the anode, the luminescent material layer is formed at least partially in the pixel defining layer opening, and the cathode is formed on the luminescent material layer. The light emitting region of the sub-pixel may be a region defined by the pixel defining layer opening. The luminescent material layer may include, for example, one or more of a hole injection layer, a hole transporting layer, a light emitting layer, a hole blocking layer, an electron transporting layer, an electron injection layer, etc., or may include other functional film layers in addition to the above layers, and the layers may contain an organic material or contain an inorganic material such as quantum dot, etc.

Referring to FIG. 1, the display panel may include a load compensation unit 100, a test circuit 200, a scan driving circuit 300, a multiplexer 400, and other components located in the peripheral region NA.

The display region AA may include a first boundary AA1, a third boundary AA3, a second boundary AA2, and a fourth boundary AA4 (e.g., an upper boundary, a left boundary, a lower boundary, and a right boundary) connected in sequence.

In some embodiments of the present disclosure, an orthographic projection of the display region AA on the base substrate 10 may have a shape of a rounded rectangle. For the convenience of description, four rounded corners of the rounded rectangle may be respectively referred to as a first rounded corner portion 10A, a second rounded corner portion 10B, a third rounded corner portion 10C, and a fourth rounded corner portion 10D. For example, the first rounded corner portion 10A may be located at an upper left corner in FIG. 1, the second rounded corner portion 10B may be located at an upper right corner in FIG. 1, the third rounded corner portion 10C may be located at a lower left corner in FIG. 1, and the fourth rounded corner portion 10D may be located at a lower right corner in FIG. 1.

The test circuit 200 may be located, in the peripheral region NA, on a side adjacent to the first boundary AA1, and the test circuit 200 is arranged opposite to the first boundary AA1, the first rounded corner portion 10A and the second rounded corner portion 10B.

For example, the test circuit 200 may include a plurality of test pins (which will be described below) that may be used to provide a test signal. For example, the test signal may include a data signal for the plurality of pixel units P in the display region AA.

The multiplexer 400 may be located, in the peripheral region NA, on a side adjacent to the second boundary AA2, and the multiplexer 400 is arranged opposite to the second boundary AA2, the third rounded corner portion 10C and the fourth rounded corner portion 10D.

For example, the multiplexer 400 may perform a time-division multiplexing on a signal line in a wiring region. As shown in FIG. 1, the display panel includes an integrated circuit IC arranged in the peripheral region NA and a wiring region 500 located between the integrated circuit IC and the multiplexer 400. Various signals output by the integrated circuit IC are transmitted to the multiplexer 400 through the signal line in the wiring region 500. Then, under a control of a signal control terminal of the multiplexer 400, the various signals are output to various pixel units P in the display region AA. By providing the multiplexer 400, the number of signal lines arranged in the wiring region may be reduced, so that a wiring difficulty in the wiring region may be reduced.

The scan driving circuit 300 may be located, in the peripheral region NA, on a side adjacent to the third boundary AA3 and on a side adjacent to the fourth boundary AA4. It should be noted that although FIG. 1 shows that the driving circuit is located on left and right sides of the display region AA, the embodiments of the present disclosure are not limited thereto, and the driving circuit may be located at any suitable position in the peripheral region NA.

For example, the scan driving circuit 300 may include at least one of a gate scan driving circuit or a light emitting control scan driving circuit. For example, the gate scan driving circuit and the light emitting control scan driving circuit may adopt a GOA technology, that is, the scan driving circuit 300 may include at least one of a Gate GOA or an EM GOA. In the GOA technology, a gate driving circuit and a light emitting control scan driving circuit instead of an external driving chip is directly arranged on the array substrate. Each GOA unit acts as a stage of shift register, and each stage of shift register is electrically connected to a gate line or a light emitting control line. A turn-on voltage is output in turn through each stage of shift register, so that a progressive scanning of pixels is achieved. In some embodiments, each stage of shift register may also be connected to a plurality of gate lines or a plurality of light emitting control lines, which may adapt to a development trend of high resolution and narrow border of a display panel.

The display panel may include a plurality of load compensation units 100. As shown in FIG. 1 and FIG. 2, some of the plurality of load compensation units 100 are located, in the peripheral region NA, adjacent to the first rounded corner portion 10A, and others of the plurality of load compensation units 100 are located, in the peripheral region NA, adjacent to the second rounded corner portion 10B. The plurality of load compensation units 100 are located between the test circuit 200 and the display region AA.

In the embodiments of the present disclosure, each sub-pixel SP1, SP2 or SP3 may include a light emitting element and a pixel driving circuit for driving the light emitting element. For example, the light emitting element may include a first electrode, a second electrode, and a luminescent material layer located between the first electrode and the second electrode. The pixel driving circuit may include a transistor, a capacitor, and other elements. The pixel driving circuit may receive a signal from a signal line provided on the display panel, generate a current for driving the light emitting element, and achieve a purpose of driving the light emitting element to emit light through a connection with the first electrode or the second electrode. For example, the pixel driving circuit is arranged on the base substrate, and the light emitting element is located on a side of the pixel driving circuit away from the base substrate. For example, the pixel driving circuit may include a circuit structure such as 7T1C, 7T2C, 8T2C or 4T1C that exists in the art. For example, the light emitting element may be an organic light emitting diode (OLED) or a quantum dot light emitting diode (QLED).

Figure 3:
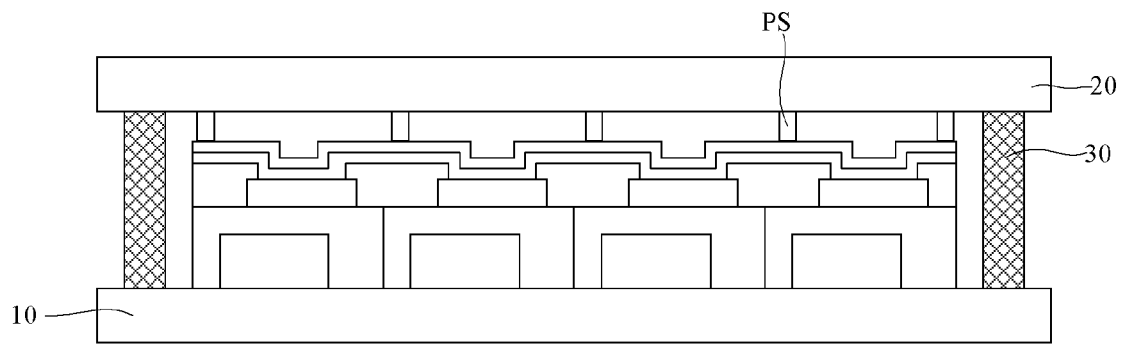
FIG. 3 shows a cross-sectional view of the display device according to some exemplary embodiments of the present disclosure taken along line AA' in FIG. 1.

FIG. 3 shows a cross-sectional view of the display device according to some exemplary embodiments of the present disclosure taken along line AA' shown in FIG. 1. Referring to FIG. 1 to FIG. 3 in combination, the display device may further include a cover plate 20, an encapsulation structure 30, and a spacer PS. The cover plate 20 is arranged opposite to the base substrate 10. The encapsulation structure 30 and the spacer PS are arranged between the base substrate 10 and the cover plate 20. For example, at least some spacers PS are arranged in the display region AA to support the cover plate 20 and form a space to be encapsulated between the base substrate 10 and the cover plate 20. The encapsulation structure 30 is arranged in the peripheral region NA. For example, the encapsulation structure 30 may be arranged around the display region AA to prevent water vapor, oxygen, etc. from intruding into the light emitting element located in the display region AA. For example, the encapsulation structure 30 may include Frit (glass frit).

Figure 4:
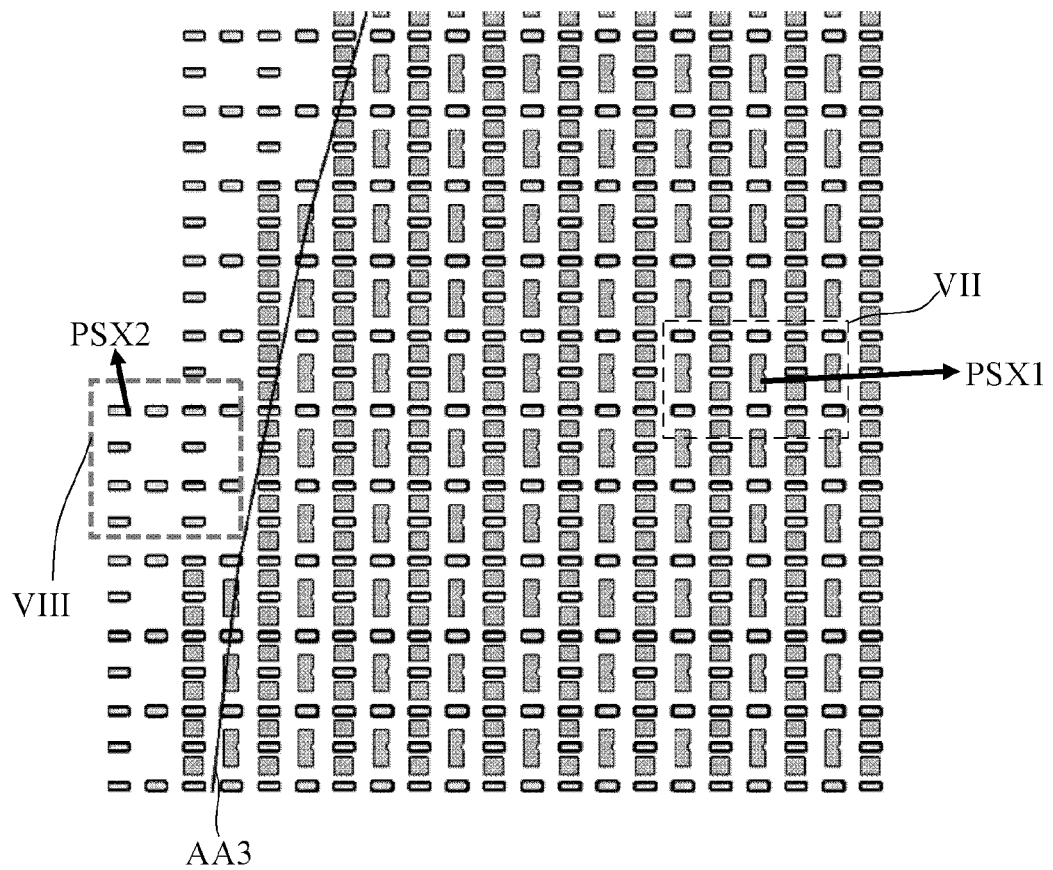
FIG. 4 shows a partial enlarged view of part I in FIG. 1.

FIG. 4 shows a partial enlarged view of part I in FIG. 1. As shown in FIG. 4, an arrangement of some spacers PS and a plurality of sub-pixels SP1, SP2 and SP3 is schematically shown, and other structures are omitted. A detailed description of other structures will be described below in conjunction with the accompanying drawings.

In some embodiments, the display panel further includes a pixel defining layer located on a side of the first electrode away from the pixel driving circuit. The pixel defining layer includes a plurality of openings, and each sub-pixel corresponds to at least one (e.g., one) pixel defining layer opening. An actual light emitting region or a display region of the sub-pixel is substantially equivalent to the pixel defining layer opening corresponding to the sub-pixel. In some embodiments, the pixel defining layer opening corresponding to the sub-pixel or the actual light emitting region of the sub-pixel has an area less than that of the first electrode, and a projection of the pixel defining layer opening corresponding to the sub-pixel or the actual light emitting region of the sub-pixel on the base substrate completely falls within a projection of the first electrode on the base substrate. For ease of illustration and description, FIG. 4 only shows an approximate position and shape of the pixel defining layer opening corresponding to the sub-pixel to indicate a distribution of the sub-pixels.

For example, in some embodiments of the present disclosure, an arrangement of sub-pixels in each pixel repetitive unit may refer to an existing pixel arrangement, such as RGB, GGRB, RGBG, RGB, etc., which is not limited in the embodiments of the present disclosure.

Referring to FIG. 4, a boundary of the display region AA is schematically shown. For example, the boundary may be a part of the boundary AA3 shown in FIG. 1. Taking the boundary of the display region AA as a dividing line, a part of the spacers PS is located in the display region AA, and another part of the spacers PS is located outside the display region AA. For example, in the embodiments of the present disclosure, the display panel may include a first spacer repetitive unit PSX1 located in the display region AA and a second spacer repetitive unit PSX2 located outside the display region AA. For example, the first spacer repetitive unit PSX1 includes at least one spacer, and the second spacer repetitive unit PSX2 includes at least one spacer.

In the embodiments of the present disclosure, the spacer is provided at a periphery of the display region AA, so that the spacer is closer to the encapsulation structure 30. In this way, the encapsulation structure 30 may obtain more supporting force. Therefore, an uneven height of the encapsulation structure 30 due to an external force factor may be avoided, so that an occurrence of Newton ring may be reduced, which is beneficial to improve a display effect of the display device. Moreover, by providing the spacer at the periphery of the display region AA, an edge of the display region AA may obtain more supporting force. In this way, during the evaporation process using the FMM mask, the FMM mask above the spacer may be forced uniformly, so that a risk of the FMM mask being deformed to reduce an evaporation accuracy may be reduced, which may avoid an occurrence of a color cast.

Figure 5:
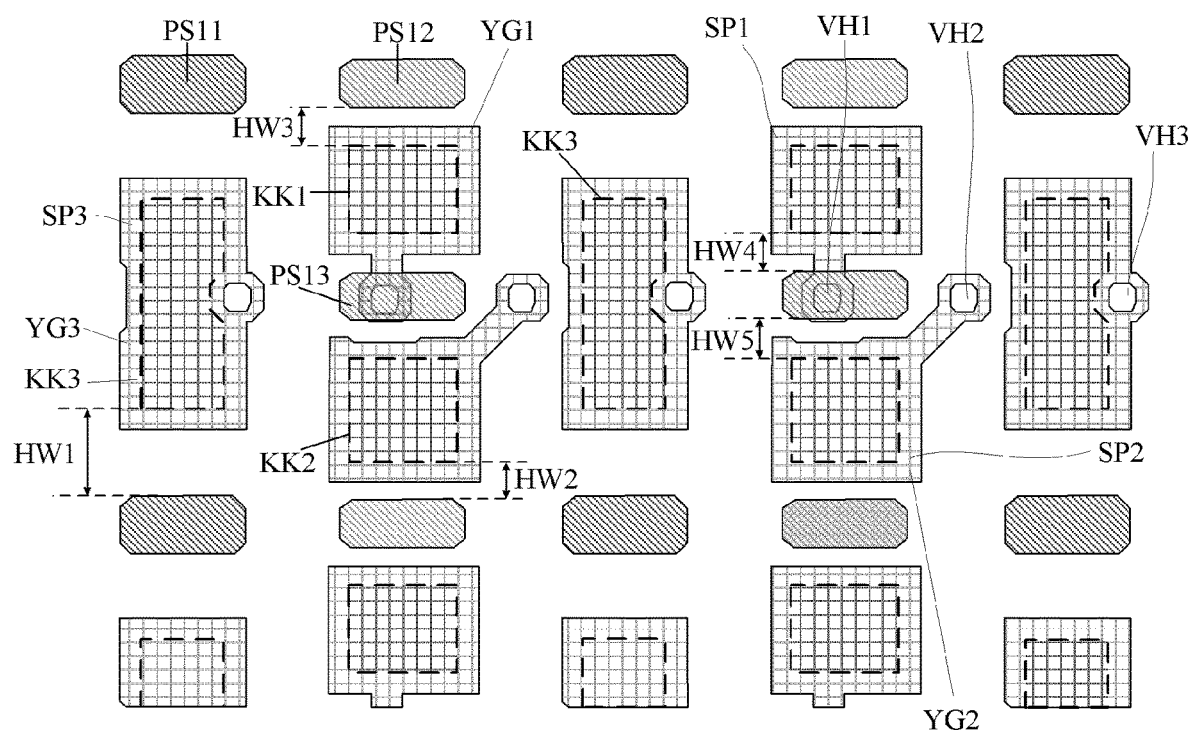
FIG. 5 shows a partial enlarged view of part VII in FIG. 4.
Figure 6:
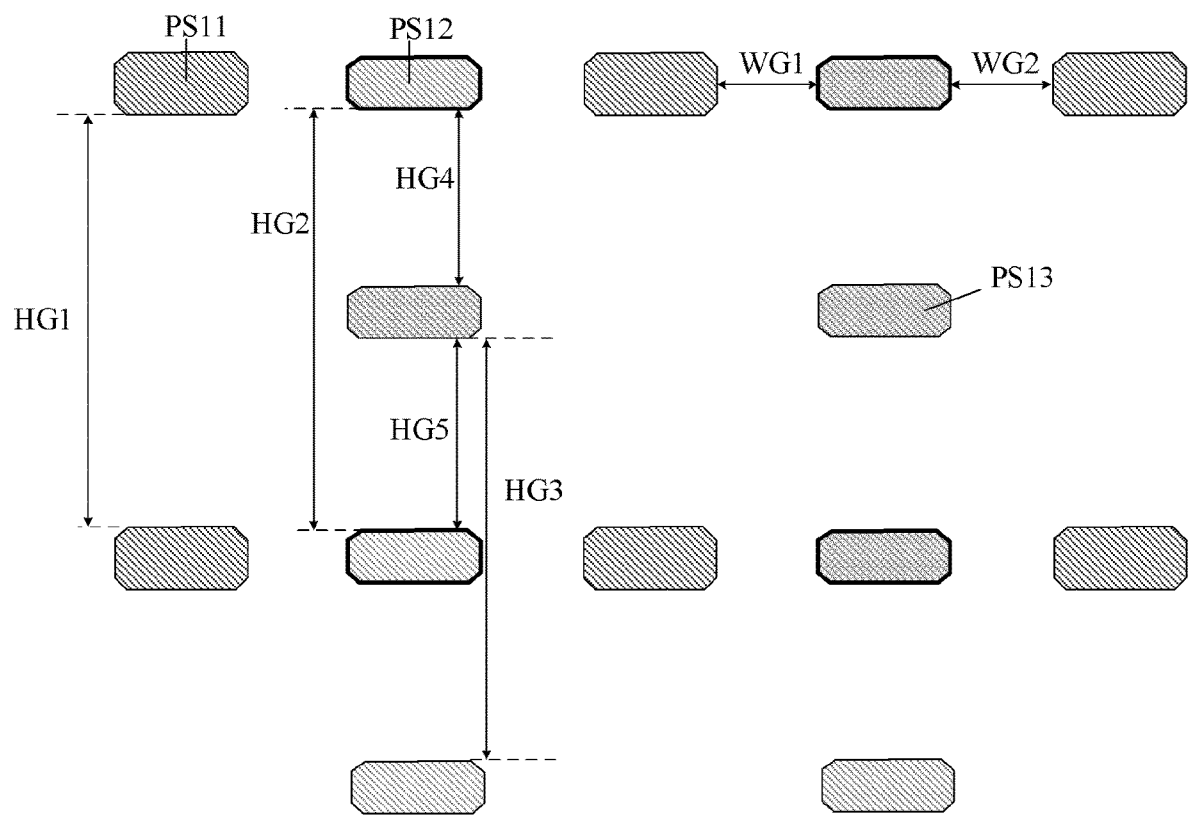
FIG. 6 shows a schematic distribution diagram of a spacer according to some exemplary embodiments of the present disclosure.

FIG. 5 shows a partial enlarged view of part VII in FIG. 4. FIG. 6 shows a schematic diagram of a distribution of spacers according to some exemplary embodiments of the present disclosure. For ease of illustration and description, FIG. 5 only shows a position and shape of the pixel defining layer opening and the anode of the sub-pixel.

Referring to FIG. 4 to FIG. 6 in combination, for example, the plurality of sub-pixels may include a first sub-pixel SP1 and a second sub-pixel SP2 that are adjacent in the second direction Y. The first sub-pixel SP1 includes a first anode YG1 and a first sub-pixel opening KK1, and the second sub-pixel SP2 includes a second anode YG2 and a second sub-pixel opening KK2.

Further, the display panel may include a plurality of pixel repetitive units PX. Each pixel repetitive unit PX may include at least one first sub-pixel SP1 and at least one second sub-pixel SP2. For example, each pixel repetitive unit PX may include a first sub-pixel SP1 and a second sub-pixel SP2 that are adjacent in the second direction Y. For example, if the first sub-pixel SP1 is a red sub-pixel, and the second sub-pixel SP2 is a green sub-pixel, then the red sub-pixel and the green sub-pixel are adjacent to each other in the second direction Y.

In an example, as shown in FIG. 5, the pixel repetitive unit PX may further include at least one third sub-pixel SP3. For example, the pixel repetitive unit may include one third sub-pixel SP3. The third sub-pixel SP3 includes a third anode YG3 and a third sub-pixel opening KK3. A connecting line between the anodes of adjacent first sub-pixel SP1 and second sub-pixel SP2, a connecting line between the anodes of adjacent second sub-pixel SP2 and third sub-pixel SP3, and a connecting line between the anodes of adjacent third sub-pixel SP3 and first sub-pixel SP1 form a triangle. For example, the first sub-pixel SP1 is a red sub-pixel, the second sub-pixel SP2 is a green sub-pixel, and the third sub-pixel SP3 is a blue sub-pixel. In the same pixel repetitive unit, connecting lines between the anodes of the red sub-pixel, the green sub-pixel and the blue sub-pixel form a triangle.

In an example, as shown in FIG. 5, in the same sub-pixel, an orthographic projection of the sub-pixel opening on the base substrate 10 is located within an orthographic projection of the anode on the base substrate 10.

In an example, as shown in FIG. 5, for at least one of the first sub-pixel SP1 or the second sub-pixel SP2, the orthographic projection of the sub-pixel opening on the base substrate 10 is a rectangle. For example, the orthographic projection of the sub-pixel opening in the first sub-pixel SP1 on the base substrate 10 and the orthographic projection of the sub-pixel opening in the second sub-pixel SP2 on the base substrate 10 are both rectangles. For example, the first sub-pixel SP1 is a red sub-pixel, the second sub-pixel SP2 is a green sub-pixel, and the third sub-pixel SP3 is a blue sub-pixel, the orthographic projection of the opening KK1 in the red sub-pixel on the base substrate 10 and the orthographic projection of the opening KK2 in the green sub-pixel on the base substrate 10 are both rectangles.

In an example, as shown in FIG. 5, an area of the sub-pixel opening in the third sub-pixel SP3 is greater than an area of the sub-pixel opening in the second sub-pixel SP2, and the area of the sub-pixel opening in the second sub-pixel SP2 is greater than an area of the sub-pixel opening in the first sub-pixel SP1. For example, the first sub-pixel SP1 is a red sub-pixel, the second sub-pixel SP2 is a green sub-pixel, and the third sub-pixel SP3 is a blue sub-pixel, an area of the sub-pixel opening KK3 in the blue sub-pixel is greater than an area of the sub-pixel opening KK2 in the green sub-pixel, and the area of the sub-pixel opening KK2 in the green sub-pixel is greater than an area of the sub-pixel opening KK1 in the red sub-pixel. In practice, the area of the sub-pixel opening in each sub-pixel may be inversely proportional to a luminescence lifetime of the sub-pixel. For example, if the luminescence lifetime of the red sub-pixel is longer than that of the green sub-pixel, and the luminescence lifetime of the green sub-pixel is greater than that of the blue sub-pixel, the area of the sub-pixel opening in the blue sub-pixel may be set greater than the area of the sub-pixel opening in the green sub-pixel, and the area of the sub-pixel opening in the green sub-pixel may be set greater than the area of the sub-pixel opening in the red sub-pixel.

In an example, as shown in FIG. 4, FIG. 5 and FIG. 6, in the display region AA, a plurality of first spacer repetitive units PSX1 may be arranged on the base substrate 10 in an array in the first direction X and the second direction Y.

For example, one first spacer repetitive unit PSX1 may include at least one first spacer PS11, at least one third spacer PS12, and at least one fifth spacer PS13. For example, one first spacer repetitive unit PSX1 may include a first spacer PS11, a third spacer PS12 and a fifth spacer PS13.

Referring to FIG. 5 and FIG. 6, the first spacer PS11 and the third spacer PS12 are located in different columns. A column of first spacers PS11 corresponds to a column of sub-pixels, and a column of third spacers PS12 corresponds to another column of sub-pixels. The number of sub-pixels in the column where the first spacer PS11 is located is different from the number of sub-pixels in the column where the third spacer PS12 is located. In an example, a column of first spacers PS11 corresponds to anodes in a column of sub-pixels, and a column of third spacers PS12 corresponds to anodes in another column of sub-pixels. Furthermore, the number of anodes in the column where the first spacer PS11 is located is different from the number of anodes in the column where the third spacer PS12 is located.

In an example, as shown in FIG. 5, the anode of at least one of the sub-pixels corresponding to the first spacer PS11 extends in the second direction Y, and the first spacer PS11 and the third spacer PS12 extend in the first direction X. In an example, for the first spacer PS11 and the corresponding sub-pixel, the first spacer PS11 and the sub-pixel are alternately and repetitively arranged in the second direction Y and have a one-to-one correspondence.

In an example, as shown in FIG. 5, an orthographic projection of the first spacer PS11 in the second direction Y does not overlap an orthographic projection of the anode in the sub-pixel in the second direction Y.

In an example, as shown in FIG. 5, a ratio of an area of the first spacer PS11 (e.g., an area of the orthographic projection of the first spacer PS11 on the base substrate 10) to an area of the corresponding sub-pixel opening (e.g., an area of the orthographic projection of the sub-pixel opening on the base substrate 10) is a first ratio. A ratio of an area of the third spacer PS12 (e.g., an area of the orthographic projection of the third spacer PS12 on the base substrate 10) to a sum of areas of the sub-pixel openings between two third spacers PS12 adjacent in the second direction Y (e.g., a sum of the areas of the orthographic projections of the sub-pixel openings between two third spacers PS12 adjacent in the second direction Y on the base substrate 10) is a second ratio. The first ratio may be different from the second ratio. In an example, the first ratio may be greater than the second ratio. The first ratio is a value obtained by dividing the area of the first spacer PS11 by the area of the corresponding sub-pixel opening. The second ratio is a value obtained by dividing the area of the third spacer PS12 by the sum of the areas of the sub-pixel openings between two third spacers PS12 adjacent in the second direction Y.

In an example, as shown in FIG. 5, a ratio of the area of the first spacer PS11 to the area of the opening KK3 in the third sub-pixel SP3 is the first ratio. The first ratio is a value obtained by dividing the area of the first spacer PS11 by the area of the opening KK3 in the third sub-pixel SP3.

In an example, as shown in FIG. 5, a ratio of the area of the third spacer PS12 to the sum of the areas of the openings in the first sub-pixel SP1 and the second sub-pixel SP2 is the second ratio. The second ratio is a value obtained by dividing the area of the third spacer PS12 by the sum of the areas of the openings in the first sub-pixel SP1 and the second sub-pixel SP2.

In an example, as shown in FIG. 5, an area ratio of the first spacers PS11 adjacent in the second direction Y is in a range of 0.8 to 1.2. For example, an area ratio of the orthographic projections of the first spacers PS11 adjacent in the second direction Y on the base substrate 10 may be in a range of 0.8 to 1.2. In an example, the area ratio of the first spacers PS11 adjacent in the second direction Y is in a range of 0.9 to 1.1. For example, the area ratio of the first spacers PS11 adjacent in the second direction Y may be 0.8. The area ratio of the first spacers PS11 adjacent in the second direction Y may also be 0.9. The area ratio of the first spacers PS11 adjacent in the second direction Y may also be 1.0. The area ratio of the first spacers PS11 adjacent in the second direction Y may also be 1.1. The area ratio of the first spacers PS11 adjacent in the second direction Y may also be 1.2. In practice, this may be designed and determined according to actual application requirements, which is not limited here.

In an example, as shown in FIG. 5 and FIG. 6, the first spacers PS11 adjacent in the second direction Y are spaced apart by a spacing distance HG1, and the third spacers PS12 adjacent in the second direction Y are spaced apart by a spacing distance HG2. The spacing distance HG2 is greater than the spacing distance HG1. The fifth spacers PS13 adjacent in the second direction Y are spaced apart by a spacing distance HG3. A ratio of the spacing distance HG3 to the spacing distance HG2 is in a range of 0.8 to 1.2. For example, the spacing distance HG3 may be substantially equal to the spacing distance HG2. For example, the spacing distance HG3 is greater than the spacing distance HG1.

In an example, the spacing distance HG1 may be a minimum distance between boundaries of the first spacers PS11 adjacent in the second direction Y. The spacing distance HG2 may be a minimum distance between boundaries of the third spacers PS12 adjacent in the second direction Y. The spacing distance HG3 may be a minimum distance between boundaries of the fifth spacers PS13 adjacent in the second direction Y.

In the same first spacer repetitive unit PSX1, the third spacer PS12 and the fifth spacer PS13 adjacent in the second direction Y are spaced apart by a spacing distance HG4. In two first spacer repetitive units PSX1 adjacent in the second direction Y, the third spacer PS12 and the fifth spacer PS13 adjacent in the second direction Y are spaced apart by a spacing distance HG5. A ratio of the spacing distance HG4 to the spacing distance HG5 is in a range of 0.8 to 1.2. For example, the spacing distance HG4 may be substantially equal to the spacing distance HG5.

In an example, the spacing distance HG4, HG5 may be a minimum distance between boundaries of the third spacer PS12 and the fifth spacer PS13 adjacent in the second direction Y.

In an example, as shown in FIG. 6, a ratio between the spacing distance HG2 and the spacing distance HG4 or HG5 may be in a range of 0.3 to 0.5. In an example, a ratio between the spacing distance HG2 and the spacing distance HG4 or HG5 may be in a range of 0.4 to 0.48. For example, a ratio between the spacing distance HG2 and the spacing distance HG4 or HG5 may be 0.4. The ratio between the spacing distance HG2 and the spacing distance HG4 or HG5 may be 0.45. In practice, this may be designed and determined according to actual application requirements, which is not limited here.

In an example, as shown in FIG. 5 and FIG. 6, a width of the first spacer PS11 in the second direction Y is greater than a width of the third spacer PS12 in the second direction Y; and a width of the first spacer PS11 in the first direction X is not less than a width of the third spacer PS12 in the first direction X. In this way, the area of the orthographic projection of the first spacer PS11 on the base substrate 10 may be greater than the area of the orthographic projection of the third spacer PS12 on the base substrate 10.

In an example, as shown in FIG. 5 and FIG. 6, the third spacer PS12 corresponds to the first sub-pixel SP1 and the second sub-pixel SP2. The anode YG1 of the first sub-pixel SP1 and the anode YG2 of the second sub-pixel SP2 are arranged between the third spacers PS12 adjacent in the second direction Y. In this way, the third spacers PS12 adjacent in the second direction Y may be spaced apart by the anode YG1 of the first sub-pixel SP1 and the anode YG2 of the second sub-pixel SP2.

In an example, as shown in FIG. 5 and FIG. 6, the first spacer PS11 corresponds to the third sub-pixel SP3. The anode YG3 of the third sub-pixel SP3 is arranged between the first spacers PS11 adjacent in the second direction Y. In this way, the first spacers PS11 adjacent in the second direction Y may be spaced apart by the anode YG3 of the third sub-pixel SP3.

In an example, as shown in FIG. 5 and FIG. 6, the column where the first spacer PS11 is located and the column where the third spacer PS12 is located are alternately arranged in the first direction X; and the first spacer PS11 and the third spacer PS12 are alternately arranged along a straight line in the first direction X. In this way, the first spacer PS11 and the third spacer PS12 may be alternately arranged in the first direction X and the second direction Y, so that the arrangement may be as uniform as possible.

In an example, as shown in FIG. 5 and FIG. 6, a plurality of fifth spacers PS13 may be arranged at intervals from the first spacer PS11 and the third spacer PS12. The area of the fifth spacer PS13 is different from that of the first spacer PS11. The orthographic projection of the fifth spacer PS13 in the second direction Y does not overlap the orthographic projection of the first spacer PS11 and the orthographic projection of the third spacer PS12 in the second direction Y.

In an example, as shown in FIG. 5 and FIG. 6, the third spacer PS12 and the fifth spacer PS13 are alternately arranged in a column, and adjacent third spacer PS12 and fifth spacer PS13 correspond to a body portion of a sub-pixel. In an example, in the second direction Y, a fifth spacer PS13 is adjacent to two third spacers PS12. One of the two third spacers PS12 is located above the fifth spacer PS13, and the other is located below the fifth spacer PS13. Moreover, a body portion of the anode YG1 of the first sub-pixel SP1 is arranged between the fifth spacer PS13 and the third spacer PS12 located above the fifth spacer PS13, and a body portion of the anode YG2 of the second sub-pixel SP2 is arranged between the fifth spacer PS13 and the third spacer PS12 located below the fifth spacer PS13.

In an example, as shown in FIG. 5 and FIG. 6, a ratio of the area of the fifth spacer PS13 to the area of the third spacer PS12 is a third ratio, which may be in a range of 0.8 to 1.2. In an example, the third ratio may also be in a range of 0.9 to 1.1. For example, the third ratio may be 0.8. The third ratio may also be 0.9. The third ratio may also be 1.0. The third ratio may also be 1.1. The third ratio may also be 1.2. In practice, this may be designed and determined according to actual application requirements, which is not limited here.

In an example, as shown in FIG. 5 and FIG. 6, the orthographic projection of the fifth spacer PS13 on the base substrate 10 at least overlaps with an orthographic projection of a via hole portion VH1 in the first sub-pixel SP1 on the base substrate 10. In an example, the orthographic projection of the fifth spacer PS13 on the base substrate 10 may cover the orthographic projection of the via hole portion VH1 in the first sub-pixel SP1 on the base substrate 10.

In an example, as shown in FIG. 5 and FIG. 6, a ratio of the width of the fifth spacer PS13 in the second direction Y to the width of the opening of the first sub-pixel SP1 in the second direction Y is a fourth ratio. That is, the fourth ratio may be a value obtained by dividing the width of the fifth spacer PS13 in the second direction Y by the width of the opening of the first sub-pixel SP1 in the second direction Y. In an example, the fourth ratio may be in a range of 0.4 to 0.8. In an example, the fourth ratio may also be in a range of 0.5 to 0.7. For example, the fourth ratio may be 0.4. The fourth ratio may also be 0.5. The fourth ratio may also be 0.6. The fourth ratio may also be 0.7. The fourth ratio may also be 0.8. In practice, this may be designed and determined according to actual application requirements, which is not limited here.

In an example, as shown in FIG. 5 and FIG. 6, a ratio of the width of the third spacer PS12 in the second direction Y to the width of the opening of the second sub-pixel SP2 in the second direction Y is a fifth ratio. That is, the fifth ratio may be a value obtained by dividing the width of the third spacer PS12 in the second direction Y by the width of the opening of the second sub-pixel SP2 in the second direction Y. In an example, the fifth ratio may be in a range of 0.4 to 0.8. For example, the fifth ratio may be in a range of 0.5 to 0.7. In an example, the fifth ratio may be 0.4. The fifth ratio may also be 0.5. The fifth ratio may also be 0.6. The fifth ratio may also be 0.7. The fifth ratio may also be 0.8. In practice, this may be designed and determined according to actual application requirements, which is not limited here.

In an example, as shown in FIG. 5 and FIG. 6, in the second direction Y, the first spacer PS11 and the opening KK3 of the adjacent third sub-pixel SP3 are spaced apart by a first distance HW1. In the second direction Y, the third spacer PS12 and the opening KK2 of the adjacent second sub-pixel SP2 are spaced apart by a second distance HW2, and the third spacer PS12 and the opening KK1 of the adjacent first sub-pixel SP1 are spaced apart by a third distance HW3. In the second direction Y, the fifth spacer PS13 and the opening KK2 of the adjacent second sub-pixel SP2 are spaced apart by a fifth distance HW5, and the fifth spacer PS13 and the opening KK1 of the adjacent first sub-pixel SP1 are spaced apart by a fourth distance HW4. The second distance HW2, the third distance HW3, the fourth distance HW4 and the fifth distance HW5 are less than the first distance HW1.

In an example, a ratio of the second distance HW2 to the third distance HW3 may be in a range of 0.8 to 1.2. In an example, the ratio of the second distance HW2 to the third distance HW3 may be in a range of 0.9 to 1.1. For example, the ratio of the second distance HW2 to the third distance HW3 may be 0.8. The ratio of the second distance HW2 to the third distance HW3 may also be 0.9. The ratio of the second distance HW2 to the third distance HW3 may also be 1.0. The ratio of the second distance HW2 to the third distance HW3 may also be 1.1. The ratio of the second distance HW2 to the third distance HW3 may also be 1.2. In practice, this may be designed and determined according to actual application requirements, which is not limited here.

In an example, a ratio of the fourth distance HW4 to the fifth distance HW5 may be in a range of 0.8 to 1.2. In an example, the ratio of the fourth distance HW4 to the fifth distance HW5 may be in a range of 0.9 to 1.1. For example, the ratio of the fourth distance HW4 to the fifth distance HW5 may be 0.8. The ratio of the fourth distance HW4 to the fifth distance HW5 may also be 0.9. The ratio of the fourth distance HW4 to the fifth distance HW5 may also be 1.0. The ratio of the fourth distance HW4 to the fifth distance HW5 may also be 1.1. The ratio of the fourth distance HW4 to the fifth distance HW5 may also be 1.2. In practice, this may be designed and determined according to actual application requirements, which is not limited here.

In an example, as shown in FIG. 5, in the row direction, the fifth spacer PS13, the via hole portion VH1 in the first sub-pixel SP1, a via hole portion VH2 in the second sub-pixel SP2 and a via hole portion VH3 in the third sub-pixel SP3 are arranged on the same straight line.

It should be noted that a shape of the above-mentioned via hole and through hole may be a rectangle, a rounded rectangle, a circle, an ellipse, a square, a hexagon, an octagon, etc., which may be designed according to actual application requirements and is not limited here.

Referring to FIG. 4 to FIG. 6 in combination, the plurality of first spacer repetitive units PSX1 are arranged in the display region AA in an array in the first direction X and the second direction Y. The third spacer PS12 and the fifth spacer PS13 are alternately arranged in a column, the first spacer PS11 and the third spacer PS12 are located in different columns, the plurality of first spacers PS11 are repetitively arranged in a column, and the column where the third spacer PS12 and the fifth spacer PS13 are located and the column where the first spacer PS11 is located are alternately arranged in the first direction X.

The plurality of second spacer repetitive units PSX2 are arranged outside the display region AA, that is, arranged in the peripheral region NA. For example, at least one column of second spacer repetitive units PSX2 are provided on an outer side (that is, on a side facing an outer edge of the display panel) of the outermost column of pixel repetitive units (e.g., a column of pixel repetitive units close to the third boundary AA3 or a column of pixel repetitive units close to the fourth boundary AA4). At least one row of second spacer repetitive units PSX2 are provided on an outer side (that is, on a side facing an outer edge of the display panel) of the outermost row of pixel repetitive units (e.g., a row of pixel repetitive units close to the first boundary AA1 or a row of pixel repetitive units close to the second boundary AA2).

In an example, referring to FIG. 4, for a row of first spacer repetitive units PSX1, at least one second spacer repetitive unit PSX2 is provided on a side away from the third boundary AA3, and at least one second spacer repetitive unit PSX2 is provided on a side away from the fourth boundary AA4. That is, at least one second spacer repetitive unit PSX2 is provided on each of opposite sides of the row of first spacer repetitive units PSX1 in the first direction X. For example, one, two, three or more second spacer repetitive units PSX2 are provided on each of the opposite sides of the row of first spacer repetitive units PSX1.

For a column of first spacer repetitive units PSX1, at least one second spacer repetitive unit PSX2 is provided on a side away from the first boundary AA1, and at least one second spacer repetitive unit PSX2 is provided on a side away from the second boundary AA2. That is, at least one second spacer repetitive unit PSX2 is provided on each of opposite sides of a column of first spacer repetitive units PSX1 in the second direction Y. For example, one, two, three or more second spacer repetitive units PSX2 are provided on each of the opposite sides of the column of first spacer repetitive units PSX1 in the second direction Y.

Figure 7:
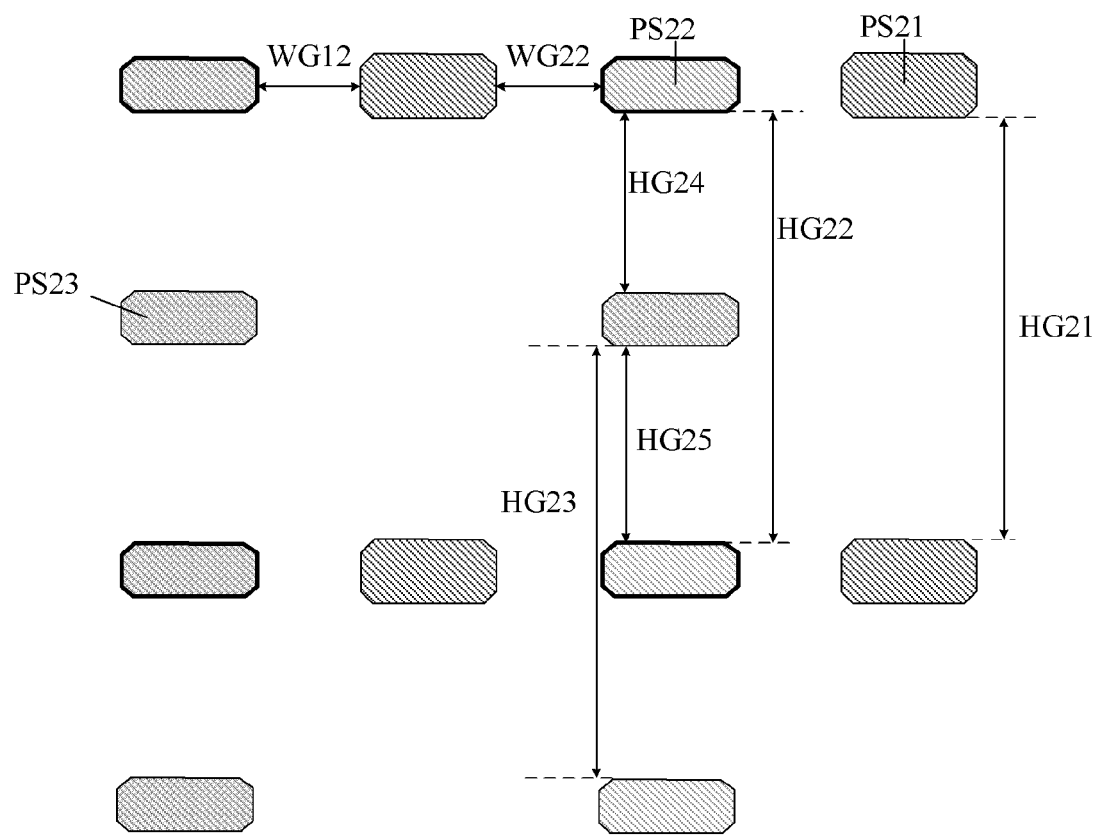
FIG. 7 shows a partial enlarged view of part VIII in FIG. 4.

FIG. 7 shows a partial enlarged view of part VIII in FIG. 4. Referring to FIG. 4 to FIG. 7 in combination, one second spacer repetitive unit PSX2 may include at least one second spacer PS21, at least one fourth spacer PS22, and at least one sixth spacer PS23. For example, the second spacer repetitive unit PSX2 may include a second spacer PS21, a fourth spacer PS22, and a sixth spacer PS23.

Referring to FIG. 4 to FIG. 7, the fourth spacer PS22 and the sixth spacer PS23 are alternately arranged in a column, the second spacer PS21 and the fourth spacer PS22 are located in different columns, a plurality of second spacers PS21 are repetitively arranged in a column, and the column where the fourth spacer PS22 and the sixth spacer PS23 are located and the column where the second spacer PS21 is located are alternately arranged in the first direction X. The second spacer PS21 and the fourth spacer PS22 are alternately arranged in the first direction X.

For example, the second spacer PS21, the fourth spacer PS22 and the sixth spacer PS23 extend in the first direction X.

In an example, as shown in FIG. 4, at least one second spacer repetitive unit PSX2 is provided on each of opposite sides of a row of first spacer repetitive units PSX1 in the first direction X. That is, at least two second spacer repetitive units PSX2 may be located in the same row as the row of first spacer repetitive units PSX1. For the plurality of first spacer repetitive units PSX1 and the at least two second spacer repetitive units PSX2 located in the same row, the second spacer PS21 and the fourth spacer PS22 are located on the same straight line as the first spacer PS11 and the third spacer PS12, that is, they are aligned with each other in the first direction X; the sixth spacer PS23 is located on the same straight line as the third spacer PS13, that is, they are aligned with each other in the first direction X.

Continuing to refer to FIG. 4, at least one second spacer repetitive unit PSX2 is provided on each of opposite sides of a column of first spacer repetitive units PSX1 in the second direction Y. That is, at least two second spacer repetitive units PSX2 may be located in the same column as the column of first spacer repetitive units PSX1. For the plurality of first spacer repetitive units PSX1 and the at least two second spacer repetitive units PSX2 located in the same column, the fourth spacer PS22 and the sixth spacer PS23 are located on the same straight line as the third spacer PS12 and the fifth spacer PS13, that is, they are aligned with each other in the second direction Y; the second spacer PS21 is located on the same straight line as the first spacer PS11, that is, they are aligned with each other in the second direction Y.

In an example, referring to FIG. 4, FIG. 6 and FIG. 7 in combination, a width of the second spacer PS21 in the second direction Y is greater than a width of the fourth spacer PS22 in the second direction Y; and a width of the second spacer PS21 in the first direction X is not less than a width of the fourth spacer PS22 in the first direction X. Then, an area of an orthographic projection of the second spacer PS21 on the base substrate 10 may be greater than an area of an orthographic projection of the fourth spacer PS22 on the base substrate 10.

In an example, a plurality of sixth spacers PS23 may be spaced apart from the second spacer PS21 and the fourth spacer PS22. An area of the sixth spacer PS23 is different from that of the second spacer PS21. An orthographic projection of the sixth spacer PS23 in the second direction Y does not overlap an orthographic projection of the second spacer PS21 in the second direction Y and an orthographic projection of the fourth spacer PS22 in the second direction Y.

In an example, in the second direction Y, a sixth spacer PS23 is adjacent to two fourth spacers PS22. One of the two fourth spacers PS22 is located above the sixth spacer PS23, and the other is located below the sixth spacer PS23.

In an example, a ratio of the area of the sixth spacer PS23 to an area of the fourth spacer PS22 is a third ratio, which may be in a range of 0.8 to 1.2. In an example, the third ratio may also be in a range of 0.9 to 1.1. For example, the third ratio may be 0.8. The third ratio may also be 0.9. The third ratio may also be 1.0. The third ratio may also be 1.1. The third ratio may also be 1.2. In practice, this may be designed and determined according to actual application requirements, which is not limited here.

For example, a width of the sixth spacer PS23 in the second direction Y is substantially equal to a width of the fourth spacer PS22 in the second direction Y; and a width of the sixth spacer PS23 in the first direction X is substantially equal to a width of the fourth spacer PS22 in the first direction X. Then, an area of an orthographic projection of the sixth spacer PS23 on the base substrate 10 may be substantially equal to the area of the orthographic projection of the fourth spacer PS22 on the base substrate 10.

Continuing to refer to FIG. 7, an area ratio of any two second spacers PS21 is in a range of 0.8 to 1.2. For example, an area ratio of orthographic projections of any two second spacers PS21 on the base substrate 10 may be in a range of 0.8 to 1.2. In an example, the area ratio of any two second spacers PS21 is in a range of 0.9 to 1.1. For example, the area ratio of any two second spacers PS21 may be 0.8. The area ratio of any two second spacers PS21 may also be 0.9. The area ratio of any two second spacers PS21 may also be 1.0. The area ratio of any two second spacers PS21 may also be 1.1. The area ratio of any two second spacers PS21 may also be 1.2. In practice, this may be designed and determined according to actual application requirements, which is not limited here.

An area ratio of any two fourth spacers PS22 is in a range of 0.8 to 1.2. For example, an area ratio of orthographic projections of any two fourth spacers PS22 on the base substrate 10 may be in a range of 0.8 to 1.2. In an example, the area ratio of any two fourth spacers PS22 is in a range of 0.9 to 1.1. For example, the area ratio of any two fourth spacers PS22 may be 0.8. The area ratio of any two fourth spacers PS22 may also be 0.9. The area ratio of any two fourth spacers PS22 may also be 1.0. The area ratio of any two fourth spacers PS22 may also be 1.1. The area ratio of any two fourth spacers PS22 may also be 1.2. In practice, this may be designed and determined according to actual application requirements, which is not limited here.

An area ratio of any two sixth spacers PS23 is in a range of 0.8 to 1.2. For example, an area ratio of orthographic projections of any two sixth spacers PS23 on the base substrate 10 may be in a range of 0.8 to 1.2. In an example, the area ratio of any two sixth spacers PS23 is in a range of 0.9 to 1.1. For example, the area ratio of any two sixth spacers PS23 may be 0.8. The area ratio of any two sixth spacers PS23 may also be 0.9. The area ratio of any two sixth spacers PS23 may also be 1.0. The area ratio of any two sixth spacers PS23 may also be 1.1. The area ratio of any two sixth spacers PS23 may also be 1.2. In practice, this may be designed and determined according to actual application requirements, which is not limited here.

An area ratio of a second spacer PS21 to a first spacer PS11 located in the same row or in the same column is in a range of 0.8 to 1.2. For example, an area ratio of an orthographic projection of the second spacer PS21 on the base substrate 10 to an orthographic projection of the first spacer PS11 located in the same row or in the same column as the second spacer PS21 on the base substrate 10 may be in a range of 0.8 to 1.2. In an example, the area ratio of the second spacer PS21 to the first spacer PS11 located in the same row or in the same column is in a range of 0.9 to 1.1. For example, the area ratio of the second spacer PS21 to the first spacer PS11 located in the same row or in the same column may be 0.8. The area ratio of the second spacer PS21 to the first spacer PS11 located in the same row or in the same column may be 0.9. The area ratio of the second spacer PS21 to the first spacer PS11 located in the same row or in the same column may be 1.0. The area ratio of the second spacer PS21 to the first spacer PS11 located in the same row or in the same column may be 1.1. The area ratio of the second spacer PS21 to the first spacer PS11 located in the same row or in the same column may be 1.2. In practice, this may be designed and determined according to actual application requirements, which is not limited here.

An area ratio of a fourth spacer PS22 to a third spacer PS12 located in the same row or in the same column is in a range of 0.8 to 1.2. For example, an area ratio of an orthographic projection of the fourth spacer PS22 on the base substrate 10 to an orthographic projection of the third spacer PS12 located in the same row or in the same column as the fourth spacer PS22 on the base substrate 10 may be in a range of 0.8 to 1.2. In an example, the area ratio of the fourth spacer PS22 to the third spacer PS12 located in the same row or in the same column is in a range of 0.9 to 1.1. For example, the area ratio of the fourth spacer PS22 to the third spacer PS12 located in the same row or in the same column may be 0.8. The area ratio of the fourth spacer PS22 to the third spacer PS12 located in the same row or in the same column may also be 0.9. The area ratio of the fourth spacer PS22 to the third spacer PS12 located in the same row or in the same column may also be 1.0. The area ratio of the fourth spacer PS22 to the third spacer PS12 located in the same row or in the same column may also be 1.1. The area ratio of the fourth spacer PS22 to the third spacer PS12 located in the same row or in the same column may also be 1.2. In practice, this may be designed and determined according to actual application requirements, which is not limited here.

An area ratio of a sixth spacer PS23 to a fifth spacer PS13 located in the same row or in the same column is in a range of 0.8 to 1.2. For example, an area ratio of an orthographic projection of the sixth spacer PS23 to an orthographic projection of the fifth spacer PS13 located in the same row or in the same column as the sixth spacer PS23 on the base substrate 10 may be in a range of 0.8 to 1.2. In an example, the area ratio of the sixth spacer PS23 to the fifth spacer PS13 located in the same row or in the same column is in a range of 0.9 to 1.1. For example, the area ratio of the sixth spacer PS23 to the fifth spacer PS13 located in the same row or in the same column may be 0.8. The area ratio of the sixth spacer PS23 to the fifth spacer PS13 located in the same row or in the same column may also be 0.9. The area ratio of the sixth spacer PS23 to the fifth spacer PS13 located in the same row or in the same column may also be 1.0. The area ratio of the sixth spacer PS23 to the fifth spacer PS13 located in the same row or in the same column may also be 1.1. The area ratio of the sixth spacer PS23 to the fifth spacer PS13 located in the same row or in the same column may also be 1.2. In practice, this may be designed and determined according to actual application requirements, which is not limited here.

In an example, as shown in FIG. 6 and FIG. 7, the second spacers PS21 adjacent in the second direction Y are spaced apart by a spacing distance HG21, and the fourth spacers PS22 adjacent in the second direction Y are spaced apart by a spacing distance HG22. The spacing distance HG22 is greater than the spacing distance HG21. The sixth spacers PS23 adjacent in the second direction Y are spaced apart by a spacing distance HG23. A ratio of the spacing distance HG23 to the spacing distance HG22 is in a range of 0.8 to 1.2. For example, the spacing distance HG23 may be substantially equal to the spacing distance HG22. For example, the spacing distance HG23 is greater than the spacing distance HG21.

For example, a ratio of the spacing distance HG1 to the spacing distance HG21 is in a range of 0.8 to 1.2. For example, the spacing distance HG1 may be substantially equal to the spacing distance HG21. A ratio of the spacing distance HG2 to the spacing distance HG22 is in a range of 0.8 to 1.2. For example, the spacing distance HG2 may be substantially equal to the spacing distance HG22. A ratio of the spacing distance HG3 to the spacing distance HG23 is in a range of 0.8 to 1.2. For example, the spacing distance HG3 may be substantially equal to the spacing distance HG23.

Similarly, the spacing distance HG21 may be a minimum distance between boundaries of the second spacers PS21 adjacent in the second direction Y. The spacing distance HG22 may be a minimum distance between boundaries of the fourth spacers PS22 adjacent in the second direction Y. The spacing distance HG23 may be a minimum distance between boundaries of the sixth spacers PS23 adjacent in the second direction Y.

In the same second spacer repetitive unit PSX2, the fourth spacer PS22 and the sixth spacer PS23 adjacent in the second direction Y are spaced apart by a spacing distance HG24. In two second spacer repetitive units PSX2 adjacent in the second direction Y, the fourth spacer PS22 and the sixth spacer PS23 adjacent in the second direction Y are spaced apart by a spacing distance HG25. A ratio of the spacing distance HG24 to the spacing distance HG25 is in a range of 0.8 to 1.2. For example, the spacing distance HG24 may be substantially equal to the spacing distance HG25.

In an example, the spacing distance HG24, HG25 may be a minimum distance between boundaries of the fourth spacer PS22 and the sixth spacer PS23 adjacent in the second direction Y.

In an example, as shown in FIG. 7, a ratio between the spacing distance HG22 and the spacing distance HG24 or HG25 may be in a range of 0.3 to 0.5. In an example, the ratio between the spacing distance HG22 and the spacing distance HG24 or HG25 may be in a range of 0.4 to 0.48. For example, the ratio between the spacing distance HG22 and the spacing distance HG24 or HG25 may be 0.4. The ratio between the spacing distance HG22 and the spacing distance HG24 or HG25 may also be 0.45. In practice, this may be designed and determined according to actual application requirements, which is not limited here.

In an example, as shown in FIG. 6 and FIG. 7, in the same first spacer repetitive unit PSX1, the first spacer PS11 and the third spacer PS12 adjacent in the first direction X are spaced apart by a spacing distance WG1. In two first spacer repetitive units PSX1 adjacent in the first direction X, the first spacer PS11 and the third spacer PS12 adjacent in the first direction X are spaced apart by a spacing distance WG2. A ratio of the spacing distance WG1 to the spacing distance WG2 is in a range of 0.8 to 1.2. For example, the spacing distance WG1 may be substantially equal to the spacing distance WG2.

In the same second spacer repetitive unit PSX2, the second spacer PS21 and the fourth spacer PS22 adjacent in the first direction X are spaced apart by a spacing distance WG12. In two second spacer repetitive units PSX2 adjacent in the first direction X, the second spacer PS21 and the fourth spacer PS22 adjacent in the first direction X are spaced apart by a spacing distance WG22. A ratio of the spacing distance WG12 to the spacing distance WG22 is in a range of 0.8 to 1.2. For example, the spacing distance WG12 may be substantially equal to the spacing distance WG22.

For example, a ratio of the spacing distance WG1 to the spacing distance WG12 is in a range of 0.8 to 1.2. For example, the spacing distance WG1 may be substantially equal to the spacing distance WG12.

For example, a ratio of the spacing distance WG2 to the spacing distance WG22 is in a range of 0.8 to 1.2. For example, the spacing distance WG2 may be substantially equal to the spacing distance WG22.

Similarly, the spacing distance WG1, WG2 may be a minimum distance between boundaries of the first spacer PS11 and the third spacer PS12 adjacent in the first direction X. The spacing distance WG12, WG22 may be a minimum distance between boundaries of the second spacer PS21 and the fourth spacer PS22 adjacent in the first direction X.

Figure 8:
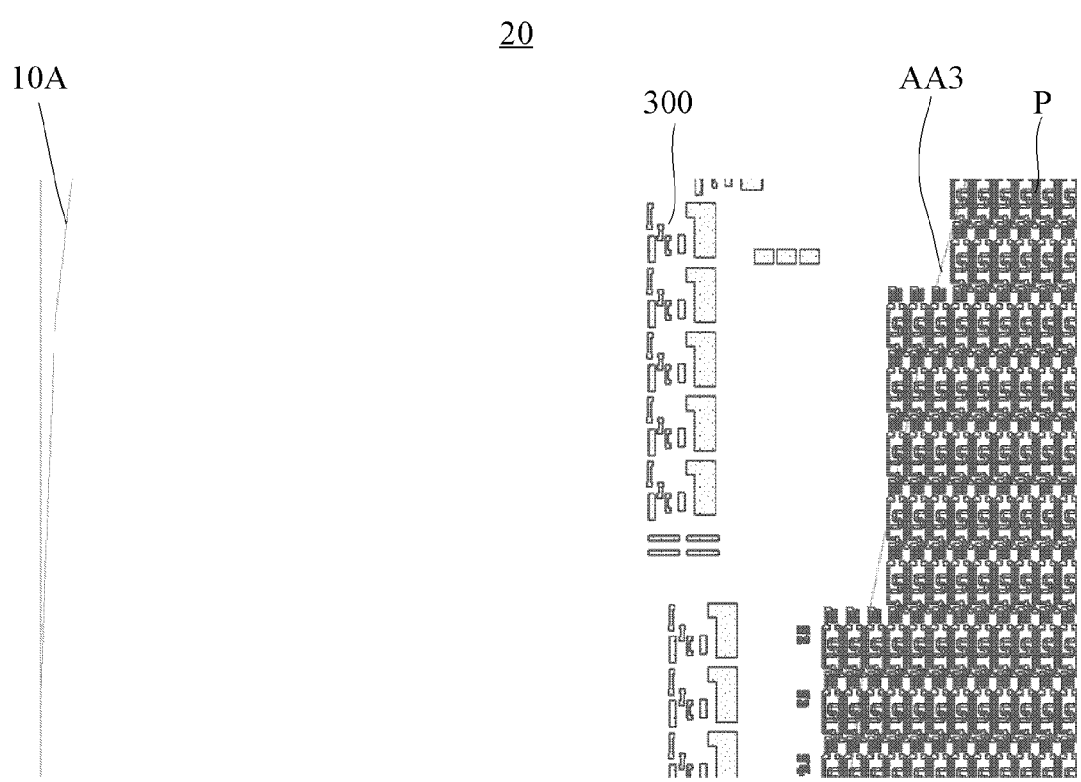
FIG. 8 to FIG. 23 show plan views of some film layers of the exemplary embodiments of part I in FIG. 1, where FIG. 8 schematically shows a semiconductor layer, FIG. 9 schematically shows a first conductive layer, FIG. 10 schematically shows a combination of a semiconductor layer and a first conductive layer, FIG. 11 schematically shows a second conductive layer, FIG. 12 schematically shows a combination of a semiconductor layer, a first conductive layer and a second conductive layer, FIG. 13A schematically shows an interlayer insulating layer, FIG. 13B schematically shows a combination of a semiconductor layer, a first conductive layer, a second conductive layer and an interlayer insulating layer, FIG. 14 schematically shows a third conductive layer, FIG. 15 schematically shows a combination of a semiconductor layer, a first conductive layer, a second conductive layer, an interlayer insulating layer and a third conductive layer, FIG. 16 schematically shows a planarization layer, FIG. 17 schematically shows a combination of a semiconductor layer, a first conductive layer, a second conductive layer, an interlayer insulating layer, a third conductive layer and a planarization layer, FIG. 18 schematically shows a first electrode layer, FIG. 19 schematically shows a combination of a semiconductor layer, a first conductive layer, a second conductive layer, an interlayer insulating layer, a third conductive layer, a planarization layer and a first electrode layer, FIG. 20 schematically shows a pixel defining layer, FIG. 21 schematically shows a combination of a semiconductor layer, a first conductive layer, a second conductive layer, an interlayer insulating layer, a third conductive layer, a planarization layer, a first electrode layer and a pixel defining layer, FIG. 22 schematically shows a spacer layer, and FIG. 23 schematically shows a combination of a semiconductor layer, a first conductive layer, a second conductive layer, an interlayer insulating layer, a third conductive layer, a planarization layer, a first electrode layer, a pixel defining layer and a spacer layer.
Figure 9:
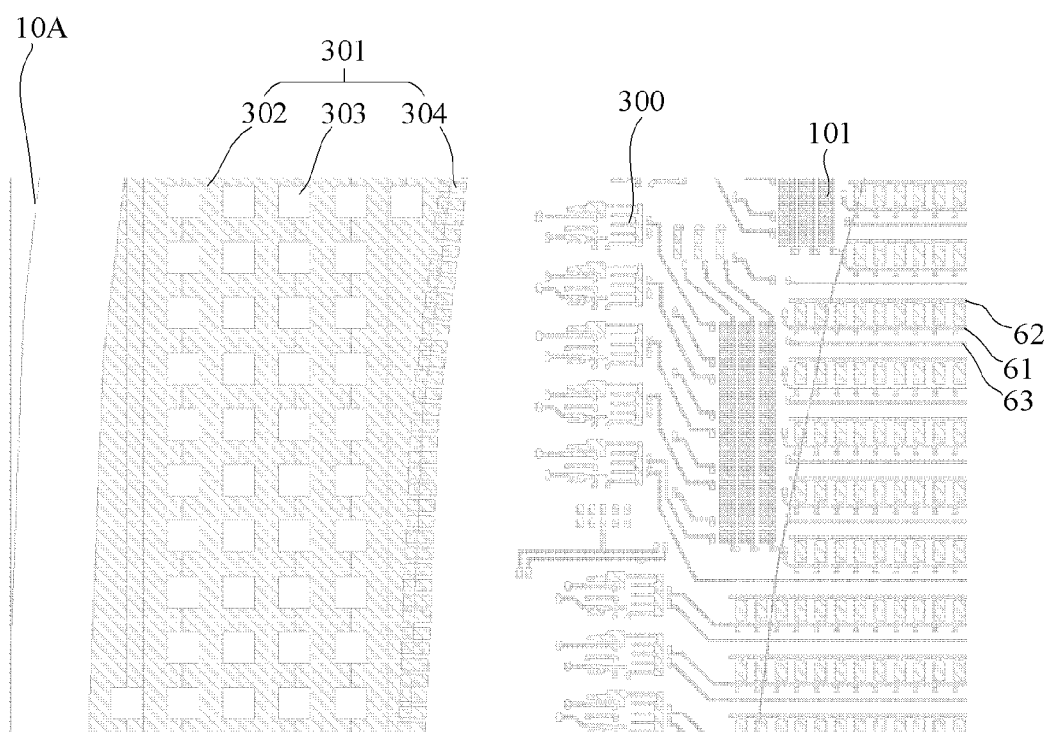
Figure 10:
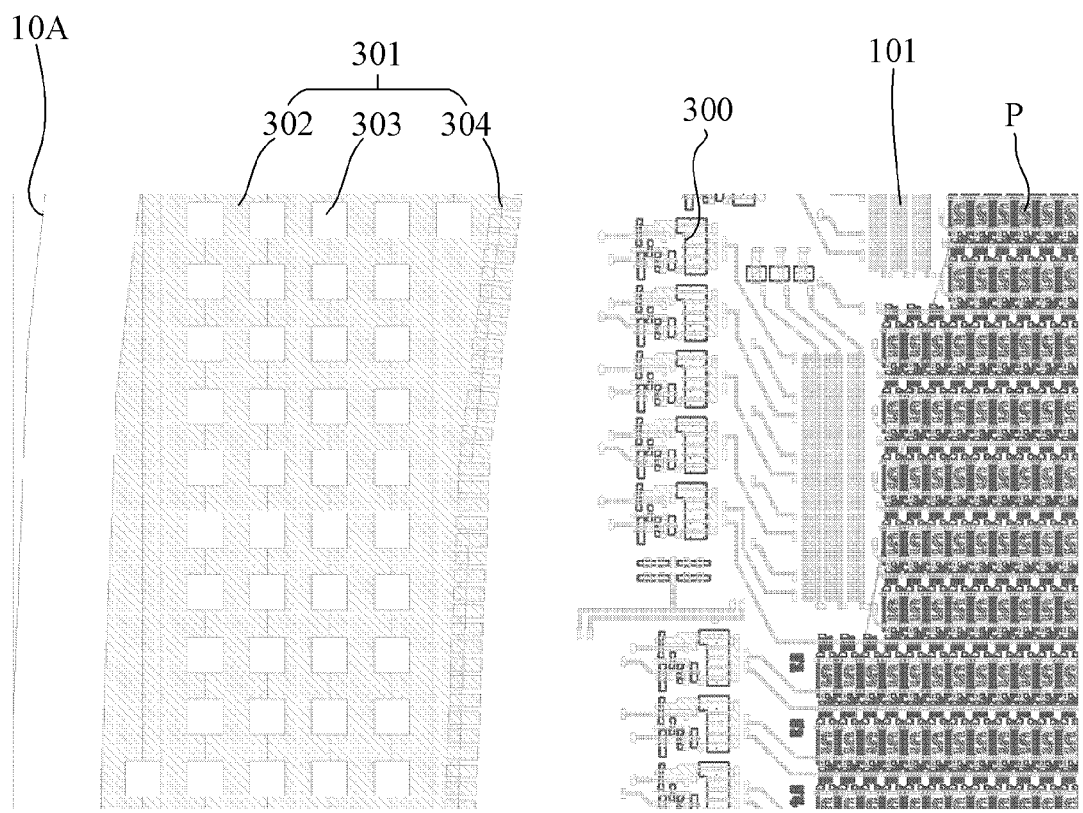
Figure 11:
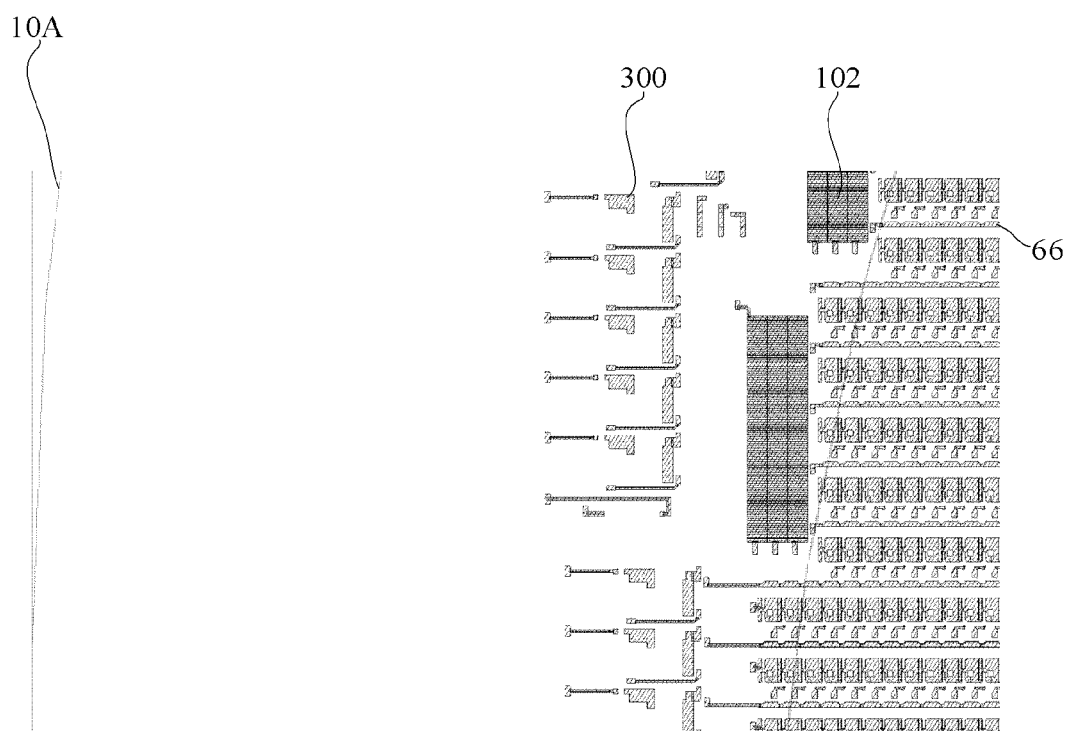
Figure 12:
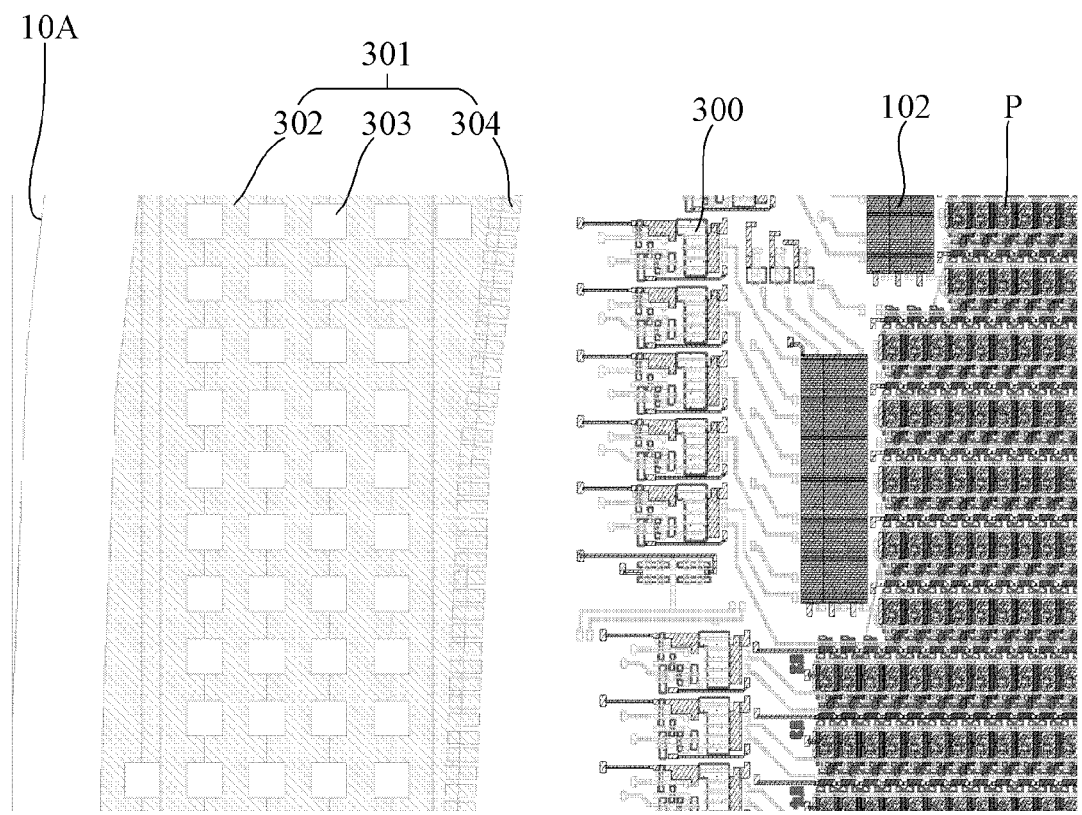
Figure 13A:
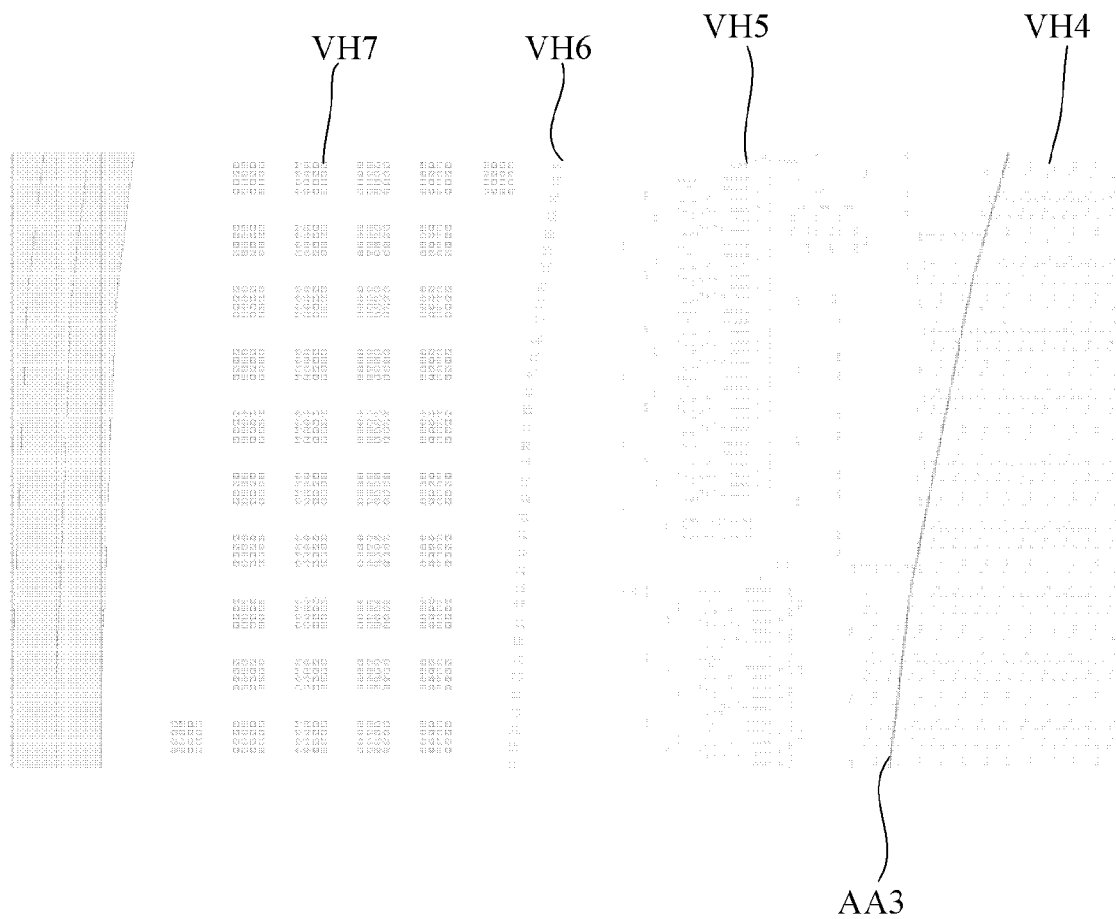
Figure 13B:
Figure 13B:
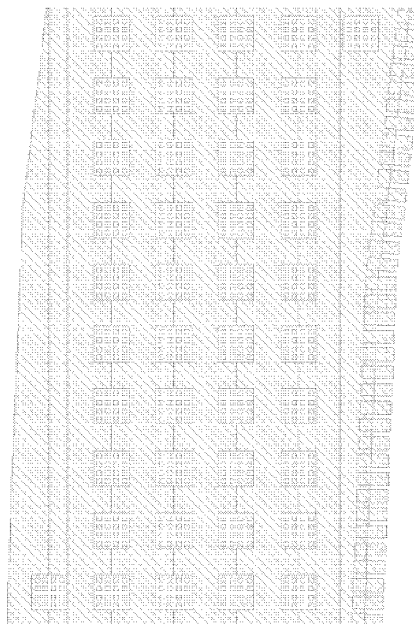
Figure 13B:
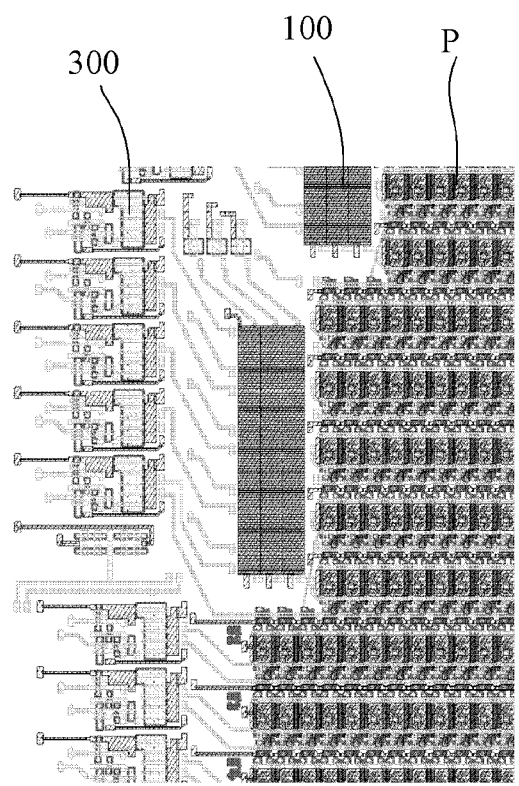
Figure 14:
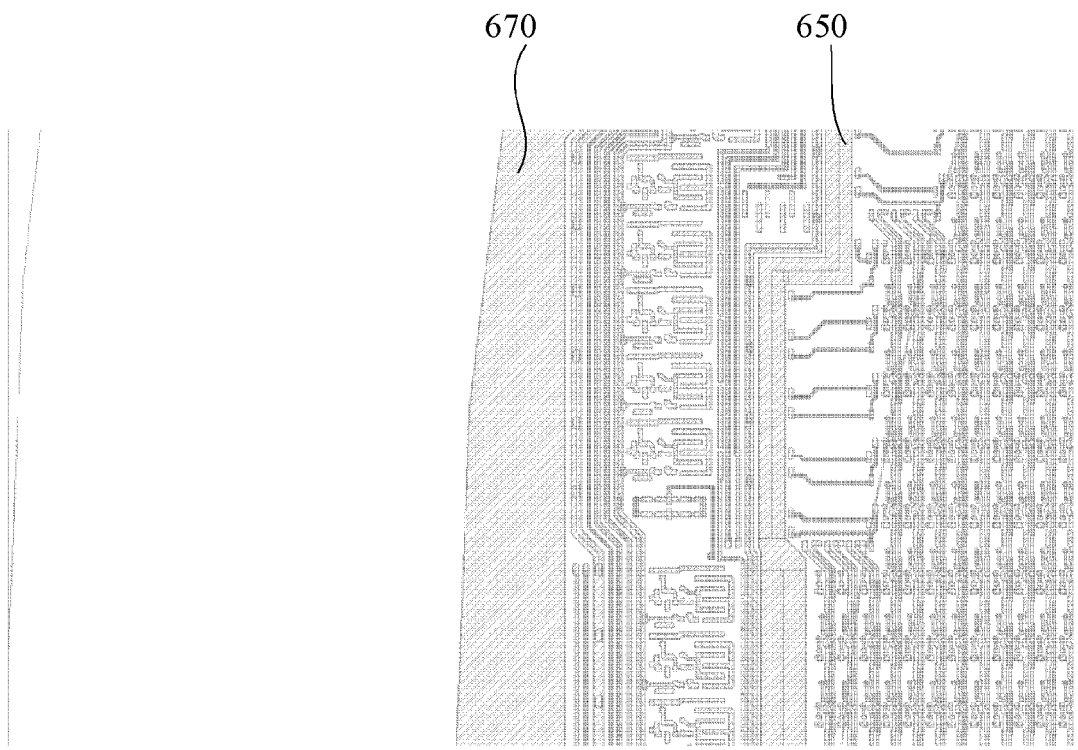
Figure 15:
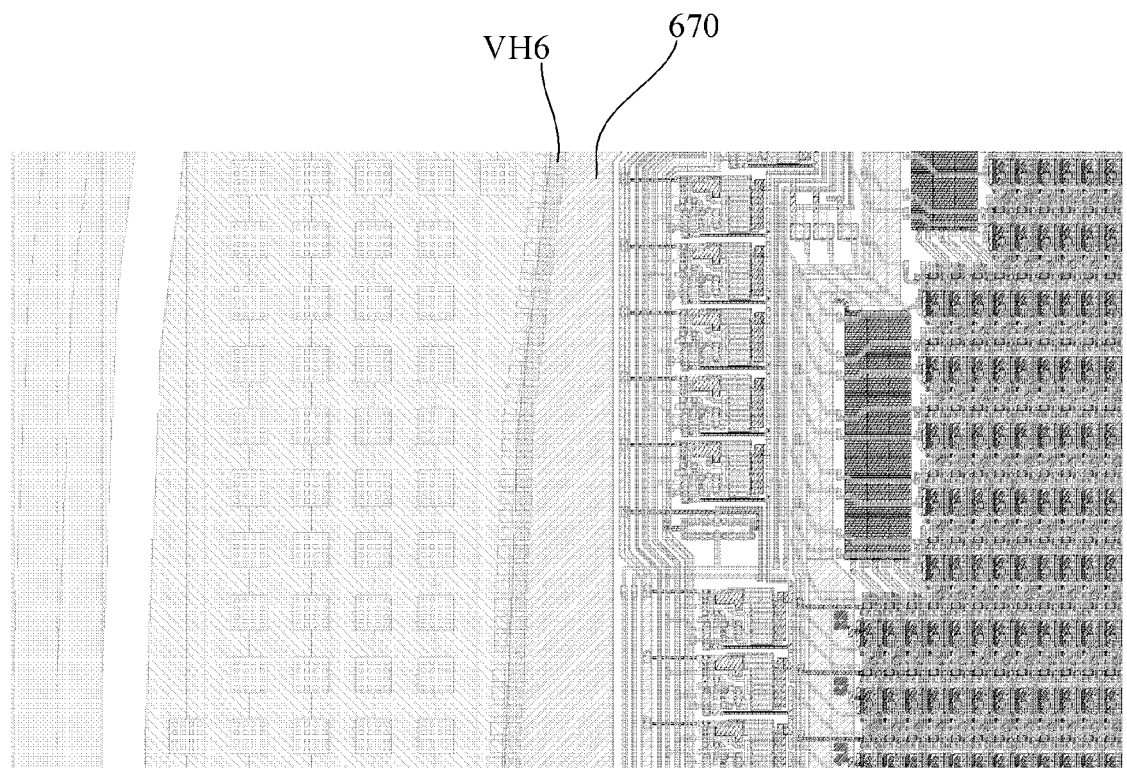
Figure 16:
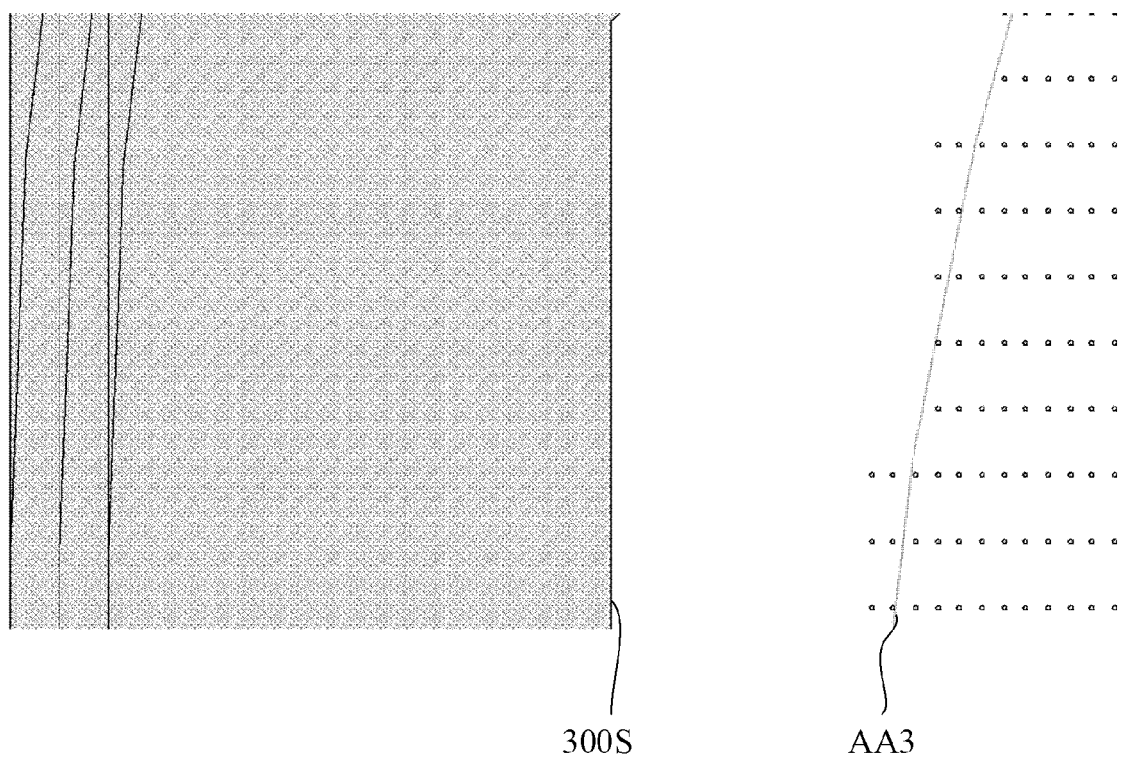
Figure 17:
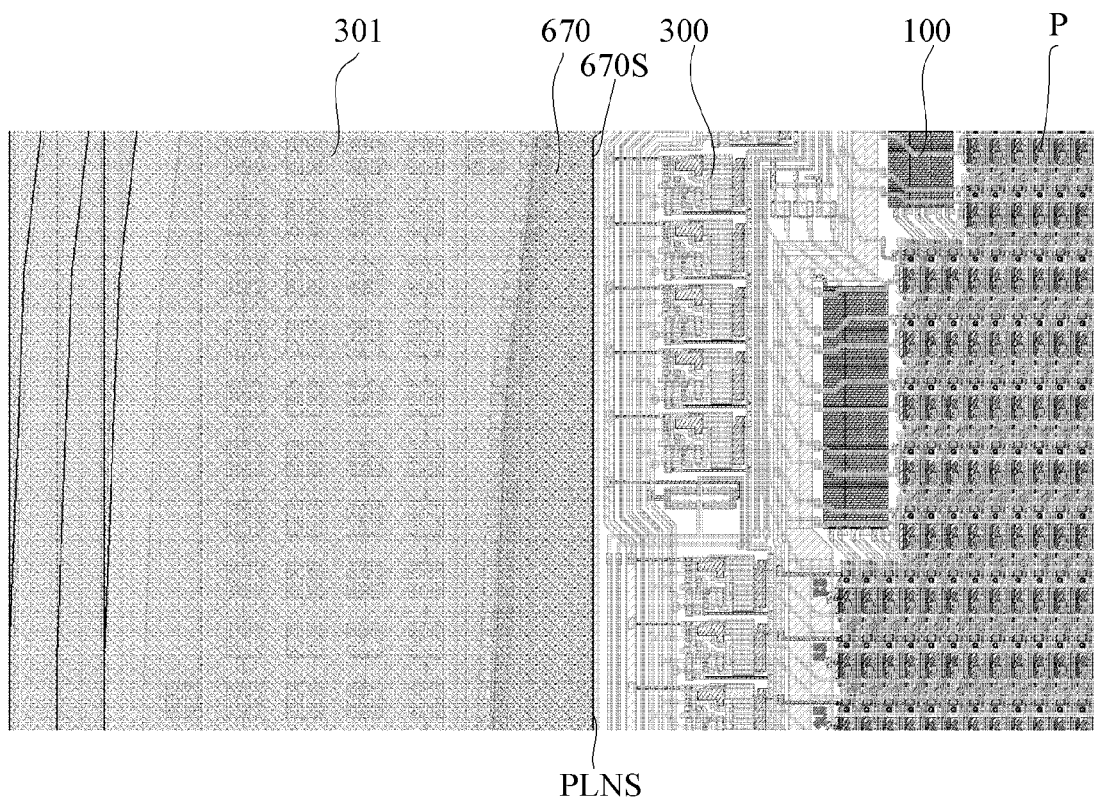
Figure 18:
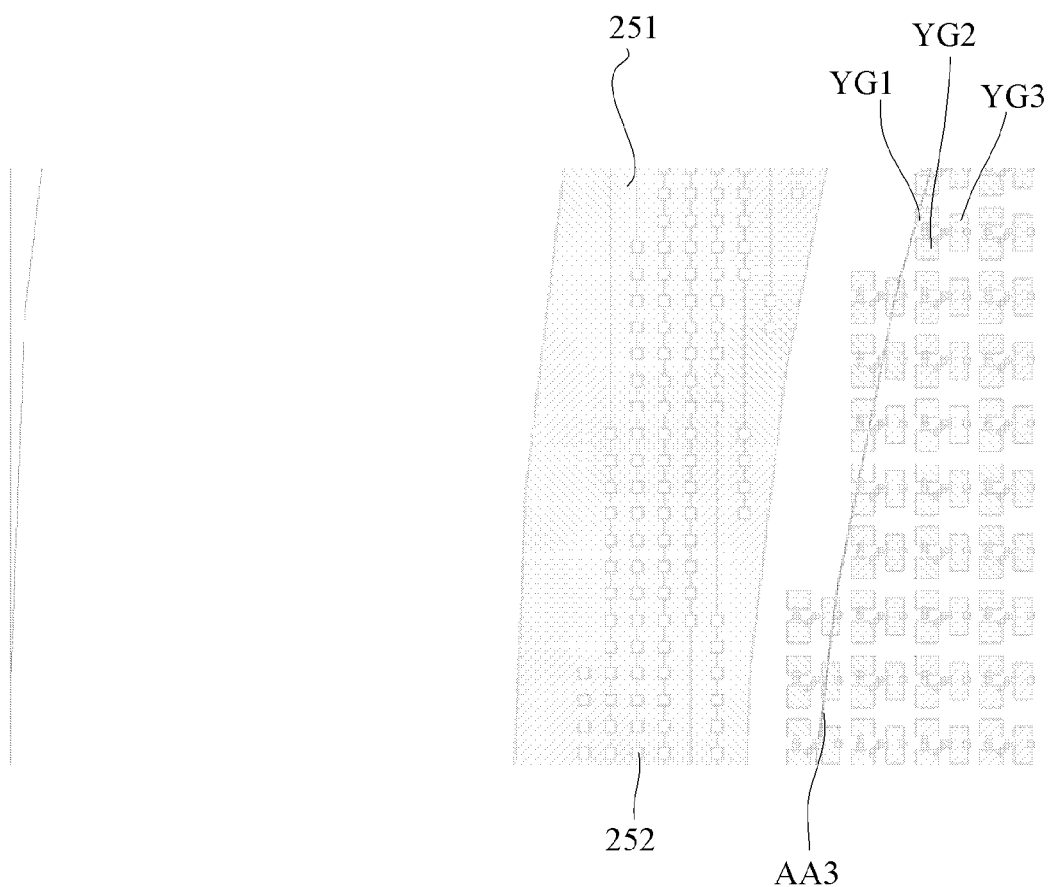
Figure 19:
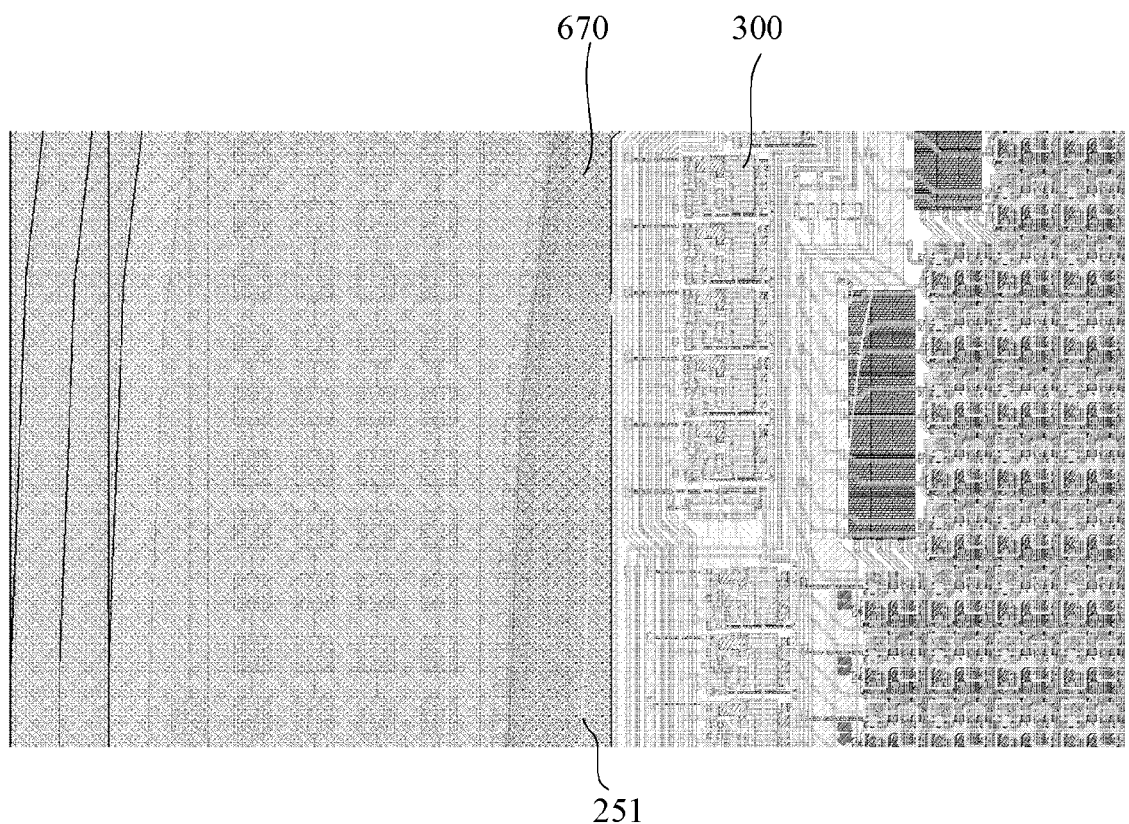
Figure 20:
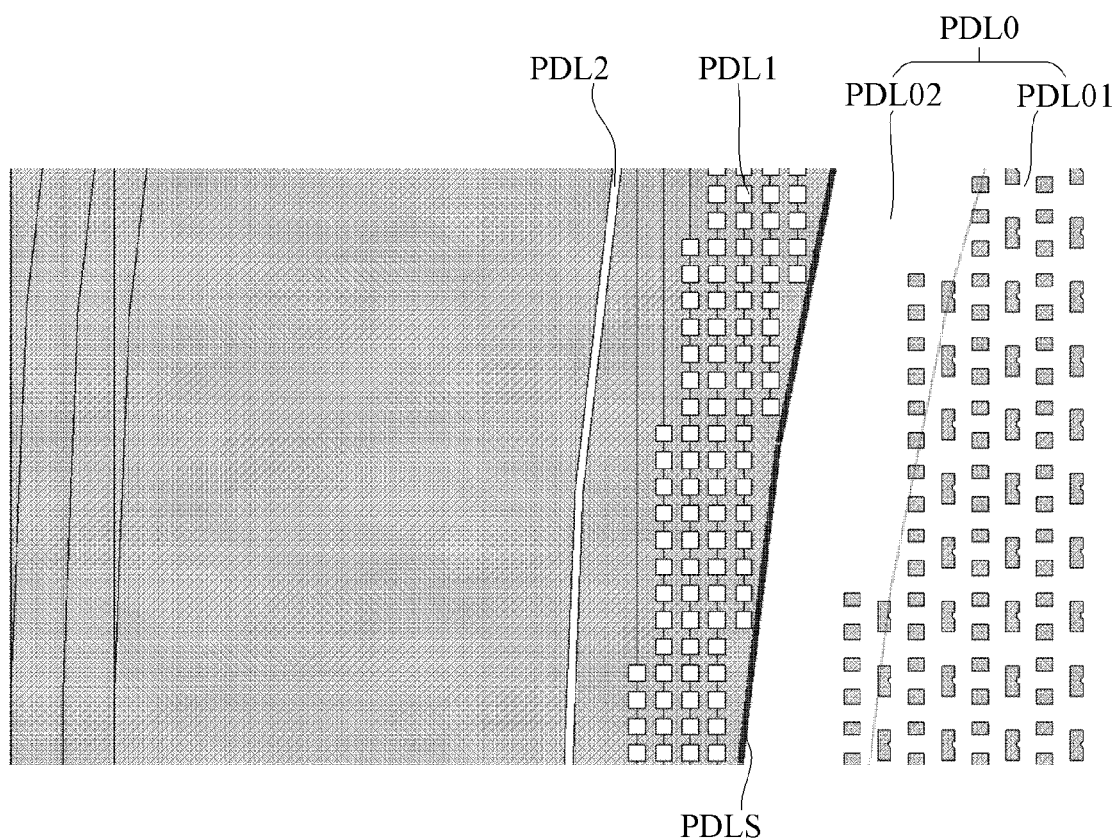
Figure 21:
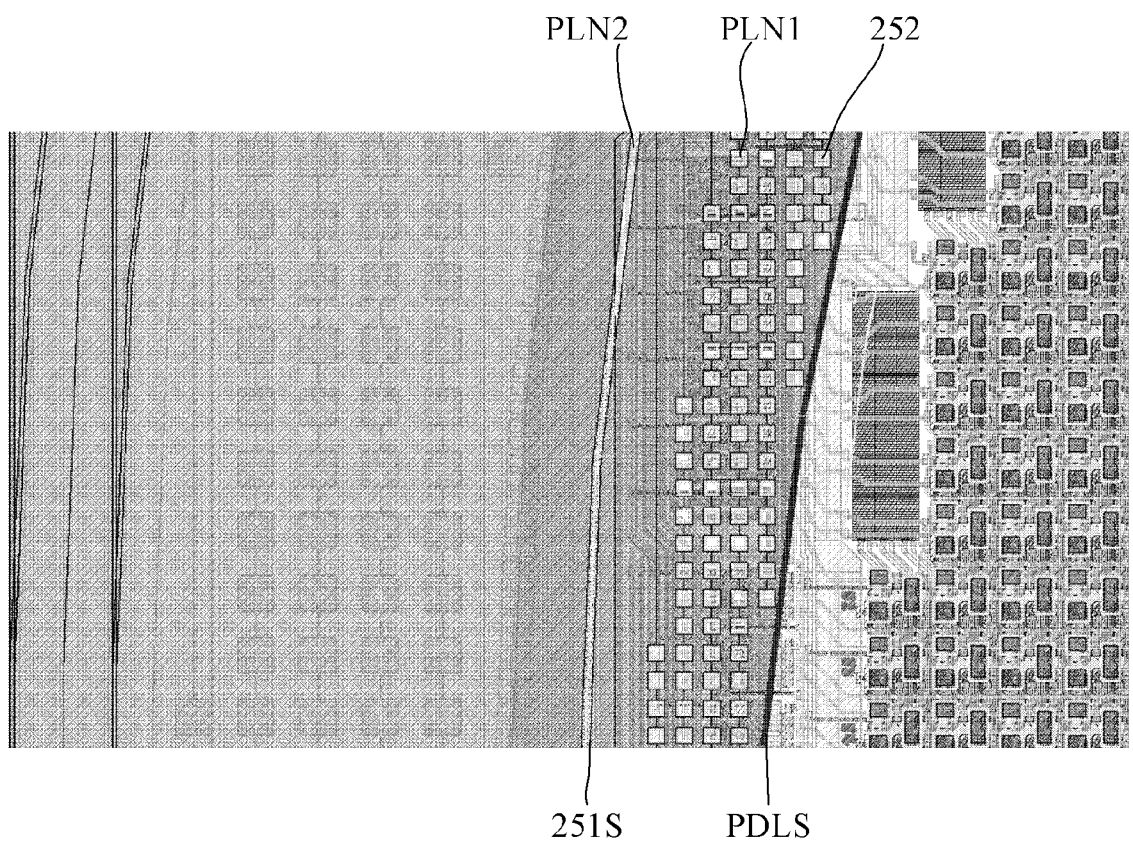
Figure 22:
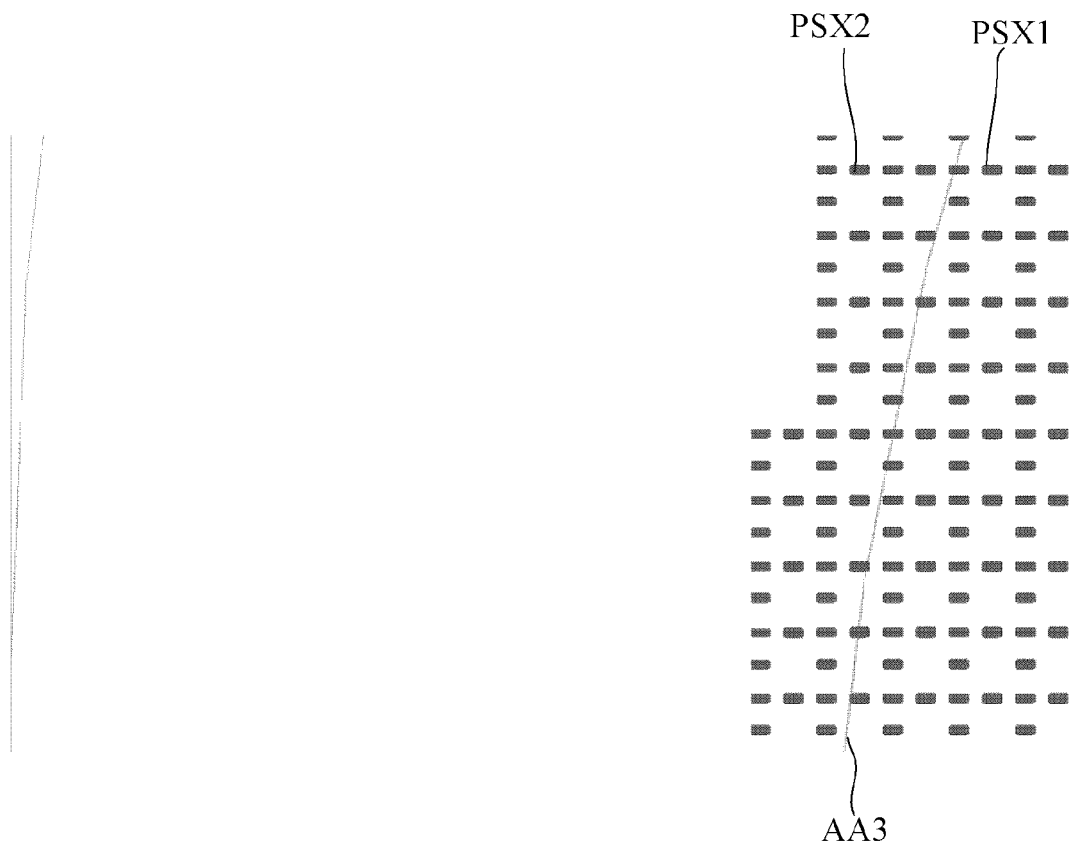
Figure 23:
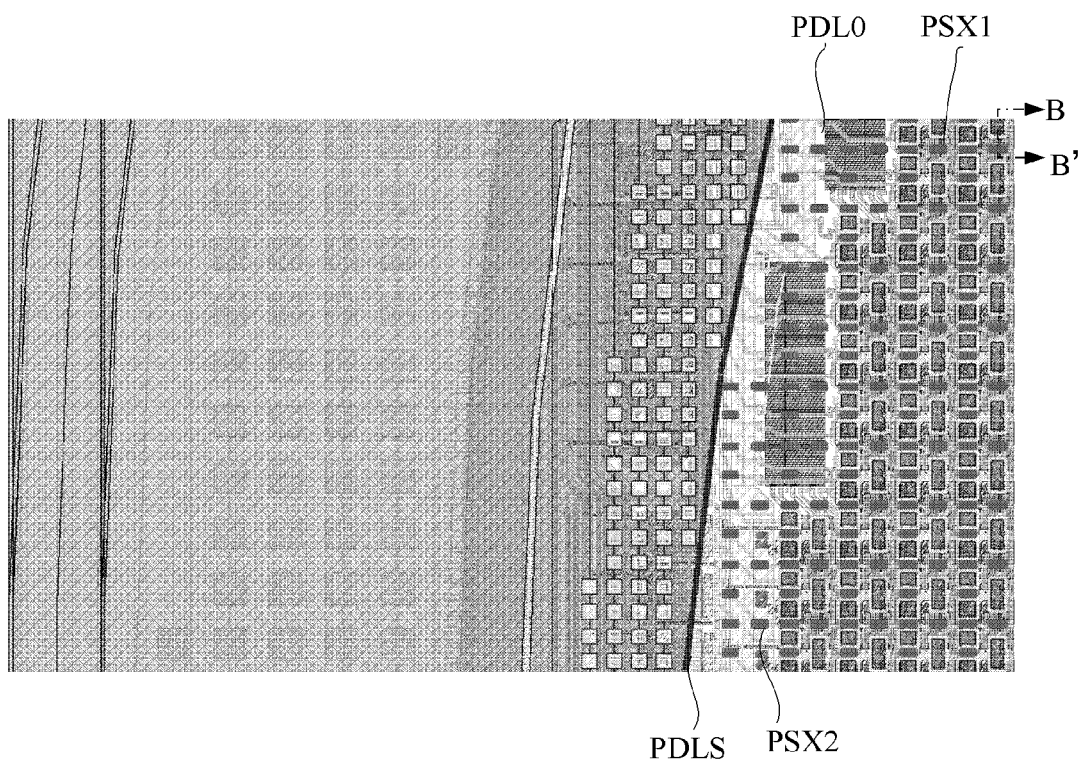

FIG. 8 to FIG. 23 show plan views of some film layers of the exemplary embodiments of part I in FIG. 1, where FIG. 8 schematically shows a semiconductor layer, FIG. 9 schematically shows a first conductive layer, FIG. 10 schematically shows a combination of a semiconductor layer and a first conductive layer, FIG. 11 schematically shows a second conductive layer, FIG. 12 schematically shows a combination of a semiconductor layer, a first conductive layer and a second conductive layer, FIG. 13A schematically shows an interlayer insulating layer, FIG. 13B schematically shows a combination of a semiconductor layer, a first conductive layer, a second conductive layer and an interlayer insulating layer, FIG. 14 schematically shows a third conductive layer, FIG. 15 schematically shows a combination of a semiconductor layer, a first conductive layer, a second conductive layer, an interlayer insulating layer and a third conductive layer, FIG. 16 schematically shows a planarization layer, FIG. 17 schematically shows a combination of a semiconductor layer, a first conductive layer, a second conductive layer, an interlayer insulating layer, a third conductive layer and a planarization layer, FIG. 18 schematically shows a first electrode layer, FIG. 19 schematically shows a combination of a semiconductor layer, a first conductive layer, a second conductive layer, an interlayer insulating layer, a third conductive layer, a planarization layer and a first electrode layer, FIG. 20 schematically shows a pixel defining layer, FIG. 21 schematically shows a combination of a semiconductor layer, a first conductive layer, a second conductive layer, an interlayer insulating layer, a third conductive layer, a planarization layer, a first electrode layer and a pixel defining layer, FIG. 22 schematically shows a spacer layer, and FIG. 23 schematically shows a combination of a semiconductor layer, a first conductive layer, a second conductive layer, an interlayer insulating layer, a third conductive layer, a planarization layer, a first electrode layer, a pixel defining layer and a spacer layer.

Referring to FIG. 1 to FIG. 8 in combination, as described above, the display panel may include a pixel driving circuit arranged in the display region AA and a scan driving circuit 300 arranged in the non-display region NA. In an example, the pixel driving circuit and the scan driving circuit 300 may include a plurality of thin film transistors and at least one capacitor.

Figure 31:
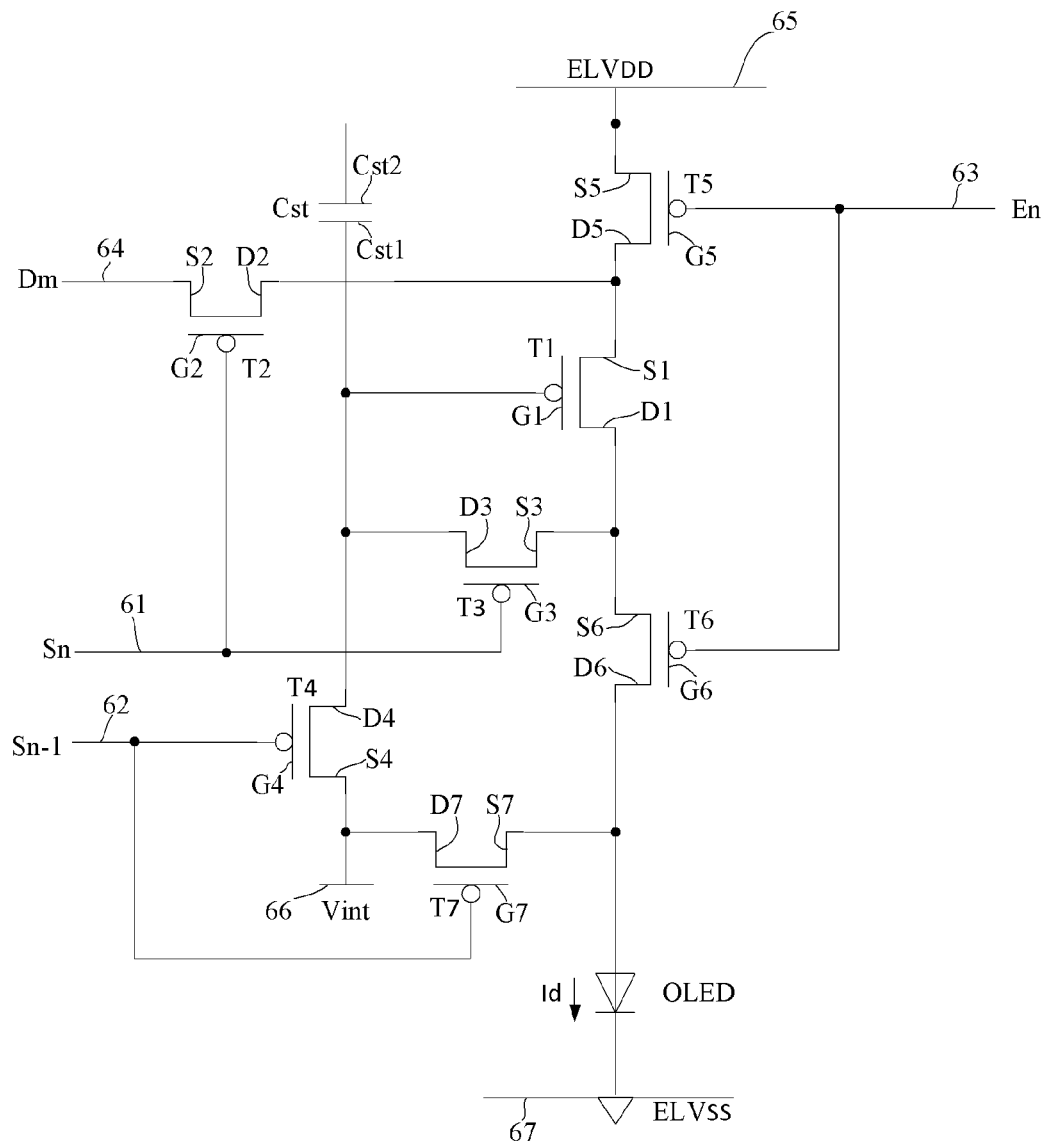
FIG. 31 shows an equivalent circuit diagram of a pixel driving circuit of the display panel according to some exemplary embodiments of the present disclosure.

For example, FIG. 31 shows an equivalent circuit diagram of a pixel driving circuit of the display panel according to some exemplary embodiments of the present disclosure. As shown in FIG. 31, the pixel driving circuit may include a plurality of signal lines 61, 62, 63, 64, 65, 66 and 67, a plurality of thin film transistors T1, T2, T3, T4, T5, T6 and T7, and a storage capacitor Cst. The pixel driving circuit is used to drive an organic light emitting diode (OLED).

The plurality of thin film transistors include a driving thin film transistor T1, a switching thin film transistor T2, a compensation thin film transistor T3, an initialization thin film transistor T4, a first light emitting control thin film transistor T5, a second light emitting control thin film transistor T6, and a bypass thin film transistor T7.

The plurality of signal lines may include: a scan signal line 61 for transmitting a scan signal Sn, a reset control signal line 62 for transmitting a reset control signal Sn−1 to the initialization thin film transistor T4, a light emitting control line 63 for transmitting a light emitting control signal En to the first light emitting control thin film transistor T5 and the second light emitting control thin film transistor T6, a data line 64 for transmitting a data signal Dm, a driving voltage line 65 for transmitting a driving voltage VDD, an initialization voltage line 66 for transmitting an initialization voltage Vint, and a power line 67 for transmitting a first voltage VSS.

Herein, unless otherwise stated, the first voltage may represent a VSS voltage.

The driving thin film transistor T1 has a gate electrode G1 electrically connected to one end Cst1 (hereinafter referred to as a first capacitor electrode) of the storage capacitor Cst, a source electrode S1 electrically connected to the driving voltage line 65 through the first light emitting control thin film transistor T5, and a drain electrode D1 electrically connected to an anode of the OLED through the second light emitting control thin film transistor T6. The driving thin film transistor T1 may receive the data signal Dm according to a switching operation of the switching thin film transistor T2 so as to supply a driving current Id to the OLED.

The switching thin film transistor T2 has a gate electrode G2 electrically connected to the scan signal line 61, a source electrode S2 electrically connected to the data line 64, and a drain electrode D2 electrically connected to the driving voltage line 65 through the first light emitting control thin film transistor T5 and also electrically connected to the source electrode S1 of the driving thin film transistor T1. The switching thin film transistor T2 may be turned on according to the scan signal Sn transmitted through the scan signal line 61, so that the switching operation is performed to transmit the data signal Dm, which is transmitted to the data line 64, to the source electrode S1 of the driving thin film transistor T1.

The compensation thin film transistor T3 has a gate electrode G3 electrically connected to the scan signal line 61, a source electrode S3 electrically connected to the anode of the OLED via the second light emitting control thin film transistor T6 and also electrically connected to the drain electrode D1 of the driving thin film transistor T1, and a drain electrode D3 electrically connected to the end Cst1 (that is, the first capacitor electrode) of the storage capacitor Cst, a drain electrode D4 of the initialization thin film transistor T4 and the gate electrode G1 of the driving thin film transistor T1. The compensation thin film transistor T3 may be turned on according to the scan signal Sn transmitted through the scan signal line 61 so as to electrically connect the gate electrode G1 and the drain electrode D1 of the driving thin film transistor T1, so that a diode connection of the driving thin film transistor T1 is achieved.

The initialization thin film transistor T4 has a gate electrode G4 electrically connected to the reset control signal line 62, a source electrode S4 electrically connected to the initialization voltage line 66, and a drain electrode D4 electrically connected to the end Cst1 of the storage capacitor Cst, the drain electrode D3 of the compensation thin film transistor T3 and the gate electrode G1 of the driving thin film transistor T1. The initialization thin film transistor T4 may be turned on according to the reset control signal Sn−1 transmitted through the reset control signal line 62 so as to transmit an initialization voltage Vint to the gate electrode G1 of the driving thin film transistor T1, so that an initialization operation is performed to initialize a voltage of the gate electrode G1 of the driving thin film transistor T1.

The first light emitting control thin film transistor T5 has a gate electrode G5 electrically connected to the light emitting control line 63, a source electrode S5 electrically connected to the driving voltage line 65, and a drain electrode D5 electrically connected to the source electrode S1 of the driving thin film transistor T1 and the drain electrode D2 of the driving thin film transistor T2.

The second light emitting control thin film transistor T6 has a gate electrode G6 electrically connected to the light emitting control line 63, a source electrode S6 electrically connected to the drain electrode D1 of the driving thin film transistor T1 and also electrically connected to the source electrode S3 of the compensation thin film transistor T3, and a drain electrode D6 electrically connected to the anode of the OLED. The first light emitting control thin film transistor T5 and the second light emitting control thin film transistor T6 may be turned on concurrently (for example, simultaneously) according to the light emitting control signal En transmitted through the light emitting control line 63 so as to transmit the driving voltage VDD to the OLED, thereby allowing the driving current Id to flow into the OLED.

The bypass thin film transistor T7 includes a gate electrode G7 connected to the reset control signal line 62, a source electrode S7 connected to the drain electrode D6 of the second light emitting control thin film transistor T6 and the anode of the OLED, and a drain electrode D7 connected to the initialization voltage line 66. The bypass thin film transistor T7 may transmit the reset control signal Sn−1 from the reset control signal line 62 to the gate electrode G7.

The other end Cst2 (hereinafter referred to as a second capacitor electrode) of the storage capacitor Cst is electrically connected to the driving voltage line 65, and a cathode of the OLED is electrically connected to the power line 67 to receive the first voltage VSS. Accordingly, the OLED may receive the driving current Id from the driving thin film transistor T1 to emit light, so as to display an image.

In the exemplary embodiments of the present disclosure, the GOA circuit may include a light emitting control scan driving circuit, which may be, for example, an EM GOA circuit for transmitting the light emitting control signal En. FIG. 18 schematically shows a circuit diagram of the light emitting control scan driving circuit according to some exemplary embodiments of the present disclosure. The light emitting control scan driving circuit includes a first voltage signal line VGH, a second voltage signal line VGL, a first clock signal line CK, a second clock signal line CB and a signal output line E0. The light emitting control scan driving circuit further includes a plurality of shift register units.

Figure 32:
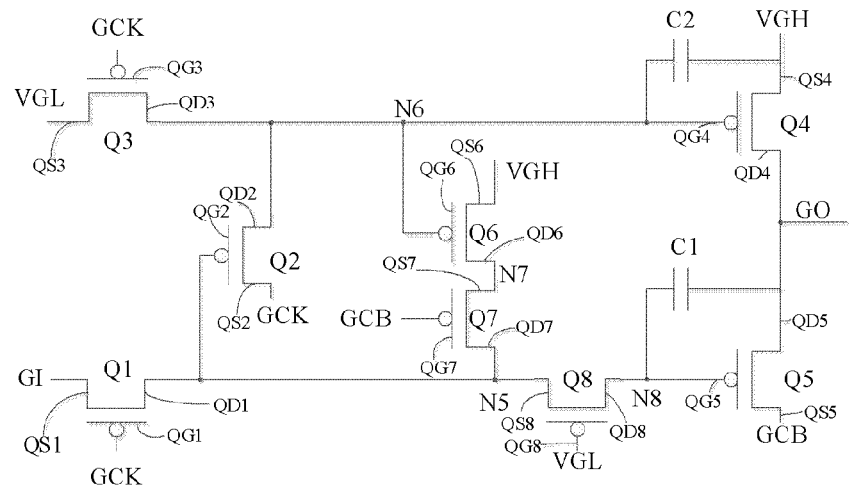
FIG. 32 shows an equivalent circuit diagram of a scan driving circuit of the display panel according to some exemplary embodiments of the present disclosure.

For example, FIG. 32 shows an equivalent circuit diagram of a scan driving circuit of the display panel according to some exemplary embodiments of the present disclosure. For example, the scan driving circuit 300 may include a GATE GOA circuit for transmitting the scan signal Sn and/or the reset control signal Sn−1. For example, GATE GOA circuits may correspond to pixel rows one-to-one, that is, one GATE GOA circuit corresponds to a row of pixels. Then, a signal output by a GATE GOA circuit may serve as a scan signal for a row of pixels corresponding to the GATE GOA circuit, or serve as a reset control signal for a next row of pixels. In other words, the scan signal for a row of pixels comes from the signal output by the GATE GOA circuit corresponding to the row of pixels, and the reset control signal for the row of pixels comes from the signal output from the GATE GOA circuit corresponding to a previous row of pixels. It should be noted that, for the EM GOA circuit, a two-row driving or four-row driving may be adopted, that is, an output signal of an EM GOA circuit may be used to drive two or four rows of pixels.

As shown in FIG. 32, the gate scan driving circuit includes a first voltage signal line VGH, a second voltage signal line VGL, a third clock signal line GCK, a fourth clock signal line GCB and a signal output line GO. The gate scan driving circuit further includes a plurality of shift register units.

As shown in FIG. 32, at least one of the plurality of shift register units may include a first capacitor C1, a second capacitor C2, a first transistor Q1, a second transistor Q2, a third transistor Q3, a fourth transistor Q4, a fifth transistor Q5, a sixth transistor Q6, a seventh transistor Q7, and an eighth transistor Q8.

The first transistor Q1 has a gate electrode QG1 coupled to the clock signal line GCK, a first electrode QS1 coupled to the input signal terminal GI, and a second electrode QD1 coupled to a gate electrode QG2 of the second transistor.

The second transistor Q2 has a first electrode QS2 coupled to the clock signal line GCK, and a second electrode QD2 coupled to a sixth node N6.

The third transistor Q3 has a gate electrode QG3 coupled to the clock signal terminal GCK, a first electrode QS3 coupled to the voltage signal line VGL, and a second electrode QD3 coupled to the sixth node N6.

The fourth transistor Q4 has a gate electrode QG4 coupled to the sixth node N6, a first electrode QS4 coupled to the voltage signal line VGH, and a second electrode QD4 coupled to the signal output line GO.

The fifth transistor Q5 has a gate electrode coupled to an eighth node N8, a first electrode QS5 coupled to the clock signal terminal QCB, and a second electrode QD5 coupled to the signal output line GO.

The sixth transistor Q6 has a gate electrode QG6 coupled to the sixth node N6, a first electrode QS6 coupled to the voltage signal line VGH, and a second electrode QD6 coupled to a seventh node N7.

The seventh transistor Q7 has a gate electrode QG7 coupled to the clock signal terminal GCB, a first electrode QS7 coupled to the seventh node N7, and a second electrode QD7 coupled to a fifth node N5.

The eighth transistor Q8 has a gate electrode QG8 coupled to the voltage signal line VGL, a first electrode QS8 coupled to the fifth node N5, and a second electrode QD8 coupled to the eighth node N8.

The first capacitor C1 has one end coupled to the eighth node N8, and the other end coupled to the second electrode QD5 of the fifth transistor Q5. The second capacitor C2 has one end coupled to the sixth node N6, and the other end coupled to the first electrode QS4 of the fourth transistor Q4.

Figure 33:
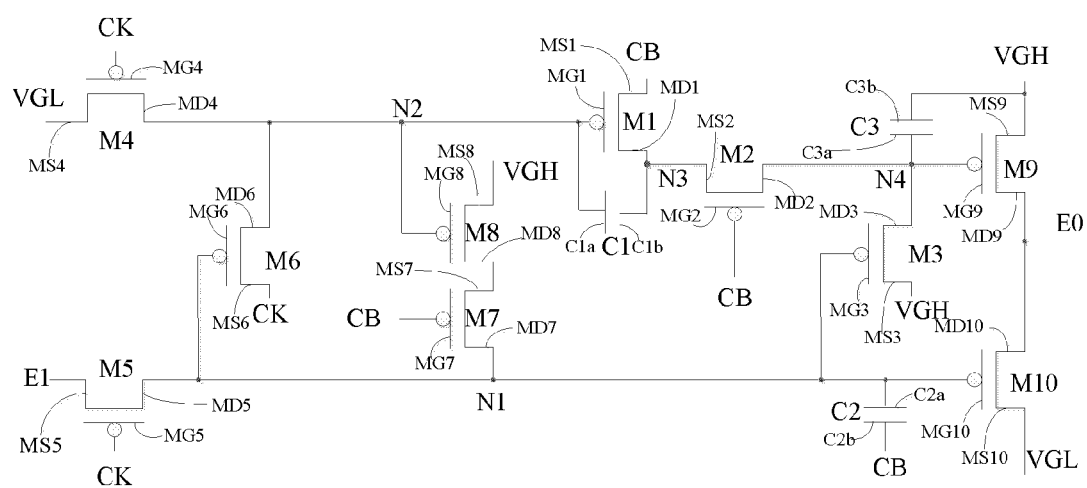
FIG. 33 shows an equivalent circuit diagram of a scan driving circuit of the display panel according to some exemplary embodiments of the present disclosure.

For example, FIG. 33 shows an equivalent circuit diagram of a scan driving circuit of the display panel according to some exemplary embodiments of the present disclosure. For example, the scan driving circuit 300 may include an EM GOA circuit for transmitting the light emitting control signal En. As shown in FIG. 33, the light emitting control scan driving circuit includes a first voltage signal line VGH, a second voltage signal line VGL, a first clock signal line CK, a second clock signal line CB and a signal output line E0. The light emitting control scan driving circuit further includes a plurality of shift register units.

As shown in FIG. 33, at least one of the plurality of shift register units may include a first capacitor C1, an output capacitor C2, an output reset capacitor C3, an output transistor M10, an output reset transistor M9, a first transistor M1, a second transistor M2, a third transistor M3, a fourth transistor M4, a fifth transistor M5, a sixth transistor M6, a seventh transistor M7, and an eighth transistor M8.

The output transistor M10 has a gate electrode MG10 coupled to a first plate C2a of the output capacitor C2, a first electrode MS10 coupled to the second voltage signal line VGL, and a second electrode MD10 coupled to the signal output line E0.

The output reset transistor M9 has a gate electrode MG9 coupled to a first plate C3a of the output reset capacitor C3, a first electrode MS9 coupled to a second plate C3b of the output reset capacitor C3, and a second electrode MD9 coupled to the signal output line E0.

The second plate C3b of the output reset capacitor C3 is coupled to the first voltage signal line VGH, and the output capacitor C2 has a second plate C2b coupled to the second clock signal line CB.

The first transistor M1 has a first electrode MS1 coupled to the second clock signal line CB, a second electrode MD1 coupled to a second plate C1b of the first capacitor C1 (a first electrode MS2 of the second transistor M2 is also coupled to the second plate C1b of the first capacitor C1), and a gate electrode MG1 coupled to a first plate C1a of the first capacitor C1.

The second transistor M2 has a gate electrode MG2 coupled to the second clock signal line CB (a gate electrode MG7 of the seventh transistor M7 is also coupled to the second clock signal line CB), a second electrode MD2 coupled to a second electrode MD3 of the third transistor M3, and a first electrode MS2 coupled to the second plate C1b of the first capacitor.

The third transistor M3 has a gate electrode MG3 coupled to a gate electrode MG10 of the output transistor M10, and a first electrode MS3 coupled to the first voltage signal line VGH.

The fourth transistor M4 has a gate electrode MG4 coupled to the first clock signal line CK (a gate electrode MG5 of the fifth transistor M5 is also coupled to the first clock signal line CK), a first electrode MS4 coupled to the second voltage signal line VGL (a first electrode MS10 of the output transistor M10 is also coupled to the second voltage signal line VGL), and a second electrode MD4 coupled to a second electrode MD6 of the sixth transistor M6.

The fifth transistor M5 has a gate electrode MG5 coupled to the first clock signal line CK, a second electrode MD5 coupled to a gate electrode MG6 of the sixth transistor M6, and a first electrode MS5 coupled to an input signal terminal E1.

The sixth transistor M6 has a first electrode MS6 coupled to the first clock signal line CK (the gate electrode MG4 of the fourth transistor M4 is also coupled to the first clock signal line CK), a second electrode MD6 coupled to the second electrode MD4 of the fourth transistor M4, and a gate electrode MG6 coupled to the second electrode MD5 of the fifth transistor.

The seventh transistor M7 has a gate electrode MG7 coupled to the second clock signal line CB (the second plate C2b of the output capacitor C2 is also coupled to the second clock signal line CB), a first electrode MS7 coupled to a second electrode MD8 of the eighth transistor M8, and a second electrode MD7 coupled to the gate electrode MG6 of the sixth transistor M6.

The eighth transistor M8 has a gate electrode MG8 coupled to the gate electrode MG1 of the first transistor M1, and a first electrode MS8 coupled to the first voltage signal line VGH.

In FIG. 33, the first node is denoted by N1, the second node is denoted by N2, the third node is denoted by N3, and the fourth node is denoted by N4.

In the embodiments shown in FIG. 33, the first voltage signal line VGH may provide a high voltage VGH, and the second voltage signal line VGL may provide a low voltage VGL, but it is not limited to this.

In the embodiments of the present disclosure, the first electrode of the transistor may be a source electrode, and the second electrode of the transistor may be a drain electrode; or the first electrode of the transistor may be a drain electrode, and the second electrode of the transistor may be a source electrode.

It should be noted that, as shown in FIG. 31 to FIG. 33, each transistor has a single-gate structure, but the embodiments of the present disclosure are not limited thereto, and at least some of the transistors may have a double-gate structure. In FIG. 31 to FIG. 33, each transistor is a P-channel field effect transistor, but the embodiments of the present disclosure are not limited thereto, and at least some of the transistors may be N-channel field effect transistors.

In the above description, a circuit structure such as a 7T1C pixel driving circuit is illustrated by way of example in describing a structure of the pixel driving circuit of each sub-pixel located in the display region AA and a structure of the scan driving circuit in the non-display region in detail. However, the embodiments of the present disclosure are not limited to the above-mentioned circuit structures, and other known circuit structures may be applied to the embodiments of the present disclosure without conflict.

Referring back to FIG. 8, a semiconductor layer 20 is schematically shown. For example, active layers of the transistors described above may be formed in the semiconductor layer 20 shown in FIG. 8. The semiconductor layer 20 may have a curved or bent shape, and may include active layers corresponding to various transistors. For example, the semiconductor layer 20 may be formed of a semiconductor material such as low-temperature polysilicon, and may have a film layer thickness in a range of 400 angstroms to 800 angstroms, such as 500 angstroms. The active layer may include, for example, polysilicon, and may include, for example, a channel region, a source region and a drain region. The channel region may not be doped or may be doped to have a doping type different from that of the source region and the drain region, and therefore has a semiconductor characteristic. The source region and the drain region are respectively located on both sides of the channel region, and are doped with impurities, and therefore have conductivity. The impurities may vary depending on whether the TFT is an N-type transistor or a P-type transistor.

Referring to FIG. 9, a first conductive layer 21 is schematically shown. For example, the gate electrode of the transistor, one electrode of the capacitor, and at least some signal lines described above may be located in the first conductive layer 21. For example, the first conductive layer 21 may be formed of a conductive material that forms the gate electrode of the transistor and that may be Mo, for example. The first conductive layer 21 may have a film layer thickness in a range of 2000 angstroms to 4000 angstroms, such as 3000 angstroms.

In an example, referring to FIG. 9 and FIG. 10, in the display region AA, the scan signal line 61, the reset signal line 62 and the light emitting control line 63 are located in the first conductive layer 21. The gate electrodes G1 to G7 of the transistors described above are also located in the first conductive layer 21. For example, overlapping parts of the reset signal line 62 and the semiconductor layer 20 respectively form the gate electrode G1 of the first transistor T1 and the gate electrode G7 of the seventh transistor T7, overlapping parts of the scan signal line 61 and the semiconductor layer 20 respectively form the gate electrode G2 of the second transistor T2 and the gate electrode G4 of the fourth transistor T4, and overlapping parts of the light emitting control line 63 and the semiconductor layer 20 respectively form the gate electrode G6 of the sixth transistor T6 and the gate electrode G5 of the fifth transistor T5.

In an example, referring to FIG. 9 to FIG. 12, in the peripheral region NA, a load compensation unit 100 may include a plurality of compensation capacitors, for example, three compensation capacitors. The plurality of compensation capacitors may include a first compensation capacitor, a second compensation capacitor, and a third compensation capacitor. In a group of the load compensation unit 100 and a corresponding column of pixel units P, the first compensation capacitor may be used to compensate a column of first sub-pixels SP1, the second compensation capacitor may be used to compensate a column of second sub-pixels SP2, and the third compensation capacitor may be used to compensate a column of third sub-pixels SP3. For example, each compensation capacitor may include a first compensation capacitor electrode 101 and a second compensation capacitor electrode 102, and the first compensation capacitor electrode 101 is located in the first conductive layer 21. As shown in FIG. 9, in the load compensation unit, the first compensation capacitor electrodes 101 of the plurality of compensation capacitors are spaced apart from each other, that is, a gap is provided between any two adjacent first compensation capacitor electrodes 101. For example, in the illustrated embodiment, each of the first compensation capacitor electrodes 101 may extend in the second direction Y, and a plurality of first compensation capacitor electrodes 101 in a load compensation unit 100 may be arranged at intervals in the first direction X.

In an example, referring to FIG. 9 and FIG. 10, in the peripheral region NA, the gate electrode of the transistor, one electrode of the capacitor and at least some signal lines included in the scan driving circuit 300 may be located in the first conductive layer 21.

In an example, referring to FIG. 9 and FIG. 10, in the peripheral region NA, the display panel may include a support portion 301 for carrying an encapsulation structure 30. The support portion 301 is located in the first conductive layer 21. The support portion 301 is located on a side of a region where the scan driving circuit 300 is located away from the display region AA. An orthographic projection of the support portion 301 on the base substrate does not overlap an orthographic projection of the semiconductor layer 20 on the base substrate.

For example, the support portion 301 may include a support body portion 302, a plurality of apertures or grooves 303, and a plurality of conductive portions 304. In the first conductive layer 21, the support portion 301 and the scan driving circuit 300 are spaced apart from each other. The encapsulation structure 30 such as Frit may be formed in the support portion 301, so that the support portion 301 may be used to support the encapsulation structure 30. For example, the plurality of apertures or grooves 303 may be formed in the support body portion 302, so that when forming the encapsulation structure 30 such as Frit, at least part of the encapsulation structure 30 may be embedded into the plurality of apertures or grooves 303 to enhance a bonding force between the encapsulation structure 30 and the support portion 301. For example, in the illustrated embodiments, an orthographic projection of each aperture or groove 303 on the base substrate has a shape of a rectangle or a square. It should be noted that the embodiments of the present disclosure are not limited thereto, and the orthographic projection of each aperture or groove 303 on the base substrate may have other shapes.

The plurality of conductive portions 304 are located on a side of the support body portion 302 close to the scan driving circuit 300, and the plurality of conductive portions 304 are electrically connected to a signal line for transmitting an electrical signal, so as to receive the electrical signal. In this way, the support portion may be prevented from being in a floating state.

Referring to FIG. 11, a second conductive layer 22 is schematically shown. For example, the other electrode of the capacitor and at least some signal lines may be located in the second conductive layer 22. For example, the second conductive layer 22 may be formed of a conductive material that forms the gate electrode of the transistor and that may be Mo, for example. The second conductive layer 22 may have a film layer thickness in a range of 2000 angstroms to 4000 angstroms, such as 3000 angstroms.

In an example, referring to FIG. 11 and FIG. 12, in the display region AA, the initialization voltage line 66 and the other electrode of the storage capacitor may be located in the second conductive layer 22.

In an example, referring to FIG. 11 and FIG. 12, in the peripheral region NA, the second compensation capacitor electrode 102 of the load compensation unit may be located in the second conductive layer 22. For example, the first compensation capacitor electrode 101 and the second compensation capacitor electrode 102 may be arranged opposite to each other, their orthographic projections on the base substrate at least partially overlap each other, and a dielectric layer is provided therebetween. For example, the first compensation capacitor electrode 101 may be electrically connected to receive the data signal, and the second compensation capacitor electrode 102 may be electrically connected to receive the driving voltage, that is, the two receive different voltage signals. In this way, an overlapping part of the first compensation capacitor electrode 101 and the second compensation capacitor electrode 102 may form the compensation capacitor.

In some exemplary embodiments of the present disclosure, in a load compensation unit, the second compensation capacitor electrodes 102 of the plurality of compensation capacitors are connected to each other. In other words, the plurality of second compensation capacitor electrodes 102 of the load compensation unit are formed as a continuously extending integral structure.

For example, in a load compensation unit 100, an orthographic projection of the first compensation capacitor electrodes 101 of the plurality of compensation capacitors on the base substrate falls within an orthographic projection of the plurality of second compensation capacitor electrodes 102 connected to each other on the base substrate. In this way, it is beneficial to increase an overlapping area between the first compensation capacitor electrode and the second compensation capacitor electrode, which may help increase a capacitance value of the compensation capacitor.

It should be noted that, in the embodiments of the present disclosure, the second compensation capacitor electrodes 102 of the plurality of load compensation units adjacent to each other may be connected to each other. In other words, the plurality of second compensation capacitor electrodes 102 of the plurality of load compensation units may be formed as a continuously extending integral structure.

In an example, referring to FIG. 11 and FIG. 12, in the peripheral region NA, the other electrode of the capacitor and at least some signal lines included in the scan driving circuit 300 may be located in the second conductive layer 22.

In an example, referring to FIG. 11 and FIG. 12, in the peripheral region NA, the orthographic projection of the support portion 301 on the base substrate does not overlap the orthographic projection of the second conductive layer 22 on the base substrate.

FIG. 13A schematically shows an interlayer insulating layer. FIG. 13B schematically shows a combination of the semiconductor layer 20, the first conductive layer 21, the second conductive layer 22 and the interlayer insulating layer 23. As shown in FIG. 13A and FIG. 13B, the interlayer insulating layer 23 covers most of the display region AA and the peripheral region NA. For example, the interlayer insulating layer 23 may cover most of the display region AA, and the interlayer insulating layer 23 may cover most of the peripheral region NA.

For example, herein, the expression "most" may mean 50% or more.

For example, the display panel may include a plurality of via hole portions VH4, a plurality of via hole portions VH5, a plurality of via hole portions VH6, and a plurality of via hole portions VH7. The plurality of via hole portions VH4 may be located in the display region AA. For example, the plurality of via hole portions VH4 may be respectively located in the plurality of sub-pixels to expose a part of the pixel driving circuits of various sub-pixels. The plurality of via hole portions VH5 may be located in a region where the scan driving circuit 300 is located. For example, the plurality of via hole portions VH5 may expose a part of the various scan driving circuits 300. The plurality of via hole portions VH6 may be located in a region where the support portion 301 is located. For example, the plurality of via hole portions VH6 may expose at least part of the plurality of conductive portions 304. In this way, when the conductive layer is subsequently formed, the corresponding conductive layer may be electrically connected to the exposed parts of the pixel driving circuits, the scan driving circuits and the conductive portions respectively through the plurality of via hole portions VH4, the plurality of via hole portions VH5 and the plurality of via hole portions VH6.

The plurality of via hole portions VH7 may be located in a region where the support portion 301 is located. For example, the plurality of via hole portions VH7 may be respectively located in the plurality of apertures or grooves 303. In this way, when forming the encapsulation structure 30 such as Frit, at least part of the encapsulation structure 30 may be embedded into the plurality of apertures or grooves 303 through the plurality of via hole portions VH7, so as to enhance a bonding force between the encapsulation structure 30 and the support portion 301.

Referring to FIG. 14 and FIG. 15, a third conductive layer 24 is schematically shown. For example, the third conductive layer 24 may be formed of a conductive material that forms the source electrode and the drain electrode of the thin film transistor and that may include Ti, Al, etc., for example. The third conductive layer 24 may have a stack formed of Ti/Al/Ti, and have a film layer thickness in a range of 6000 angstroms to 9000 angstroms. For example, in a case that the third conductive layer 24 has the stack formed of Ti/Al/Ti, Ti layer, Al layer and Ti layer of the stack Ti/Al/Ti may have thicknesses of about 500 angstroms, 6000 angstroms and 500 angstroms, respectively.

In an example, in the display region AA, the source and drain electrodes of each transistor included in the pixel driving circuit may be located in the third conductive layer 24, and some signal lines (e.g., the data signal line 64 and the driving voltage line 65) may be located in the third conductive layer 24.

In an example, in the peripheral region NA, the source and drain electrodes of each transistor included in the scan driving circuit 300 may be located in the third conductive layer 24, and some signal lines may be located in the third conductive layer 24.

For example, the display panel may further include a driving voltage lead wire 650 for providing a driving voltage VDD. For example, the driving voltage lead wire 650 may be located between the scan driving circuit 300 and the display region AA. The driving voltage lead wire 650 may be electrically connected to the second compensation capacitor electrode 120 through a plurality of via holes. That is, one end of the second compensation capacitor electrode 120 is electrically connected to the driving voltage lead wire 650, and the other end is electrically connected to the driving voltage line 65. In this way, the driving voltage VDD provided by the driving voltage lead wire 650 may be transmitted to the driving voltage line 65.

For example, the display panel may further include a first voltage lead wire 670 for providing the driving voltage VSS. For example, the first voltage lead wire 670 may be located on a side of the scan driving circuit 300 away from the display region AA.

Referring to FIG. 15, the first voltage lead wire 670 may be electrically connected to the conductive portion 304 located in the first conductive layer 21 through the plurality of via hole portions VH6. That is, the first voltage lead wire 670 may be electrically connected to the support portion 301. Through such an electrical connection manner, the support portion 301 may receive the first voltage VSS to prevent the support portion 301 from being in a floating state.

Referring to FIG. 16 and FIG. 17, a planarization layer PLN is schematically shown. In the display region AA, the planarization layer PLN covers most of the display region AA. For example, the planarization layer PLN may include a plurality of via holes. For example, the anodes of the sub-pixels formed subsequently may be electrically connected to the pixel driving circuits in a lower layer through these via holes. In the peripheral region NA, the planarization layer PLN exposes most of the peripheral region NA. For example, the planarization layer PLN covers a region where the scan driving circuit 300 is located. The region where the scan driving circuit 300 is located includes a boundary line 300S away from the display region AA, and the planarization layer PLN does not cover a region extending from the boundary line 300S toward a direction away from the display region AA. For example, the planarization layer PLN neither covers the first voltage lead wire 670 nor covers the support portion 301. In other words, the planarization layer PLN includes a boundary PLNS away from the display region AA, the first voltage lead wire 670 includes a boundary 670S close to the display region AA, and an orthographic projection of the boundary PLNS on the base substrate 10 is substantially coincident with an orthographic projection of the boundary 670S on the base substrate 10.

Referring to FIG. 18 and FIG. 19, a first electrode layer 25 is schematically shown. In the display region AA, the anodes YG1 to YG3 of the above-mentioned sub-pixels may be located in the first electrode layer 25. In the peripheral region NA, the display panel includes an auxiliary conductive portion 251 located in the first electrode layer 25. For example, the auxiliary conductive portion 251 may be in at least partial contact with the first voltage lead wire 670. As described above, the planarization layer PLN does not cover the first voltage lead wire 670. When forming the first electrode layer 25, an orthographic projection of the auxiliary conductive portion 251 on the base substrate 10 may at least partially overlap an orthographic projection of the first voltage lead wire 670 on the base substrate 10. In this way, a part of the auxiliary conductive portion 251 may be in direct contact with a part of the first voltage lead wire 670, so as to form an electrical connection therebetween. That is, in the embodiments of the present disclosure, the first voltage lead wire 670 located in the third conductive layer 23 and the auxiliary conductive portion 251 located in the first electrode layer 25 are connected in parallel, and they are both used to transmit the first voltage VSS. In this way, a resistance on the signal line transmitting the first voltage VSS may be reduced.

Referring to FIG. 19, the orthographic projection of the auxiliary conductive portion 251 on the base substrate 10 at least partially overlaps the orthographic projection of the scan driving circuit 300 on the base substrate 10. For example, the orthographic projection of the auxiliary conductive portion 251 on the base substrate 10 may substantially completely cover the orthographic projection of the scan driving circuit 300 on the base substrate 10. That is, the auxiliary conductive portion 251 is set wider to help further reduce the resistance on the signal line transmitting the first voltage VSS.

In an example, the auxiliary conductive portion 251 may further include a plurality of apertures 252. The planarization layer PLN is generally made of an organic resin material, and some organic substances that are volatile when heated, such as organic solvents or small molecular materials, exist in the planarization layer PLN. These organic substances are easily volatilized when heated in the subsequent fabrication process of the display panel, which results in outgassing of the planarization layer. By providing the plurality of apertures 252 in the first electrode layer 25, the organic substances in the planarization layer PLN may be volatilized when heated in the subsequent fabrication process of the display panel, so that a bubble agglomeration on a surface of the first electrode layer 25 facing the planarization layer PLN may be avoided. This is beneficial to ensure a process yield of the display panel, so as to ensure a good display effect of the display panel.

Referring to FIG. 20 and FIG. 21, a pixel defining layer PDL is schematically shown. For example, the pixel defining layer PDL may include a pixel defining layer body PDL0, a first covering portion PDL1, and a second covering portion PDL2. Most of the pixel defining layer body PDL0 is located in the display region AA. For example, in the display region AA, the pixel defining layer PDL includes a plurality of openings, such as the openings KK1 to KK3 of the sub-pixels described above. In the peripheral region NA, the pixel defining layer PDL includes a first covering portion PDL1 and a second covering portion PDL2. For example, referring to FIG. 18 and FIG. 19, the auxiliary conductive portion 251 includes an edge 251S away from the display region AA. Referring to FIG. 21, an orthographic projection of the second covering portion PDL2 on the base substrate 10 covers an orthographic projection of the edge 251S on the base substrate 10. For example, the display panel may include a plurality of first covering portion PDL1, and orthographic projections of the plurality of first covering portions PDL1 on the base substrate respectively cover the orthographic projections of the plurality of apertures 252 on the base substrate. By providing the first covering portion PDL1 and the second covering portion PDL2, an edge of the first electrode layer 25 may be covered, so that the first electrode layer 25 may be protected.

In the embodiments of the present disclosure, the pixel defining layer body PDL0 may have a boundary PDLS away from the display region AA. In a region shown in FIG. 21, the boundary PDLS is located on a side of the load compensation unit 100 away from the display region AA. For example, an orthographic projection of a part of the boundary PDLS on the base substrate 10 may be located between the orthographic projection of the scan driving circuit 300 on the base substrate 10 and the orthographic projection of the load compensation unit 100 on the base substrate 10, and an orthographic projection of another part of the boundary PDLS on the base substrate 10 may fall within the orthographic projection of the scan driving circuit 300 on the base substrate 10.

For example, the plurality of sub-pixels located in the display region AA may include an outermost column of sub-pixels, that is, a column of sub-pixels closest to the peripheral region NA. The boundary PDLS is spaced apart from the outermost column of sub-pixels by a certain distance. For example, in the region shown in FIG. 21, a distance between the boundary PDLS and the outermost column of sub-pixels (the leftmost column of sub-pixels shown in FIG. 21) in the first direction X may be a specified value. In other words, the distance is within a specified range.

It should be noted that, in the following description, a relative position of the boundary PDLS in other regions of the display panel will be further described.

Referring to FIG. 22 and FIG. 23, a spacer layer PSL is schematically shown. As described above, the spacer layer PSL may include the first spacer repetitive unit PSX1 located within the display region AA and the second spacer repetitive unit PSX2 located outside the display region AA. For example, one first spacer repetitive unit PSX1 may include at least one first spacer PS11, at least one third spacer PS12, and at least one fifth spacer PS13. For example, one second spacer repetitive unit PSX2 may include at least one second spacer PS21, at least one fourth spacer PS22 and at least one sixth spacer PS23.

Figure 24:
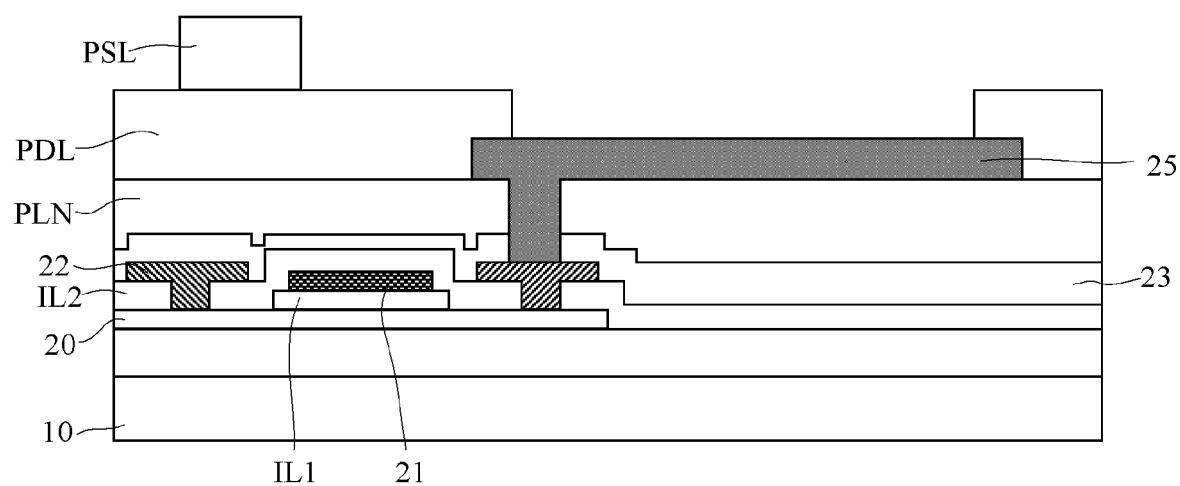
FIG. 24 shows a cross-sectional view of the display panel according to some exemplary embodiments of the present disclosure taken along line BB' in FIG. 23.

FIG. 24 shows a cross-sectional view of the display panel according to some exemplary embodiments of the present disclosure taken along line BB' in FIG. 23. Referring to FIG. 8 to FIG. 24 in combination, the display panel may include: a base substrate 10; a semiconductor layer 20 arranged on the base substrate 10; a first conductive layer 21 arranged on a side of the semiconductor layer 20 away from the base substrate 10; a second conductive layer 22 arranged on a side of the first conductive layer 21 away from the base substrate 10; an interlayer insulating layer 23 arranged on a side of the second conductive layer 22 away from the base substrate 10; a third conductive layer 24 arranged on a side of the interlayer insulating layer 23 away from the base substrate 10; a planarization layer PLN arranged on a side of the third conductive layer 24 away from the base substrate 10; a first electrode layer 25 arranged on a side of the planarization layer PLN away from the base substrate 10; a pixel defining layer PDL arranged on a side of the first electrode layer 25 away from the base substrate 10; and a spacer layer PSL arranged on a side of the pixel defining layer PDL away from the base substrate 10.

It should be noted that the display panel according to the embodiments of the present disclosure is not limited to including the above film layers, and one or more insulating layers may be further provided between the conductive layers. For example, a first insulating layer IL1 may be provided between the semiconductor layer 20 and the first conductive layer 21, and a second insulating layer IL2 may be provided between the first conductive layer 21 and the second conductive layer 22.

As described above, FIG. 8 to FIG. 23 show partial enlarged views of the display panel according to the embodiments of the present disclosure at part I in FIG. 1. For example, in the embodiments of the present disclosure, referring to FIG. 1, part I is a part of the display panel at the first rounded corner portion 10A (that is, the upper left corner), and part II is a part of the display panel at the second rounded corner portion 10B (that is, the upper right corner), part III is a part of the display panel at the fourth rounded corner portion 10D (that is, the lower right corner), part IV is a part of the display panel at the second rounded corner portion 10B (that is, the upper right corner), part V is a part of the display panel near (that is, at an upper edge of) the first boundary AA1, and part VI is a part of the display panel near (that is, at a lower edge of) the second boundary AA2.

Figure 25A:
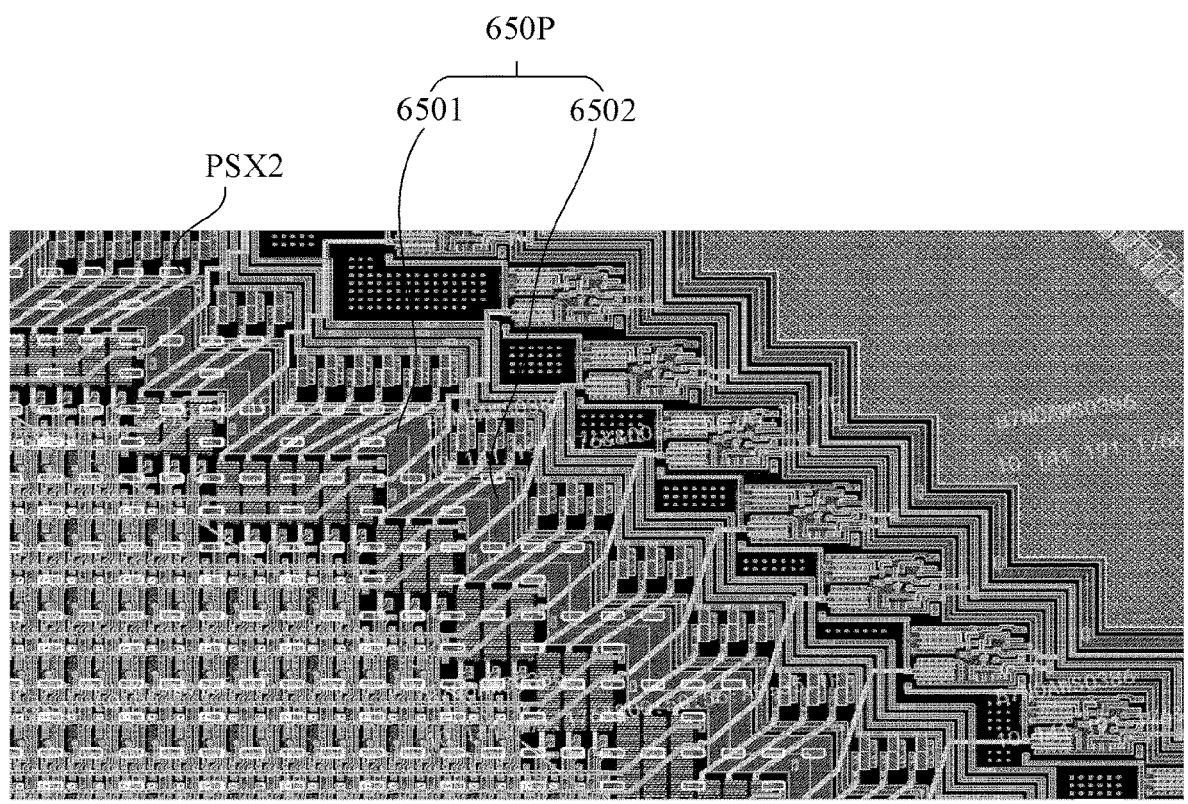
FIG. 25A shows a partial enlarged view of the display panel according to some exemplary embodiments of the present disclosure at part II in FIG. 1.
Figure 25B:
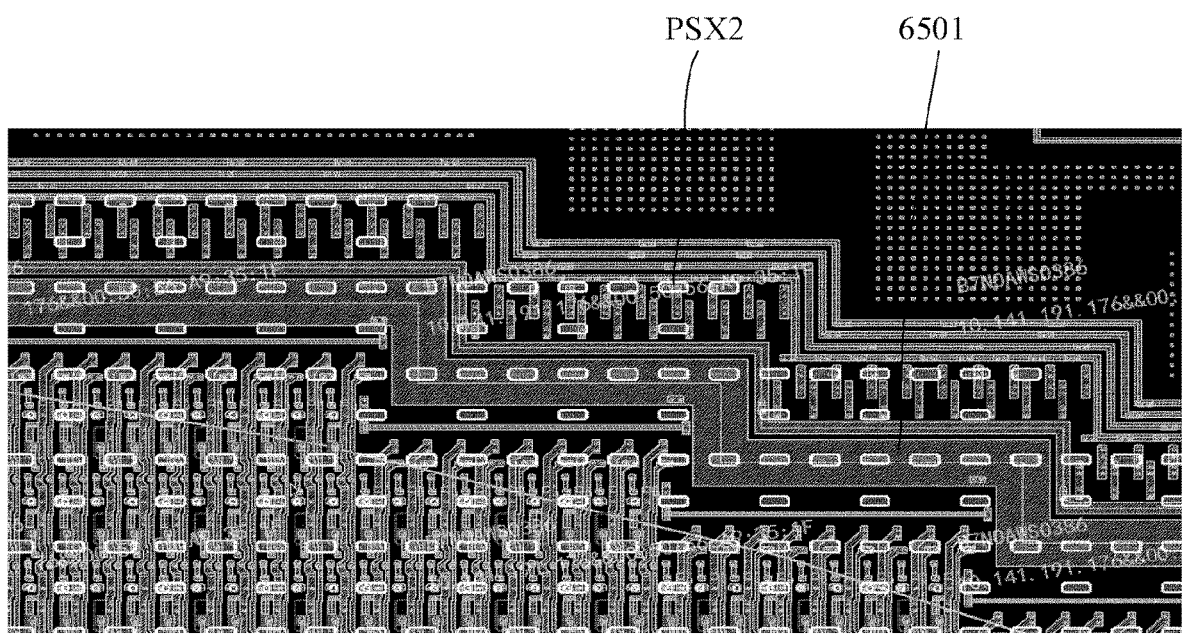
FIG. 25B shows a partial enlarged view of FIG. 25A.
Figure 26:
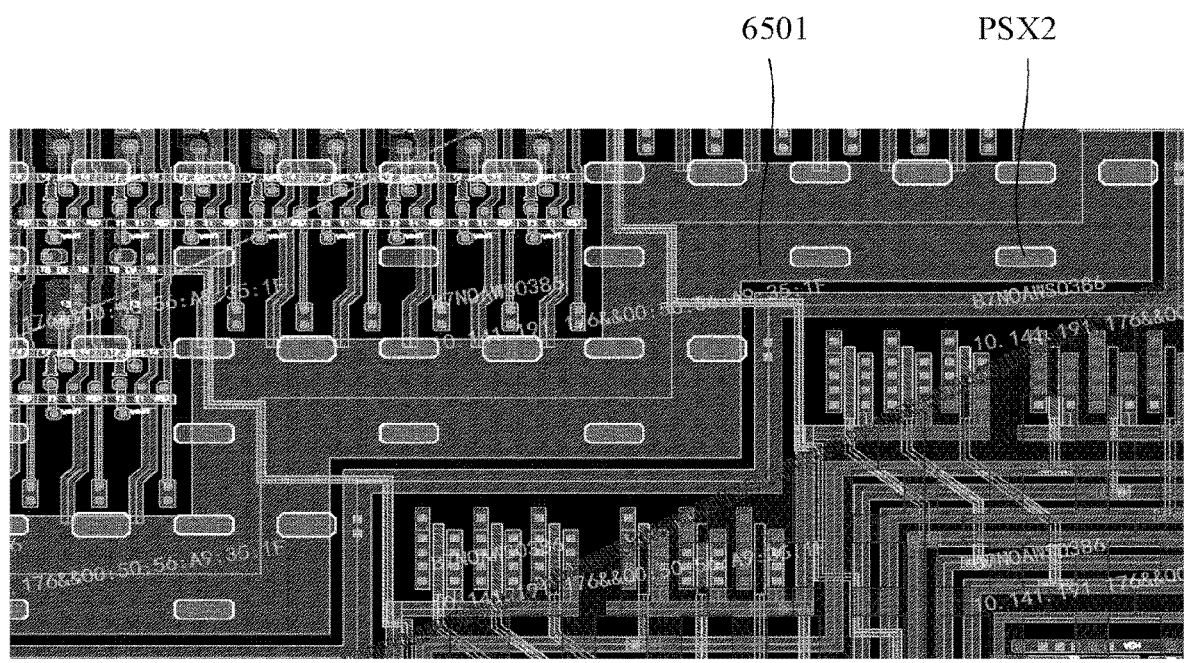
FIG. 26 shows a partial enlarged view of the display panel according to some exemplary embodiments of the disclosure at part III in FIG. 1.
Figure 27:
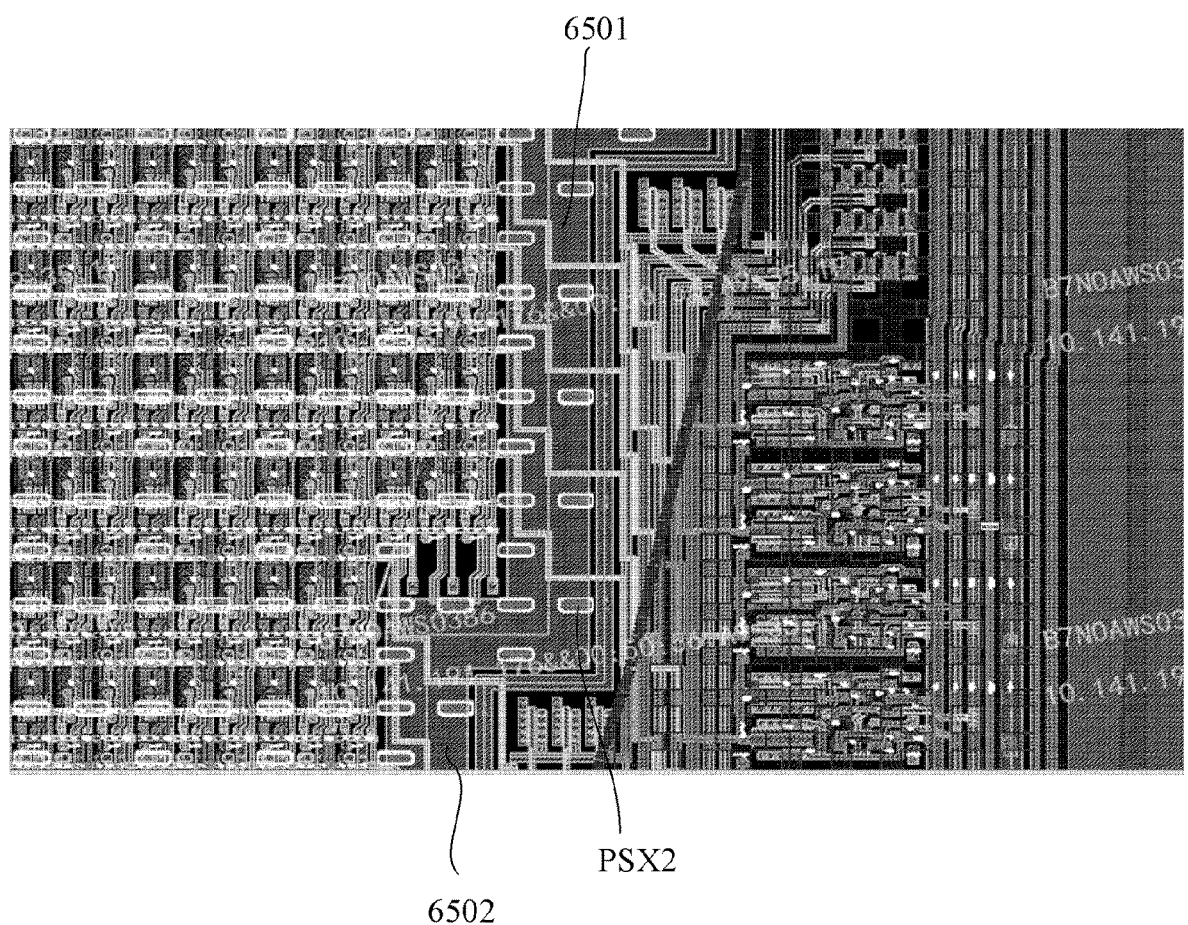
FIG. 27 shows a partial enlarged view of the display panel according to some exemplary embodiments of the present disclosure at part IV in FIG. 1.
Figure 28:
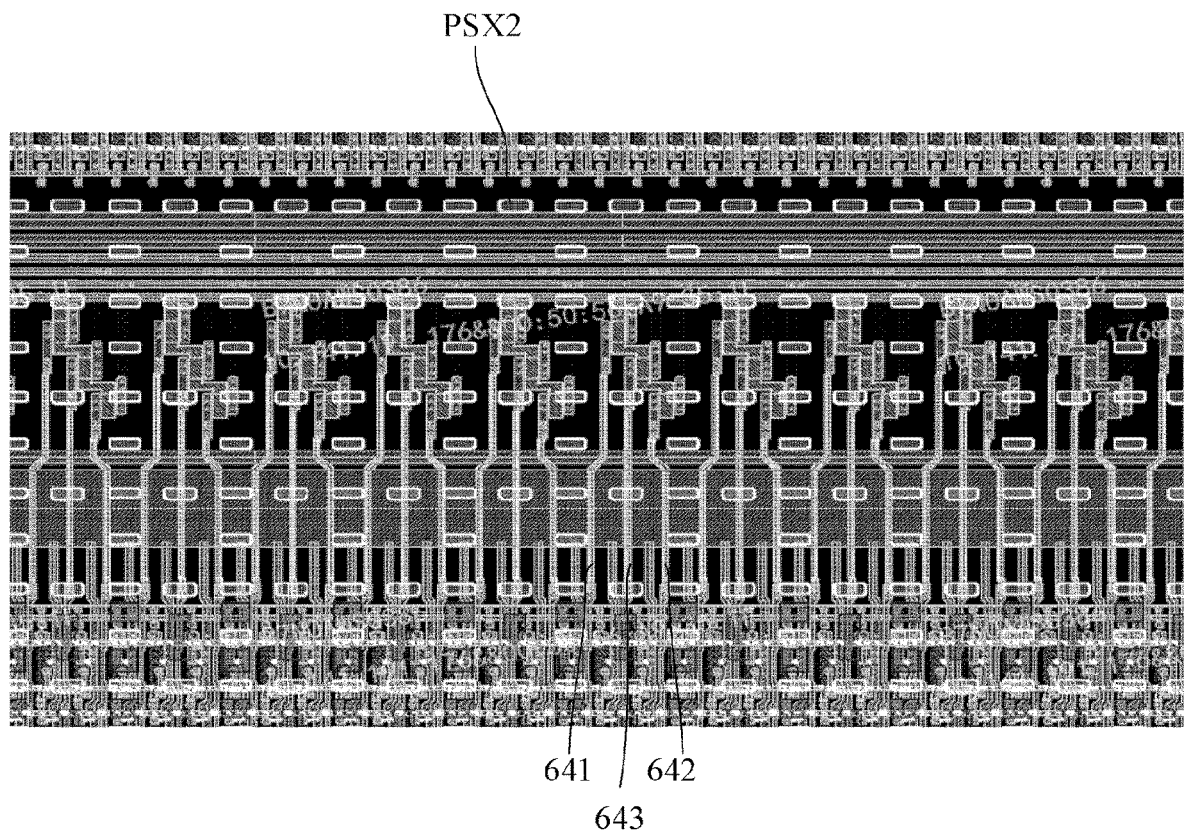
FIG. 28 shows a partial enlarged view of the display panel according to some exemplary embodiments of the present disclosure at part V in FIG. 1.
Figure 29:
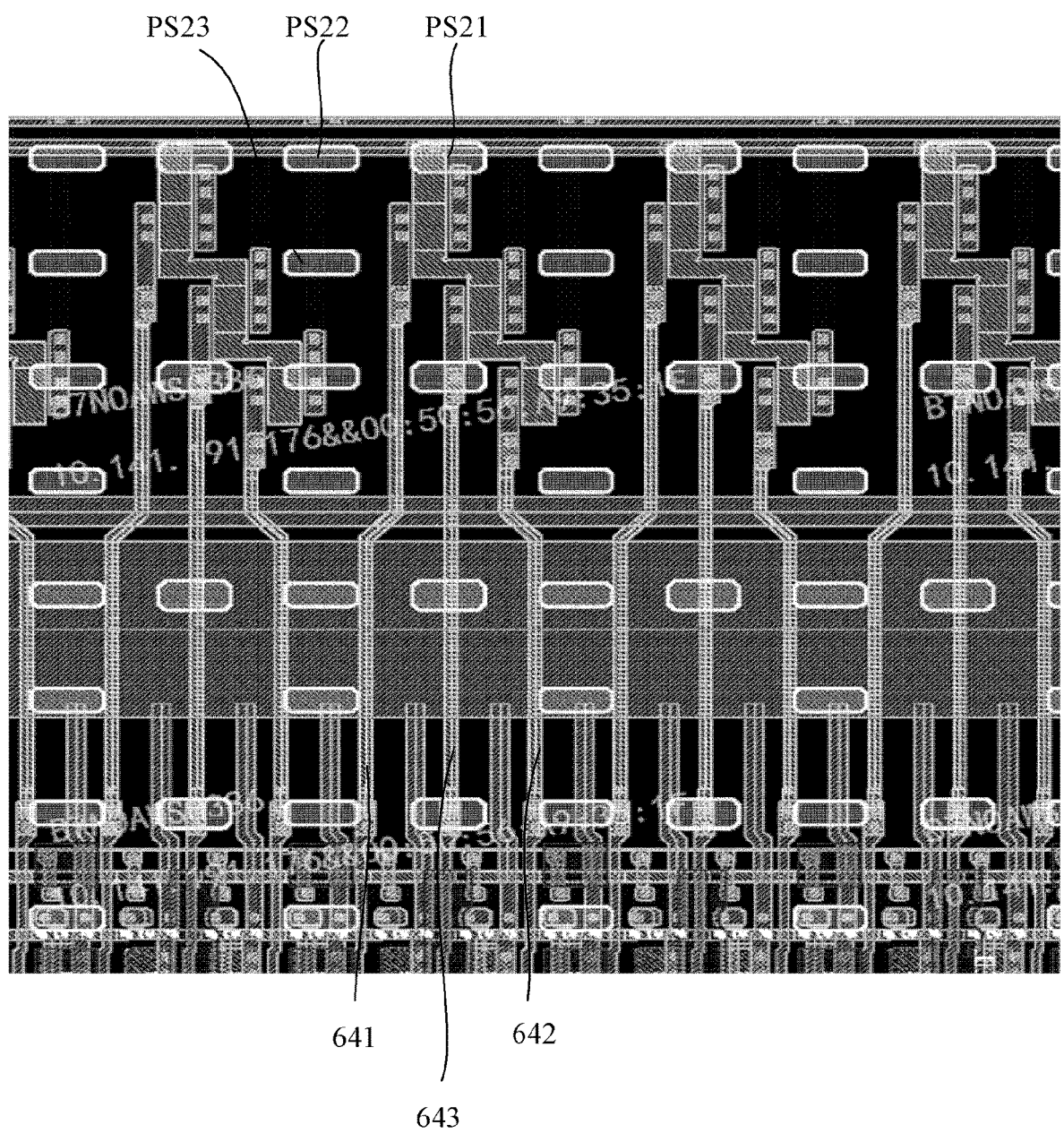
FIG. 29 shows a partial enlarged view of FIG. 28.
Figure 30:
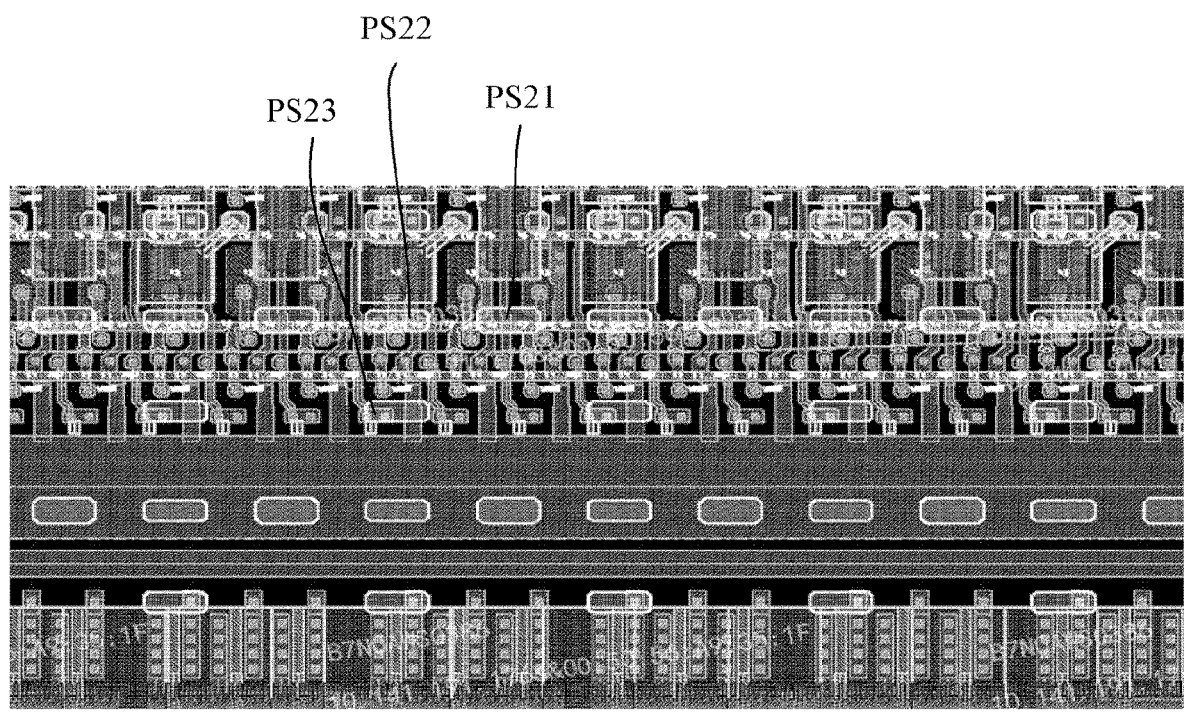
FIG. 30 shows a partial enlarged view of the display panel according to some exemplary embodiments of the present disclosure at part VI in FIG. 1.

FIG. 25A shows a partial enlarged view of the display panel according to some exemplary embodiments of the present disclosure at part II in FIG. 1. FIG. 25B shows a partial enlarged view of FIG. 25A. FIG. 26 shows a partial enlarged view of the display panel according to some exemplary embodiments of the present disclosure at part III in FIG. 1. FIG. 27 shows a partial enlarged view of the display panel according to some exemplary embodiments of the present disclosure at part IV in FIG. 1. FIG. 28 shows a partial enlarged view of the display panel according to some exemplary embodiments of the present disclosure at part V in FIG. 1. FIG. 29 shows a partial enlarged view of FIG. 28. FIG. 30 shows a partial enlarged view of the display panel according to some exemplary embodiments of the present disclosure at part VI in FIG. 1.

Referring to FIG. 23 and FIG. 25A to FIG. 30, the pixel defining layer PDL covers the spacer layer PSL. For example, the pixel defining layer body PDL0 covers the spacer PSL. In other words, the orthographic projection of the pixel defining layer PDL on the base substrate 10 covers the orthographic projection of the spacer layer PSL on the base substrate 10. For example, the orthographic projection of the pixel defining layer body PDL0 on the base substrate 10 covers the orthographic projection of the spacer layer PSL on the base substrate 10.

Referring to FIG. 20 and FIG. 21, the pixel defining layer PDL (specifically, the pixel defining layer body PDL0) includes a first part PDL01 and a second part PDL02 that are formed as an integral structure. The first part PDL01 is located in the display region AA and includes an opening corresponding to the plurality of sub-pixels, and an orthographic projection of the opening on the base substrate falls within the orthographic projection of the first electrode of the plurality of sub-pixels on the base substrate. The second part PDL02 is located in the peripheral region NA.

Referring to FIG. 20 to FIG. 23, the orthographic projection of the first spacer repetitive unit PSX1 on the base substrate falls within the orthographic projection of the first part PDL01 of the pixel defining layer on the base substrate. The orthographic projection of the second spacer repetitive unit PSX2 on the base substrate falls within the orthographic projection of the second part PDL02 of the pixel defining layer on the base substrate, and is located on a side, facing the display region AA, of the boundary PDLS, which is away from the display region AA, of the second part PDL02.

For example, the orthographic projection of the second spacer repetitive unit PSX2 on the base substrate does not overlap the orthographic projection of the first electrode of the plurality of sub-pixels on the base substrate.

Referring to FIG. 23, the plurality of sub-pixels include at least one column of edge sub-pixels closest to the peripheral region NA, e.g., the leftmost column of sub-pixels shown in FIG. 23. At least part of the orthographic projection of the second spacer repetitive unit PSX2 on the base substrate is located on a side of an orthographic projection of the first electrode of the at least one column of edge sub-pixels on the base substrate away from the display region AA.

Referring to FIG. 22, the spacer layer includes a plurality of first spacer repetitive units PSX1 and a plurality of second spacer repetitive units PSX2. The plurality of first spacer repetitive units PSX1 and the plurality of second spacer repetitive units PSX2 are arranged in an array in the first direction X and the second direction Y.

Referring to FIG. 18, FIG. 19 and FIG. 23 in combination, the orthographic projection of the second spacer repetitive unit PSX2 on the base substrate does not overlap the orthographic projection of the first electrode layer 25 on the base substrate.

Referring to FIG. 1, FIG. 25A to FIG. 27 in combination, the base substrate 10 includes at least one corner portion, and the driving voltage lead wire 650 includes a plurality of steps 650P located in the at least one corner portion. An orthographic projection of at least some of the plurality of second spacer repetitive units PSX2 on the base substrate overlaps an orthographic projection of the plurality of steps 650P of the driving voltage lead wire 650 on the base substrate, and the at least some of the second spacer repetitive units PSX2 are distributed in steps.

For example, for the at least some second spacer repetitive units PSX2 that overlap the plurality of steps 650P of the driving voltage lead wire 650, a distribution of the at least some second spacer repetitive units PSX2 is based on an extension rule of the driving voltage lead wire 650 at the plurality of steps 650P. That is, a plurality of steps formed by the at least some second spacer repetitive units PSX2 are respectively located at the plurality of steps 650P of the driving voltage lead wire 650.

For example, referring to FIG. 25A, FIG. 25B and FIG. 26, the plurality of steps 650P include a first step 6501 and a second step 6502. The first step 6501 and the second step 6502 extend in the first direction X, a size of the first step 6501 in the first direction X is greater than a size of the second step 6502 in the first direction X, the number of second spacer repetitive units PSX2 overlapping the first step 6501 and located in the same row is greater than the number of second spacer repetitive units PSX2 overlapping the second step 6502 and located in the same row; and/or, referring to FIG. 25A and FIG. 27, the first step 6501 and the second step 6502 extend in the second direction Y, a size of the first step 6501 in the second direction Y is greater than a size of the second step 6502 in the second direction Y, the number of second spacer repetitive units PSX2 overlapping the first step 6501 and located in the same column is greater than the number of second spacer repetitive units PSX2 overlapping the second step 6502 and located in the same column.

For example, for a plurality of second spacer repetitive units PSX2 located at a non-corner of the base substrate 10, the plurality of second spacer repetitive units PSX2 include a column of second spacer repetitive units farthest from the display region AA in the first direction X and located on a side of the display region AA, and the column of second spacer repetitive units PSX2 are arranged along a straight line parallel to the second direction Y; and/or, referring to FIG. 28 to FIG. 30, for a plurality of second spacer repetitive units PSX2 located at a non-corner of the base substrate 10, the plurality of second spacer repetitive units PSX2 include a row of second spacer repetitive units PSX2 farthest from the display region AA in the second direction Y and located on a side of the display region AA, and the row of second spacer repetitive units PSX2 are arranged along a straight line parallel to the first direction X.

Referring to FIG. 28 and FIG. 29 in combination, the display panel further includes a first data lead wire 641 for providing a data signal to a column of first sub-pixels and a second data lead wire 642 for providing a data signal to a column of second sub-pixels, and the first data lead wire and the second data lead wire are arranged on the base substrate 10 and located in the peripheral region NA. For example, at least one column of second spacer repetitive units PSX2 arranged adjacent to the first data lead wire 641 and the second data lead wire 642 include a column of spacers including a second spacer PS21 and a fourth spacer PS22 arranged alternately. Most (e.g., 50% or more) of an orthographic projection of the column of spacers on the base substrate is located between an extension line of the first data lead wire 641 and an extension line of the second data lead wire 642 in the first direction X.

Referring to FIG. 28 and FIG. 29 in combination, the display panel further includes a third data lead wire 643 arranged on the base substrate 10 and located in the peripheral region NA, and the third data lead wire 643 is used to provide a data signal to a column of third sub-pixels. For example, at least one column of second spacer repetitive units PSX2 arranged adjacent to the third data lead wire 643 include a column of sixth spacers PS23, and an orthographic projection of the third data lead wire 643 on the base substrate extends through an orthographic projection of at least one six spacer PS23 among the column of sixth spacers PS23 on the base substrate.

For example, the orthographic projection of at least one six spacer PS23 among the column of sixth spacers PS23 on the base substrate is symmetrical with respect to the orthographic projection of the third data lead wire 643 on the base substrate.

Referring to FIG. 23 and FIG. 25A, an orthographic projection of at least some second spacer repetitive units PSX2 on the base substrate falls within an orthographic projection of the plurality of load compensation units 100 on the base substrate.

For example, the orthographic projection of the second spacer repetitive unit PSX2 on the base substrate is spaced apart from an orthographic projection of the boundary PDLS of the pixel defining layer body on the base substrate by a specified distance. For example, the specified distance is in a range of 20 microns to 300 microns.

Referring to FIG. 22 and FIG. 23, for the first spacer repetitive unit PSX1 and the second spacer repetitive unit PSX2 adjacent in the first direction X, the first spacer PS11 and the second spacer PS21 adjacent in the first direction X are spaced apart by a spacing distance WG3, the third spacer PS12 and the fourth spacer PS22 adjacent in the first direction X are spaced apart by a spacing distance WG4, and the fifth spacer PS13 and the sixth spacer PS23 adjacent in the first direction X are spaced apart by a spacing distance WG5. For example, a ratio of the spacing distance WG12 between two second spacers PS21 adjacent in the first direction X to the spacing distance WG3 is in a range of 0.8 to 1.2. In other words, the spacing distance WG12 between two second spacers PS21 adjacent in the first direction X is substantially equal to the spacing distance WG3. A ratio of the spacing distance between two fourth spacers PS22 adjacent in the first direction X to the spacing distance WG4 is in a range of 0.8 to 1.2. In other words, the spacing distance between two fourth spacers PS22 adjacent in the first direction X is substantially equal to the spacing distance WG4. A ratio of the spacing distance between two sixth spacers PS23 adjacent in the first direction X to the spacing distance WG5 is in a range of 0.8 to 1.2. In other words, the spacing distance between two sixth spacers PS23 adjacent in the first direction X is substantially equal to the spacing distance WG5.

For example, at least one second spacer repetitive unit PSX2 is provided on each of opposite sides of a row of first spacer repetitive units PSX1 in the first direction X.

For example, at least two second spacer repetitive units PSX2 are provided on each of opposite sides of a column of first spacer repetitive units PSX1 in the second direction Y.

Referring to FIG. 23, at a corner of the base substrate 10, an orthographic projection of a part of the boundary PDLS of the pixel defining layer body on the base substrate 10 is located between the orthographic projection of the scan driving circuit 300 on the base substrate and the orthographic projection of the load compensation unit 100 on the base substrate, and an orthographic projection of another part of the boundary PDLS of the pixel defining layer body on the base substrate 10 falls within the orthographic projection of the scan driving circuit 300 on the base substrate.

In other embodiments of the present disclosure, a display device is further provided. The display device may include the above-mentioned display panel. For example, the display device may be a smart phone, a mobile phone, a video phone, an e-book reader, a desktop computer (PC), a laptop PC, a netbook PC, a personal digital assistant (PDA), a portable multimedia player (PMP), a digital audio player, a mobile medical device, a camera, a wearable device (such as a head-mounted device, electronic clothing, electronic bracelet or smart watch), etc.

Although some embodiments according to the general inventive concept of the present disclosure have been illustrated and described, it should be understood by those of ordinary skilled in the art that these embodiments may be changed without departing from the principle and spirit of the general inventive concept of the present disclosure. The scope of the present disclosure is defined by the claims and their equivalents.

What is claimed is:

1. A display panel, comprising:
a base substrate comprising a display region and a peripheral region;
a plurality of sub-pixels arranged in the display region, wherein the sub-pixels comprise a first electrode, a second electrode, and a functional layer located between the first electrode and the second electrode;
a first electrode layer arranged on the base substrate, wherein the first electrode of the plurality of sub-pixels is located in the first electrode layer;
a pixel defining layer arranged on a side of the first electrode layer away from the base substrate, wherein the pixel defining layer comprises a pixel defining layer body having a first part and a second part, the first part is located in the display region and comprises an opening corresponding to the plurality of sub-pixels, and an orthographic projection of the opening on the base substrate falls within an orthographic projection of the first electrode of the plurality of sub-pixels on the base substrate, the second part is located in the peripheral region, and the second part and the first part are formed as an integral structure; and
a spacer layer arranged on a side of the pixel defining layer away from the base substrate, wherein the spacer layer comprises a first spacer repetitive unit located in the display region and a second spacer repetitive unit located in the peripheral region;
wherein an orthographic projection of the second spacer repetitive unit on the base substrate falls within an orthographic projection of the second part of the pixel defining layer on the base substrate and is located on a side, facing the display region, of a boundary, which is away from the display region, of the second part, and the orthographic projection of the second spacer repetitive unit on the base substrate does not overlap the orthographic projection of the first electrode of the plurality of sub-pixels on the base substrate;
wherein the spacer layer comprises a plurality of first spacer repetitive units and a plurality of second spacer repetitive units, and the plurality of first spacer repetitive units and the plurality of second spacer repetitive units are arranged in an array in a first direction and a second direction;
wherein the second spacer repetitive unit comprises a second spacer and a fourth spacer, and a column where the second spacer is located and a column where the fourth spacer is located are alternately arranged in the first direction; and
wherein for at least two second spacer repetitive units adjacent in the second direction, second spacers adjacent in the second direction are spaced apart from each other by a first spacing distance, and fourth spacers adjacent in the second direction are spaced apart from each other by a second spacing distance, and the second spacing distance is greater than the first spacing distance.

2. The display panel of claim 1, wherein the plurality of sub-pixels comprise at least one column of edge sub-pixels closest to the peripheral region, and at least part of the orthographic projection of the second spacer repetitive unit on the base substrate is located on a side, away from the display region, of an orthographic projection of a first electrode of the at least one column of edge sub-pixels on the base substrate.

3. The display panel of claim 1, wherein the orthographic projection of the second spacer repetitive unit on the base substrate does not overlap an orthographic projection of the first electrode layer on the base substrate.

4. The display panel of claim 1, wherein the plurality of sub-pixels are arranged in an array in a first direction and a second direction;
the first spacer repetitive unit comprises a first spacer and a third spacer located in different columns, a column of first spacers corresponds to a column of sub-pixels, and a column of third spacers corresponds to another column of sub-pixels;
for a plurality of first spacer repetitive units and a plurality of second spacer repetitive units located in a same row in the first direction, the first spacer and the third spacer of the first spacer repetitive units are located in the same row as the second spacer and the fourth spacer of the second spacer repetitive units.

5. The display panel of claim 4, wherein the first spacer repetitive unit further comprises a fifth spacer, and the third spacer and the fifth spacer are alternately arranged in a column;

the second spacer repetitive unit further comprises a sixth spacer, and the fourth spacer and the sixth spacer are alternately arranged in a column; and for a plurality of first spacer repetitive units and a plurality of second spacer repetitive units located in a same column in the second direction, the third spacer and the fifth spacer of the first spacer repetitive units are located in the same column as the fourth spacer and the sixth spacer of the second spacer repetitive units.

6. The display panel of claim 5, wherein for the plurality of first spacer repetitive units and the plurality of second spacer repetitive units located in the same row in the first direction, the fifth spacer of the first spacer repetitive units is located in the same row as the sixth spacer of the second spacer repetitive units.

7. The display panel of claim 5, wherein for the plurality of first spacer repetitive units and the plurality of second spacer repetitive units located in the same column in the second direction, the first spacer of the first spacer repetitive units is located in the same column as the second spacer of the second spacer repetitive units.

8. The display panel of claim 1, wherein the display panel further comprises a driving voltage lead wire arranged on the base substrate, located in the peripheral region, and configured to provide a driving voltage;

the base substrate comprises at least one corner portion, and the driving voltage lead wire comprises a plurality of steps located in the at least one corner portion; and an orthographic projection of at least some second spacer repetitive units of a plurality of second spacer repetitive units on the base substrate overlaps an orthographic projection of the plurality of steps of the driving voltage lead wire on the base substrate, and the at least some second spacer repetitive units are distributed in steps.

9. The display panel of claim 8, wherein:

for the at least some second spacer repetitive units overlapping the plurality of steps of the driving voltage lead wire, a plurality of steps formed by the at least some second spacer repetitive units are respectively located at the plurality of steps of the driving voltage lead wire; and/or wherein the plurality of steps comprise a first step and a second step, the first step and the second step extend in a first direction, a size of the first step in the first direction is greater than a size of the second step in the first direction, a number of second spacer repetitive units overlapping one first step and located in a same row is greater than a number of second spacer repetitive units overlapping one second step and located in a same row; and/or the first step and the second step extend in a second direction, a size of the first step in the second direction is greater than a size of the second step in the second direction, a number of second spacer repetitive units overlapping one first step and located in a same column is greater than a number of second spacer repetitive units overlapping one second step and located in a same column.

10. The display panel of claim 1, wherein:

for a plurality of second spacer repetitive units located at a non-corner of the base substrate, the plurality of second spacer repetitive units comprise a column of second spacer repetitive units farthest from the display region in a first direction and located on a side of the display region, and the column of second spacer repetitive units are arranged along a straight line parallel to a second direction; and/or for a plurality of second spacer repetitive units located at a non-corner of the base substrate, the plurality of second spacer repetitive units comprise a row of second spacer repetitive units farthest from the display region in a second direction and located on a side of the display region, and the row of second spacer repetitive units are arranged along a straight line parallel to a first direction; and/or wherein the display panel further comprises a first data lead wire and a second data lead wire, the first data lead wire is arranged on the base substrate and located in the peripheral region, and configured to provide a data signal to a column of first sub-pixels, the second data lead wire is arranged on the base substrate and located in the peripheral region, and configured to provide a data signal to a column of second sub-pixels; and at least one column of second spacer repetitive units arranged adjacent to the first data lead wire and the second data lead wire comprise a column of spacers having a second spacer and a fourth spacer alternately arranged, and 50% or more of an orthographic projection of the column of spacers on the base substrate is located between an extension line of the first data lead wire and an extension line of the second data lead wire in the first direction; and/or wherein the display panel further comprises a third data lead wire arranged on the base substrate and located in the peripheral region, and third data lead wire is configured to provide a data signal to a column of third sub-pixels; and at least one column of second spacer repetitive units arranged adjacent to the third data lead wire comprise a column of sixth spacers, and an orthographic projection of the third data lead wire on the base substrate extends through an orthographic projection of at least one six spacer of the column of sixth spacers on the base substrate; and/or wherein the orthographic projection of the at least one six spacer of the column of sixth spacers on the base substrate is symmetrical with respect to the orthographic projection of the third data lead wire on the base substrate.

11. The display panel of claim 1, wherein the display panel further comprises:

a scan driving circuit arranged on the base substrate and located in the peripheral region, and configured to output a scan signal; and a plurality of load compensation units arranged on the base substrate and located in the peripheral region, wherein the plurality of load compensation units are located between the scan driving circuit and the plurality of pixel units, wherein an orthographic projection of at least some second spacer repetitive units on the base substrate falls within an orthographic projection of the plurality of load compensation units on the base substrate.

12. The display panel of claim 1, wherein the orthographic projection of the second spacer repetitive unit on the base substrate is spaced apart from an orthographic projection of a boundary of the pixel defining layer body on the base substrate by a specified distance;

wherein the specified distance is in a range of 20 microns to 300 microns.

13. The display panel of claim 5,
wherein a width of the second spacer in the second direction is greater than a width of the fourth spacer in the second direction; and/or
wherein a width of the second spacer in the first direction is not less than a width of the fourth spacer in the first direction; and/or
wherein an area of an orthographic projection of the sixth spacer on the base substrate is different from an area of an orthographic projection of the first spacer on the base substrate; and/or
wherein the second spacer and the fourth spacer are alternately arranged on a straight line in the first direction; and/or
wherein the fourth spacer and the sixth spacer are alternately arranged in a column; and/or
wherein for the first spacer repetitive unit and the second spacer repetitive unit adjacent in the first direction, the first spacer and the second spacer adjacent in the first direction are spaced apart from each other by a third spacing distance, the third spacer and the fourth spacer adjacent in the first direction are spaced apart from each other by a fourth spacing distance, and the fifth spacer and the sixth spacer adjacent in the first direction are spaced apart from each other by a fifth spacing distance, wherein:
a ratio of a spacing distance between two second spacers adjacent in the first direction to the third spacing distance is in a range of 0.8 to 1.2; and/or
a ratio of a spacing distance between two fourth spacers adjacent in the first direction to the fourth spacing distance is in a range of 0.8 to 1.2; and/or
a ratio of a spacing distance between two sixth spacers adjacent in the first direction to the fifth spacing distance is in a range of 0.8 to 1.2.

14. The display panel of claim 5, wherein:
a ratio of an area of an orthographic projection of the first spacer on the base substrate to an area of an orthographic projection of the second spacer on the base substrate is in a range of 0.8 to 1.2; and/or
a ratio of an area of an orthographic projection of the third spacer on the base substrate to an area of an orthographic projection of the fourth spacer on the base substrate is in a range of 0.8 to 1.2; and/or
a ratio of an area of an orthographic projection of the fifth spacer on the base substrate to an area of an orthographic projection of the sixth spacer on the base substrate is in a range of 0.8 to 1.2.

15. The display panel of claim 1, wherein:
at least one second spacer repetitive unit is provided on each of opposite sides of a row of first spacer repetitive units in the first direction; and/or
at least two second spacer repetitive units are provided on each of opposite sides of a column of first spacer repetitive units in the second direction.

16. The display panel of claim 11, wherein at a corner of the base substrate, an orthographic projection of a part of a boundary of the pixel defining layer body on the base substrate is located between an orthographic projection of the scan driving circuit on the base substrate and the orthographic projection of the load compensation units on the base substrate, and an orthographic projection of another part of the boundary of the pixel defining layer body on the base substrate falls within the orthographic projection of the scan driving circuit on the base substrate.

17. The display panel of claim 1, wherein the display panel further comprises:
a support portion arranged on the base substrate and located in the peripheral region; and
an encapsulation structure arranged on a side of the support portion away from the base substrate and located in the peripheral region,
wherein an orthographic projection of the support portion on the base substrate is located on a side, away from the display region, of an orthographic projection of a boundary of the pixel defining layer body on the base substrate; and
wherein the support portion comprises a support body portion, a plurality of apertures or grooves located in the support body portion, and a plurality of conductive portions located on a side, facing the display region, of the support body portion.

18. The display panel of claim 14, wherein the display panel further comprises a first voltage lead wire configured to provide a first voltage and an auxiliary conductive portion located in the same layer as the first electrode; and
wherein a part of the auxiliary conductive portion is in direct contact with the first voltage lead wire; and/or
wherein the pixel defining layer further comprises a first covering portion and a second covering portion, the display panel further comprises a planarization layer located on a side of the first electrode layer close to the base substrate, and the auxiliary conductive portion comprises a plurality of apertures exposing a part of the planarization layer, the first covering portion covers the plurality of apertures, and the second covering portion covers an edge, away from the display region, of the auxiliary conductive portion.

19. A display device comprising the display panel of claim 1.

* * * * *